(12) United States Patent
Nagai et al.

(10) Patent No.: US 12,169,358 B2
(45) Date of Patent: Dec. 17, 2024

(54) PRODUCTION METHOD OF TEMPLATE, TEMPLATE BLANK, AND TEMPLATE SUBSTRATE FOR IMPRINTING, PRODUCTION METHOD OF TEMPLATE FOR IMPRINTING, AND TEMPLATE

(71) Applicant: DAI NIPPON PRINTING CO., LTD., Tokyo-to (JP)

(72) Inventors: Takaharu Nagai, Tokyo (JP); Katsutoshi Suzuki, Tokyo (JP); Koji Ichimura, Tokyo (JP); Kouji Yoshida, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 416 days.

(21) Appl. No.: 17/722,608

(22) Filed: Apr. 18, 2022

(65) Prior Publication Data

US 2022/0236642 A1    Jul. 28, 2022

Related U.S. Application Data

(62) Division of application No. 16/304,264, filed as application No. PCT/JP2017/019415 on May 24, 2017, now Pat. No. 11,340,526.

(30) Foreign Application Priority Data

May 25, 2016  (JP) .................................. 2016-104729
Sep. 21, 2016  (JP) .................................. 2016-184903

(51) Int. Cl.
*G03F 7/00*   (2006.01)
*B29C 33/38*   (2006.01)
(Continued)

(52) U.S. Cl.
CPC ............ *G03F 7/0002* (2013.01); *B29C 33/38* (2013.01); *B29C 33/3842* (2013.01);
(Continued)

(58) Field of Classification Search
None
See application file for complete search history.

(56) References Cited

U.S. PATENT DOCUMENTS 6,482,742 B1   11/2002  Chou
6,852,454 B2 *  2/2005  Mancini ................ G03F 7/0002
                                                  430/311
(Continued)

FOREIGN PATENT DOCUMENTS

JP   2002-93748 A    3/2002
JP   2004-504718 A   2/2004
(Continued)

OTHER PUBLICATIONS

Aug. 15, 2017 International Search Report issued in International Patent Application PCT/JP2017/019415.
(Continued)

*Primary Examiner* — Timothy Kennedy
(74) *Attorney, Agent, or Firm* — Oliff PLC

(57) ABSTRACT

A template and a template blank are used for imprint lithography transferring a transfer pattern in a concave and convex structure to a resin on a transfer substrate, in which a first step structure is formed on a main surface of a base, a second step structure is formed on the first step structure, and an outside region of the second step structure on an upper surface of the first step structure is covered with a light shielding film to solve the above problem.

10 Claims, 40 Drawing Sheets

(51) Int. Cl.
*B29C 33/42* (2006.01)
*B29C 59/00* (2006.01)
*H01L 21/027* (2006.01)

(52) U.S. Cl.
CPC ............ *B29C 33/42* (2013.01); *B29C 59/002* (2013.01); *H01L 21/0271* (2013.01)

(56) References Cited

U.S. PATENT DOCUMENTS

| 7,396,475 | B2 | 7/2008 | Sreenivasan |
| 2007/0054097 | A1 | 3/2007 | Suehira et al. |
| 2007/0187875 | A1 | 8/2007 | Terasaki et al. |
| 2010/0189839 | A1 | 7/2010 | Sano et al. |
| 2015/0158268 | A1 | 6/2015 | Koike et al. |
| 2016/0379800 | A1 | 12/2016 | Ohtsu |

FOREIGN PATENT DOCUMENTS

| JP | 2007-103915 A | 4/2007 |
| JP | 2007-103924 A | 4/2007 |
| JP | 2009-23113 A | 2/2009 |
| JP | 2009-536591 A | 10/2009 |
| JP | 2010-171109 A | 8/2010 |
| JP | 2013-168604 A | 8/2013 |
| JP | 2014-11254 A | 1/2014 |
| JP | 2014-56893 A | 3/2014 |
| JP | 2014-172316 A | 9/2014 |
| JP | 2015-170828 A | 9/2015 |
| JP | 2016-066667 A | 4/2016 |
| JP | 2016-72415 A | 5/2016 |
| WO | 2007/132320 A2 | 11/2007 |

OTHER PUBLICATIONS

Nov. 5, 2021 Notice of Allowance issued in U.S. Appl. No. 16/304,264.
Jan. 11, 2021 Office Action Issued in U.S. Appl. No. 16/304,264.
Mar. 2, 2022 Notice of Allowance Issued in U.S. Appl. No. 16/304,264.

* cited by examiner

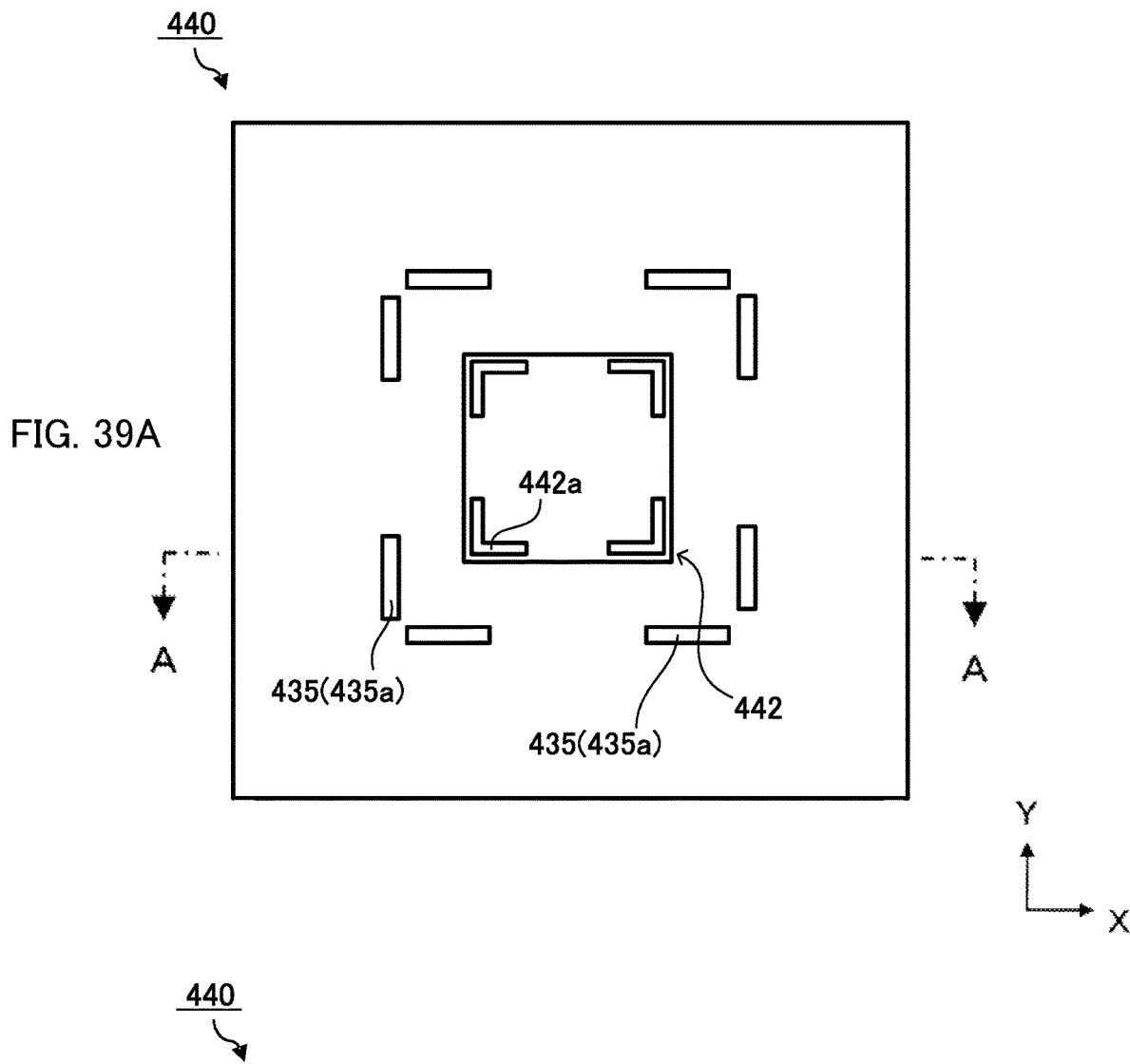

PRODUCTION METHOD OF TEMPLATE, TEMPLATE BLANK, AND TEMPLATE SUBSTRATE FOR IMPRINTING, PRODUCTION METHOD OF TEMPLATE FOR IMPRINTING, AND TEMPLATE

CROSS REFERENCE TO RELATED APPLICATION

This application is a divisional application of U.S. application Ser. No. 16/304,264, filed Nov. 23, 2018, the contents of which are incorporated herein by reference.

TECHNICAL FIELD

The present invention relates to a template used in nanoimprint lithography transferring a fine transfer pattern onto a resin formed on a transfer substrate, and a template blank used of producing the template. In addition, the present invention also relates to a template used in nanoimprint lithography transferring a fine transfer pattern onto a resin formed on a transfer substrate, and more particularly to a production method of a template substrate for imprinting having a first step structure on a main surface of a base, a second step structure on the first step structure, and a light shielding film on an upper surface of the first step structure, a production method of a template for imprinting, and a template used in the production methods.

BACKGROUND ART

Nanoimprint lithography is known as a technology for transferring and forming a fine pattern, for example, in the production of a device for semiconductor.

The above nanoimprint lithography is a technique in which a template (also referred to as a mold or a stamper) for imprinting having a fine concavo-convex shape transfer pattern formed on a surface thereof is brought into contact with a resin formed on a transfer substrate such as a semiconductor wafer, after that, the resin is cured, and the concavo-convex shape (more specifically, the concavo-convex inverted shape) of the transfer pattern of the template is transferred onto the resin.

As a method of nanoimprint lithography, there are a thermal imprinting method of curing a resin by heating and a photo imprinting method of curing a resin by light exposure. For applications requiring high positioning accuracy, a photo imprinting method that is not affected by expansion or contraction due to heating is mainly used (for example, Patent Documents 1 and 2).

In the template used for nanoimprint lithography as described above, a mesa-shaped step structure is provided on the main surface of the base so that only a predetermined region (referred to as a transfer pattern region) in which a transfer pattern in a concavo-convex shape is formed is in contact with the resin formed on the transfer substrate, and the transfer pattern is formed on the upper surface of the mesa-shaped step structure (for example, Patent Document 3). Incidentally, in the template having such a structure, the upper surface of the mesa-shaped step structure becomes the transfer pattern region.

The step difference (height from the main surface of the base to the upper surface of the step structure) of the mesa-shaped step structure as described above is determined, for example, by the mechanical precision of the imprinting apparatus to be used. However, the step difference requires typically about 30 μm.

In addition, in nanoimprint lithography, as the number of transfer patterns is increased, the adhesion area between the template and the resin is increased, so that a force against the frictional force between the template and the resin is required for releasing. In particular, since transfer patterns for semiconductor applications are small in size and high in pattern density, a large force is required for releasing.

Therefore, there has been proposed a method in which, by forming the depression part on the back surface side (the side opposite to the side on which the transfer pattern is formed) of the template, the thickness of the template in a predetermined region (region including the transfer pattern region) where the transfer pattern is formed is reduced to facilitate the bending, and during releasing, by bending the transfer pattern region of the template convexly toward the transfer substrate side, the template is partly released sequentially from the outer edge part of the transfer region (for example, Patent Document 4).

CITATION LIST

Patent Document

Patent Document 1: JP 2004-504718 A
Patent Document 2: JP 2002-93748 A
Patent Document 3: JP 2014-56893 A
Patent Document 4: JP 2009-536591 A
Patent Document 5: JP 2007-103924 A

SUMMARY OF INVENTION

Technical Problem

In the above-described photo imprinting method, in order to suppress unintended curing of the resin in the non-transfer region during the imprinting, it has been proposed to provide a light shielding member to a non-pattern part (a part different from the transfer pattern region) of the template (for example, Patent Document 5).

However, it is usually difficult to uniformly provide the light shielding member on the side surface of the mesa-shaped step structure as illustrated in FIGS. 9(A), 7(B), and 7(D) of Patent Document 5. Patent Document 5 also does not disclose details of the production method of obtaining the above-described form as illustrated in FIGS. 9(A), 7(B), and 7(D).

In addition, in the form in which the light shielding member is provided only on the main surface of the base as illustrated in FIG. 9(C) of Patent Document 5, for example, as described above, in a case where there is a step difference of about 30 μm between the upper surface of the mesa-shaped step structure and the main surface of the base, the exposure light leaking from the part where the mesa-shaped step structure and the main surface of the base are in contact with each other spreads and is emitted onto the resin according to the distance of the step difference, so that there is also a problem that the resin at an unintended part is cured.

In particular, since it takes time for dry etching to form a mesa-shaped step structure with a step difference of about 30 μm, the step structure is usually formed by wet etching. Therefore, the cross-sectional shape of the part where the mesa-shaped step structure and the main surface of the base are in contact with each other is hard to be a right angle, and the cross-sectional shape becomes the rounded shape. Then, in the rounded shape part (the part where the mesa-shaped step structure and the main surface of the base are in contact with each other), it is difficult to form the light shielding member with the same thickness as the other parts, and thus, the exposure light easily leaks.

The present invention has been made in view of the above circumstances, and an object of the present invention is to provide a template and a template blank and a production method of a template substrate for imprinting for producing a template for imprinting, a production method of a template for imprinting, and a template used for the production methods capable of suppressing influence of leakage of exposure light (irradiation to an unintended region) during imprinting while maintaining a required height (distance from a main surface of a base) of a transfer pattern region.

Solution to Problem

That is, according to the present invention, there is provided a template to be used for imprint lithography transferring a transfer pattern in a concave and convex structure to a resin on a transfer substrate, the template characterized by comprising: on a main surface of a base, a first step structure, a second step structure on the first step structure, and the transfer pattern at an upper surface of the second step structure; wherein an outer side region of the second step structure at an upper surface of the first step structure is covered with a light shielding film.

According to the present invention, there is provided a template to be used for imprint lithography transferring a transfer pattern in a concave and convex structure to a resin on a transfer substrate, the template characterized by comprising: on a main surface of a base, a first step structure, a second step structure on the first step structure, and at an upper surface of the second step structure, a first concave and convex structure body configuring the transfer pattern, and a second concave and convex structure body configuring an alignment mark; wherein an outer side region of the second step structure at an upper surface of the first step structure is covered with a light shielding film; and a high contrast film configured by a film of a different material from a material configuring the base, is formed on the light shielding film and on a bottom surface of a concave part in the second concave and convex structure body.

In the invention, when a distance in a vertical direction from the main surface of the base to an upper surface of the light shielding film on the first step structure is regarded as $H1$, and a distance in a vertical direction from a main surface of the base to a bottom surface of a concave part in the transfer pattern at an upper surface of the second step structure is regarded as $H2$, a relation: $H1<H2$ is preferably satisfied.

In the invention, when a distance in a vertical direction from the main surface of the base to an upper surface of the light shielding film on the first step structure is regarded as $H1$, a distance in a vertical direction from the main surface of the base to an upper surface of the second step structure is regarded as $H3$, a distance in a horizontal direction from an outer edge of the main surface of the base to an outer edge of an upper surface of the first step structure is regarded as $D1$, and a distance in a horizontal direction from the outer edge of the main surface of the base to an outer edge of the upper surface of the second step structure is regarded as $D2$, a relation: $H1 \leq H3 \times (D1/D2)$ is preferably satisfied.

The invention further preferably comprises a depression part including the second step structure at an opposite side surface to the main surface of the base in a planar view.

In the invention, the depression part preferably includes the first step structure in a planar view.

In the invention, a transmittance of the light shielding film with a wave length of 365 nm is preferably 10% or less.

According to the present invention, there is provided a template blank for producing a template to be used for imprint lithography transferring a transfer pattern in a concave and convex structure to a resin on a transfer substrate, the template blank characterized by comprising: on a main surface of a base, a first step structure, a second step structure on the first step structure; wherein an outer side region of the second step structure at an upper surface of the first step structure is covered with a light shielding film.

In the invention, when a distance in a vertical direction from the main surface of the base to an upper surface of the light shielding film on the first step structure is regarded as $H1$, and a distance in a vertical direction from the main surface of the base to an upper surface of the second step structure is regarded as $H4$, a relation: $H1<H4$ is preferably satisfied.

In the invention, when a distance in a vertical direction from the main surface of the base to an upper surface of the light shielding film on the first step structure is regarded as $H1$, a distance in a vertical direction from the main surface of the base to an upper surface of the second step structure is regarded as $H4$, a distance in a horizontal direction from an outer edge of the main surface of the base to an outer edge of an upper surface of the first step structure is regarded as $D1$, and a distance in a horizontal direction from the outer edge of the main surface of the base to an outer edge of the upper surface of the second step structure is regarded as $D2$, a relation: $H1 \leq H4 \times (D1/D2)$ is preferably satisfied.

The invention further preferably comprises a depression part including the second step structure at an opposite side surface to the main surface of the base in a planar view.

In the invention, the depression part preferably includes the first step structure in a planar view.

In the invention, a transmittance of the light shielding film with a wave length of 365 nm is preferably 10% or less.

According to the present invention, there is provided a production method of a template substrate for imprinting, the template substrate including a first step structure on a main surface of a base, a second step structure on the first step structure, and a light shielding film on an upper surface of the first step structure, the production method characterized by comprising steps of: a multistep template substrate with a light shielding material layer preparing step of preparing a multistep template substrate with a light shielding material layer including the first step structure, the second step structure, and a light shielding material layer on an upper surface of the first step structure and on an upper surface of the second step structure; a resin layer forming step of forming a first resin layer on the light shielding material layer formed on the upper surface of the first step structure, and forming a second resin layer thinner than a thickness of the first resin layer, on the light shielding material layer formed on the upper surface of the second step structure; a second resin layer removing step of removing the second resin layer while leaving the first resin layer by dry etching; and a light shielding film forming step of etching the light shielding material layer using the first resin layer left as a mask to remove the light shielding material layer formed on the upper surface of the second step structure while leaving the light shielding material layer formed on the upper surface of the first step structure; in this order, wherein the resin layer forming step includes: a resin thickness specifying step of, using a template for specifying resin thickness including a concave part in a main surface side contacting a resin, pushing an upper surface of an outer peripheral part of the concave part in the template for specifying resin thickness against a first resin dropped onto the light shielding material layer formed on the upper surface of the first step structure, and pushing a bottom surface of the concave part in the template for specifying resin thickness against a second resin dropped onto the light shielding material layer formed on the upper surface of the second step structure; and a depth of the concave part in the template for specifying resin thickness is smaller than a height from the upper surface of the first step structure to the upper surface of the second step structure.

In the invention, the resin layer forming step preferably includes: the resin thickness specifying step, and a resin curing step of irradiating an ultraviolet ray for curing the first resin and the second resin in a state the template for specifying resin thickness is pushed against, to form the first resin layer and the second resin layer.

In the invention, the multistep template substrate with a light shielding material layer preparing step is preferably provided with: a multistep template substrate preparing step of preparing a multistep template substrate including the first step structure and the second step structure; and a light shielding material layer forming step of forming a light shielding material layer on the upper surface of the first step structure and on the upper surface of the second step structure; in this order.

In the invention, the multistep template substrate preparing step is preferably provided with: a one step template substrate preparing step of preparing a one step template substrate including a one step structure on the main surface of the base; an etching mask forming step of forming an etching mask in a region becoming a transfer pattern region at an upper surface of the step structure in the one step template substrate; and a multistep forming step of forming a first step structure as a bottom step and a second step structure as an upper step by etching the step structure using the etching mask.

According to the present invention, there is provided a production method of a template for imprinting, the template including a first step structure on a main surface of a base, a second step structure on the first step structure, a light shielding film on an upper surface of the first step structure, and a transfer pattern in a concave and convex structure at an upper surface of the second step structure, the production method characterized by comprising steps of: a multistep template with a light shielding material layer preparing step of preparing a multistep template with a light shielding material layer including the first step structure, the second step structure, a transfer pattern in a concave and convex structure at the upper surface of the second step structure and a light shielding material layer on an upper surface of the first step structure and on an upper surface of the second step structure; a first and second resin layer forming step of forming a first resin layer on the light shielding material layer formed on the upper surface of the first step structure, and forming a second resin layer thinner than a thickness of the first resin layer, on the light shielding material layer formed on the upper surface of the second step structure; a second resin layer removing step of removing the second resin layer while leaving the first resin layer by dry etching; and a light shielding film forming step of etching the light shielding material layer using the first resin layer left as a mask to remove the light shielding material layer formed on the upper surface of the second step structure while leaving the light shielding material layer formed on the upper surface of the first step structure; in this order, wherein the first and second resin layer forming step includes: a first and second resin thickness specifying step of, using a template for specifying first and second resin thickness including a concave part in a main surface side contacting a resin, pushing an upper surface of an outer peripheral part of the concave part in the template for specifying first and second resin thickness against a first resin dropped onto the light shielding material layer formed on the upper surface of the first step structure, and pushing a bottom surface of the concave part in the template for specifying first and second resin thickness against a second resin dropped onto the light shielding material layer formed on the upper surface of the second step structure; and a depth of the concave part in the template for specifying first and second resin thickness is smaller than a height from the upper surface of the first step structure to the upper surface of the second step structure.

According to the present invention, there is provided a production method of a template for imprinting, the template including a first step structure on a main surface of a base, a second step structure on the first step structure, a light shielding film on an upper surface of the first step structure, and a transfer pattern in a concave and convex structure on an upper surface of the second step structure, the production method characterized by comprising steps of: a multistep template with a light shielding material layer preparing step of preparing a multistep template with a light shielding material layer including: the first step structure, the second step structure; a first concave and convex structure body configuring the transfer pattern and a second concave and convex structure body configuring an alignment mark, at an upper surface of the second step structure; and a light shielding material layer on the upper surface of the first step structure and on the upper surface of the second step structure; a first and second resin layer forming step of forming a first resin layer on the light shielding material layer formed on the upper surface of the first step structure, and forming a second resin layer thinner than a thickness of the first resin layer, on the light shielding material layer formed on the upper surface of the second step structure; a second resin layer removing step of removing the second resin layer while leaving the first resin layer by dry etching; a light shielding film forming step of forming a light shielding layer on the upper surface of the first step structure by etching the light shielding material layer using the first resin layer left as a mask to remove the light shielding material layer formed on the upper surface of the second step structure while leaving the light shielding material layer formed on the upper surface of the first step structure; a high contrast layer forming step of forming a high contrast layer on the light shielding material layer, on an upper surface of a convex part and on a bottom surface of a concave part in the first concave and convex structure body, as well as on an upper surface of a convex part and on a bottom surface of a concave part in the second concave and convex structure body; a third to fifth resin layer forming step of forming a third resin layer on the high contrast layer formed on the light shielding film, forming a fourth resin layer thinner than a thickness of the third resin layer on the high contrast layer formed on the upper surface of the convex part and the bottom surface of the concave part in the first concave and convex structure body, and forming a fifth resin layer thicker than a thickness of the fourth resin layer on the high contrast layer formed on the upper surface of the convex part and on the bottom surface of the concave part in the second concave and convex structure; a fourth resin layer removing step of removing the fourth resin layer while leaving the third resin layer and the fifth resin layer by dry etching; and a high contrast film forming step of etching the high contrast layer using the third resin layer and the fifth resin layer left as a mask to remove the high contrast layer formed on the upper surface of the convex part and the bottom surface of the concave part in the first concave and convex structure body as well as on the upper surface of the convex part in the second concave and convex structure body while leaving the high contrast layer formed on the light shielding film, and on the bottom surface of the concave part in the second concave and convex structure body; in this order, wherein the first and second resin layer forming step includes: a first and second resin thickness specifying step of, using a template for specifying first and second resin thickness including a concave part in a main surface side contacting a resin, pushing an upper surface of an outer peripheral part of the concave part in the template for specifying first and second resin thickness against a first resin dropped onto the light shielding material layer formed on the upper surface of the first step structure, and pushing a bottom surface of the concave part in the template for specifying first and second resin thickness against a second resin dropped onto the light shielding material layer formed on the upper surface of the second step structure; a depth of the concave part in the template for specifying first and second resin thickness is smaller than a height from the upper surface of the first step structure to the upper surface of the second step structure; the third to fifth resin layer forming step includes: a third to fifth resin thickness specifying step of, using a template for specifying third to fifth resin thickness including a concave part in a main surface side contacting a resin, and a depression formed at a bottom surface side of the concave part, pushing an upper surface of an outer peripheral part of the concave part in the template for specifying third to fifth resin thickness against a third resin dropped onto the high contrast layer formed on the light shielding film, pushing a bottom surface of the concave part in the template for specifying third to fifth resin thickness against a fourth resin dropped onto the high contrast layer formed on the upper surface of the convex part and on the bottom surface of the concave part in the first concave and convex structure body as well as against a fifth resin dropped onto the high contrast layer formed on the upper surface of the convex part and the bottom surface of the concave part in the second concave and convex structure body, and pushing a bottom surface of the depression against the fifth resin; and a depth of the concave part in the template for specifying third to fifth resin thickness excluding the depression part is smaller than a height from the upper surface of the high contrast layer formed on the light shielding film to the upper surface of the high contrast layer formed on the bottom surface of the concave part in the first concave and convex structure body.

In the invention, the first and second resin layer forming step preferably includes: the first and second resin thickness specifying step; and a first and second resin curing step of irradiating an ultraviolet ray for curing the first resin and the second resin in a state the template for specifying first and second resin thickness is pushed against, to form the first resin layer and the second resin layer.

In the invention, the multistep template with a light shielding material layer preparing step is preferably provided with: a multistep template preparing step of preparing a multistep template including the first step structure, the second step structure, and the transfer pattern at an upper surface of the second step structure; and a light shielding material layer forming step of forming a light shielding material layer on the upper surface of the first step structure and on the upper surface of the second step structure; in this order.

In the invention, the multistep template preparing step is preferably provided with: a one step template preparing step of preparing a one step template including a one step structure on the main surface of the base and the transfer pattern at the upper surface of the step structure; an etching mask forming step of forming an etching mask in a region at the upper surface of the step structure in the one step template where the transfer pattern is formed; and a multistep forming step of forming a first step structure as a bottom step and a second step structure as an upper step by etching the step structure using the etching mask; in this order.

In the invention, the multistep template with light shielding material layer preparing step is preferably provided with: a multistep template preparing step of preparing a multistep template including the first step structure, the second step structure, and the transfer pattern at an upper surface of the second step structure; and a light shielding material layer forming step of forming a light shielding material layer on the upper surface of the first step structure and on the upper surface of the second step structure; in this order; and the multistep template preparing step is provided with: a one step template substrate preparing step of preparing a one step template substrate including a one step structure on the main surface of the base; an etching mask forming step of forming an etching mask in a region becoming the transfer pattern at an upper surface of the step structure in the one step template substrate; a multistep forming step of forming a first step structure as a bottom step and a second step structure as an upper step by etching the step structure using the etching mask; and a transfer pattern forming step of forming the transfer pattern at the upper surface of the second step structure; in this order.

According to the present invention, there is provided a template characterized by comprising a concave part in a main surface side contacting a resin.

According to the present invention, there is provided a template characterized by comprising a concave part in a main surface side contacting a resin, and a depression formed at a bottom surface side of the concave part.

The present invention further preferably comprises a mark for position matching at the main surface side.

Preferably, the invention further comprises a mark for position matching at the main surface side, wherein the mark for position matching is a depression formed at an outer side of the concave part in the main surface, and a depth of the depression formed at a bottom surface side of the concave part and the depth of the depression formed at the outer side of the concave part are the same.

In the invention, the bottom surface size of the concave part is preferably 10 mm×10 mm or more and 70 mm×70 mm or less.

In the invention, the depth of the concave part is preferably 0.3 μm or more and 10 μm or less.

Preferably, the invention is used in the production method of a template substrate for imprinting and the depth of the concave part is smaller than a height from the upper surface of the first step structure to the upper surface of the second step structure in the template substrate for imprinting.

In the invention, the bottom surface of the concave part preferably is in a size enclosing the upper surface of the second step structure in the template substrate for imprinting.

In the invention, a region surrounded by the outer edge of the upper surface of the outer peripheral part of the concave part is preferably: in a shape and an area same as those of a region surrounded by the outer edge of the upper surface of the first step structure in the template substrate for imprinting; or in a size enclosing the region surrounded by the outer edge of the upper surface of the first step structure in the template substrate for imprinting.

Preferably, the invention is used in the production method of a template for imprinting, and the depth of the concave part is smaller than a height from the upper surface of the first step structure to the upper surface of the second step structure in the template for imprinting.

In the invention, a bottom surface of the concave part is preferably in a size enclosing the upper surface of the second step structure in the template for imprinting.

In the invention, a region surrounded by an outer edge of an upper surface of an outer peripheral part of the concave part is preferably: in a shape and an area same as those of a region surrounded by an outer edge of an upper surface of the first step structure in the template for imprinting; or in a size enclosing the region surrounded by the outer edge of the upper surface of the first step structure in the template for imprinting.

Advantageous Effects of Invention

In the template according to the present invention, it is possible to suppress the influence of the leakage of exposure light (irradiation to an unintended region) during the imprinting while maintaining the required height (the distance from the main surface of the base) of the transfer pattern region.

In addition, it is possible to easily produce the above-described template by using the template blank according to the present invention.

According to a production method of a template substrate for imprinting of the present invention, it is possible to produce a template substrate for imprinting having a first step structure on a main surface of a base, having a second step structure on the first step structure, and having a light shielding film on an upper surface of the first step structure without generating a defective part or a thin film part in the light shielding film.

In addition, according to a production method of a template for imprinting of the present invention, it is possible to produce a template for imprinting having a first step structure on a main surface of a base, having a second step structure on the first step structure, having a light shielding film on an upper surface of the first step structure, and having a transfer pattern in a concave and convex structure on an upper surface of the second step structure without generating a defective part or a thin film part in the light shielding film.

Then, in the template for imprinting produced by the production method of the template for imprinting according to the present invention, it is possible to suppress influence of leakage of exposure light (irradiation to an unintended region) during imprinting while maintaining a required height (a distance from the main surface of the base) of the transfer pattern region.

In addition, by using the template substrate for imprinting produced by the production method of the template substrate for imprinting according to the present invention, it is possible to easily produce the template for imprinting as described above.

BRIEF DESCRIPTION OF DRAWINGS

FIGS. 39A and 39B are diagrams illustrating another example of the template for specifying resin thickness according to the present invention.

DESCRIPTION OF EMBODIMENTS

Hereinafter, a template and a template blank according to the present invention and a production method of a template substrate for imprinting, a production method of a template for imprinting, and a template according to the present invention will be described in detail with reference to the drawings.

I. Template and Template Blank

Templates and template blanks according to the present invention will be described in detail with reference to the drawings.

<Template>

First, the templates according to the present invention will be described.

The templates according to the present invention are substantially classified into a first embodiment and a second embodiment. Hereinafter, the first embodiment and the second embodiment will be described.

A. First Embodiment

Figure 1:
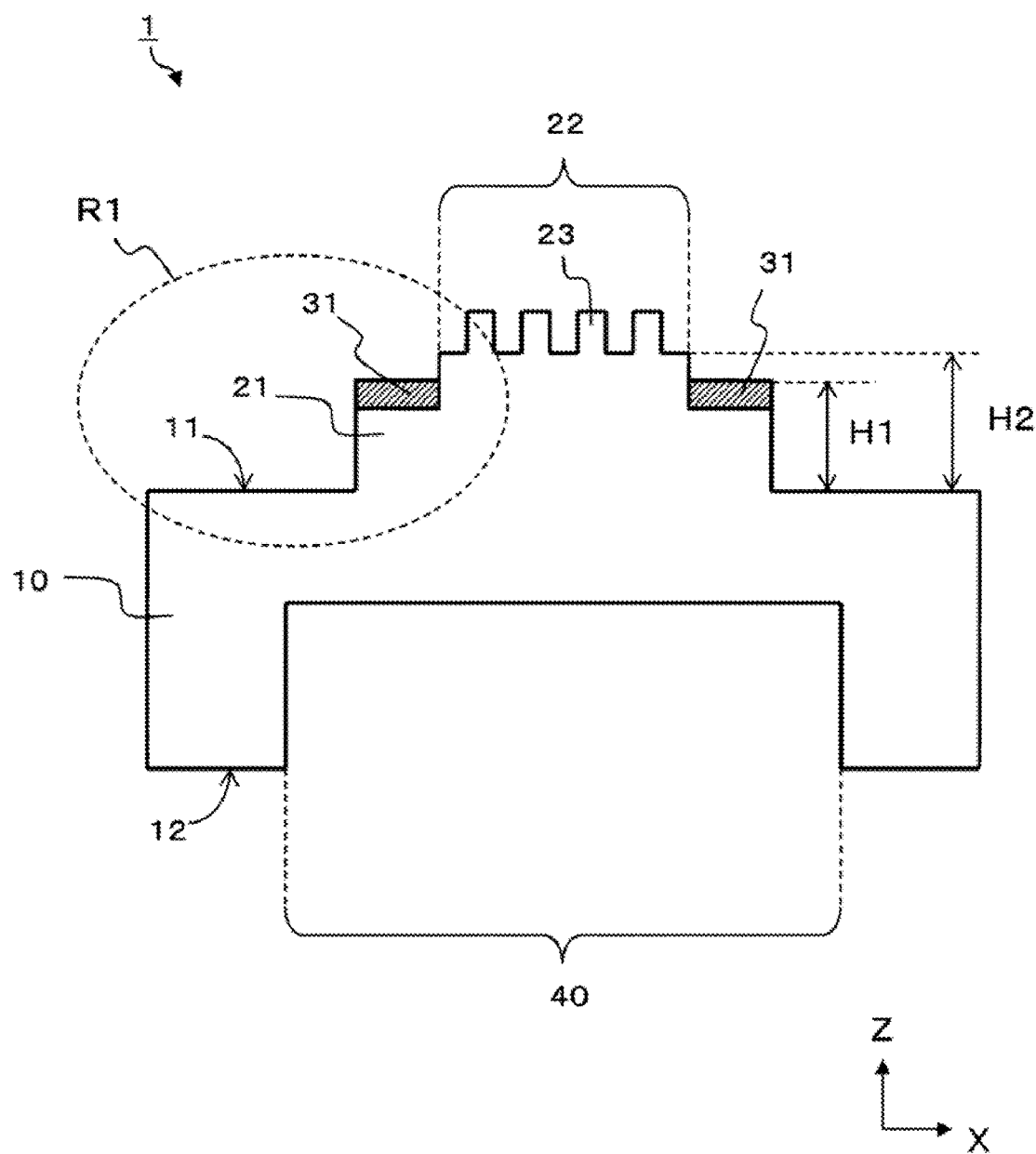
FIG. 1 is a diagram illustrating a configuration example of a template according to a first embodiment.

First, a template according to the first embodiment will be described. FIG. 1 is a diagram illustrating a configuration example of the template according to the first embodiment.

For example, as illustrated in FIG. 1, the template 1 has a first step structure 21 on a main surface 11 of a base 10, has a second step structure 22 on the first step structure 21, and has a transfer pattern 23 on an upper surface of the second step structure 22, and an outer side region of the second step structure 22 at an upper surface of the first step structure 21 is covered with a light shielding film 31.

Incidentally, in the template 1, the upper surface of the second step structure 22 becomes the transfer pattern region.

With the above-described configuration, in the template 1, it is possible to suppress the influence of leakage of exposure light (irradiation to an unintended region) during the imprinting while maintaining the required height (the distance from the main surface 11 of the base 10) of the transfer pattern region.

For example, by setting the combined height (H2) of the step difference of the first step structure 21 and the step difference of the second step structure 22 in the template 1 illustrated in FIG. 1 to about 30 μm, in the template 1, the height (the distance from the main surface 11 of the base 10) of the transfer pattern region can be maintained at a required height.

In addition, since the template 1 has the light shielding film 31 on the upper surface of the first step structure 21, in comparison with a form (for example, FIG. 7C in Patent Document 5) in which a light shielding member is provided only on the main surface 11 of the base 10 as in the related art, the light shielding film 31 exists at a distance closer to the upper surface of the second step structure 22 which is the transfer pattern region in the vertical direction (the Z direction in the figure). Therefore, it is possible to suppress the influence of leakage of exposure light (irradiation to an unintended region) during the imprinting.

This function and effect will be described in detail with reference to FIGS. 3A to 3B and 12A to 12B. Before that, first, an example of imprinting using template 1 will be described with reference to FIG. 2.

Figure 2:
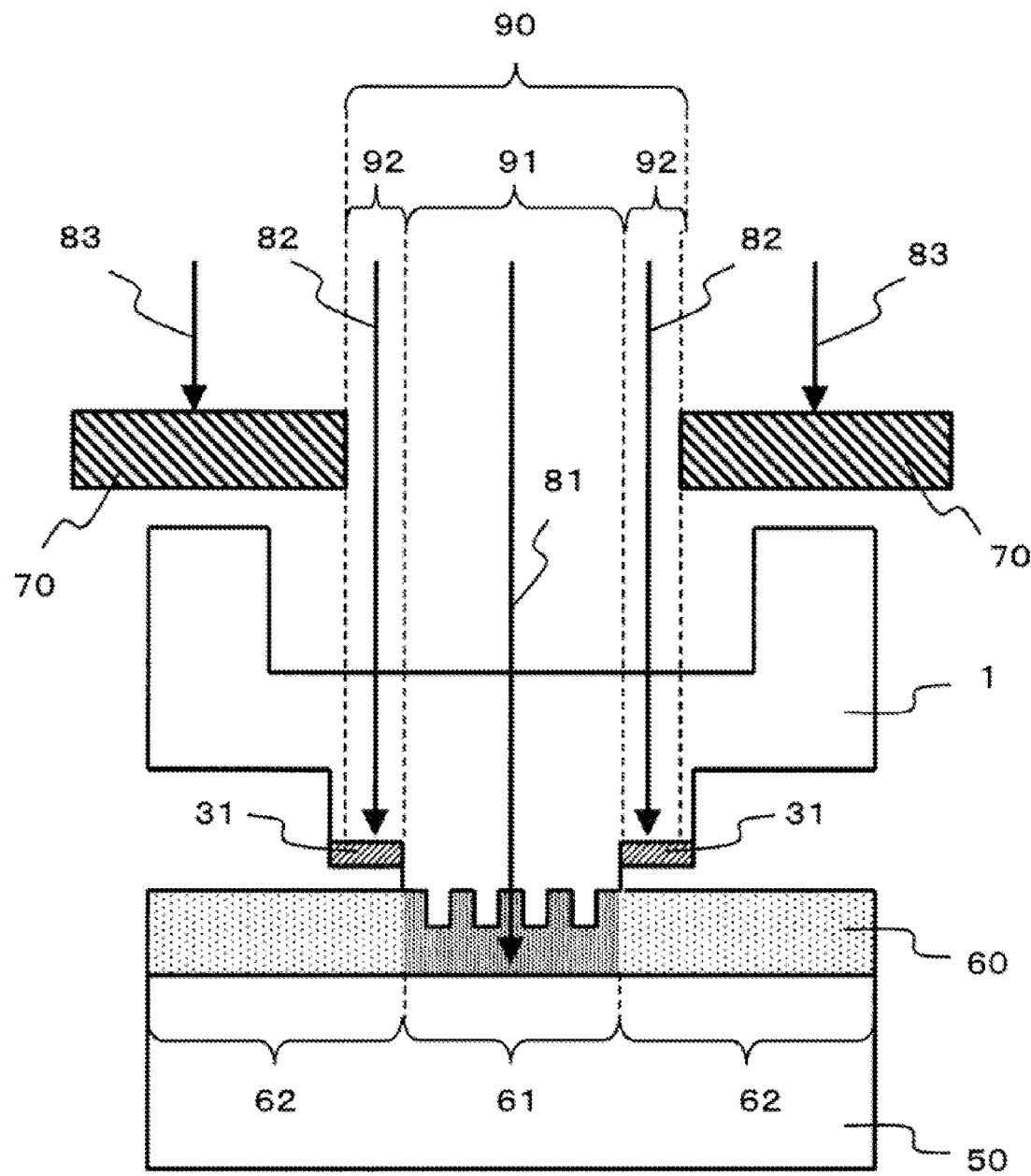
FIG. 2 is a diagram illustrating a usage example of the template according to the first embodiment.

FIG. 2 is a diagram illustrating a usage example of the template according to the first embodiment.

For example, as illustrated in FIG. 2, in the case of transferring a pattern to the transfer region 61 of the photocurable resin 60 formed on the transfer substrate 50 by the photo imprinting method using the template 1, it is necessary to prevent the exposure light (for example, ultraviolet light having a wavelength of 365 nm) from being emitted onto the non-transfer region 62 of the photocurable resin 60. This is because unintended curing of the photocurable resin 60 in the non-transfer region 62 is prevented.

Herein, usually, in an imprinting apparatus on which the template 1 is mounted, for the purpose of suppressing irradiation of an unintended region with exposure light, a frame-shaped light shielding plate in a planar view in which the exposure region is an opening is provided.

For example, in the example illustrated in FIG. 2, since the light shielding plate 70 is provided, the region irradiated with the exposure light is defined in the irradiation region 90 corresponding to the opening of the light shielding plate 70. In other words, the exposure light 83 outside the irradiation region 90 is shielded by the light shielding plate 70 and is not emitted onto the photocurable resin 60.

However, with this light shielding plate 70 alone, since the distance from the photocurable resin 60 on the transfer substrate 50 may be far away (for example, the template 1 is interposed in the middle), it is difficult to prevent the exposure light from being emitting onto the non-transfer region 62 of the photocurable resin 60 with good positional accuracy.

Therefore, including the shape accuracy and positional accuracy of the light shielding plate 70, the irradiation region 90 defined by the light shielding plate 70 is usually designed to be larger than the transfer region 61 of the photocurable resin 60. That is, as illustrated in FIG. 2, the irradiation region 90 includes not only an irradiation region 91 having a size corresponding to the transfer region 61 of the photocurable resin 60 but also an unnecessary irradiation region 92.

Therefore, in the template 1, as illustrated in FIG. 2, the exposure light 82 in the irradiation region 92 is shielded by the light shielding film 31 formed on the upper surface of the first step structure 21. As a result, in principle, only the exposure light 81 of the irradiation region 91 having a size corresponding to the transfer region 61 is emitted onto the photocurable resin 60 on the transfer substrate 50.

Incidentally, as described above, in the template 1 mounted on the imprinting apparatus having the light shielding plate 70 for regulating the irradiation region 90 of the exposure light, as illustrated in FIGS. 1 and 2, the light shielding film 31 formed on the upper surface of the first step structure 21 is not necessarily formed so as to cover the entire region from the part (that is, the outer edge of the bottom of the second step structure 22) where the second step structure 22 and the upper surface of the first step structure 21 are in contact with each other to the outer edge of the upper surface of the first step structure 21 but may be formed in the region necessary to shield the exposure light 82.

More specifically, in the template 1, the light shielding film 31 formed on the upper surface of the first step structure 21 may be formed so as to cover at least the region from the part (that is, the outer edge of the bottom of the second step structure 22) where the second step structure 22 and the upper surface of the first step structure 21 are in contact with each other to the outer edge of the upper surface of the first step structure 21 in the region corresponding to the irradiation region 90 illustrated in FIG. 2.

However, as in the template 1 illustrated in FIG. 1, as long as the light shielding film 31 formed on the upper surface of the first step structure 21 covers the entire region from the part (that is, the outer edge of the bottom of the second step structure 22) where the second step structure 22 and the upper surface of the first step structure 21 are in contact with each other to the outer edge of the upper surface of the first step structure 21, even though the shape accuracy and the positional accuracy of the light shielding plate 70 illustrated in FIG. 2 are low, it is possible to more reliably prevent the photocurable resin 60 in the non-transfer region 62 from unintentionally being cured.

Next, the influence of leakage of exposure light during the imprinting will be described in more detail with reference to FIGS. 3A to 3B and 12A to 12B.

Figure 3A:
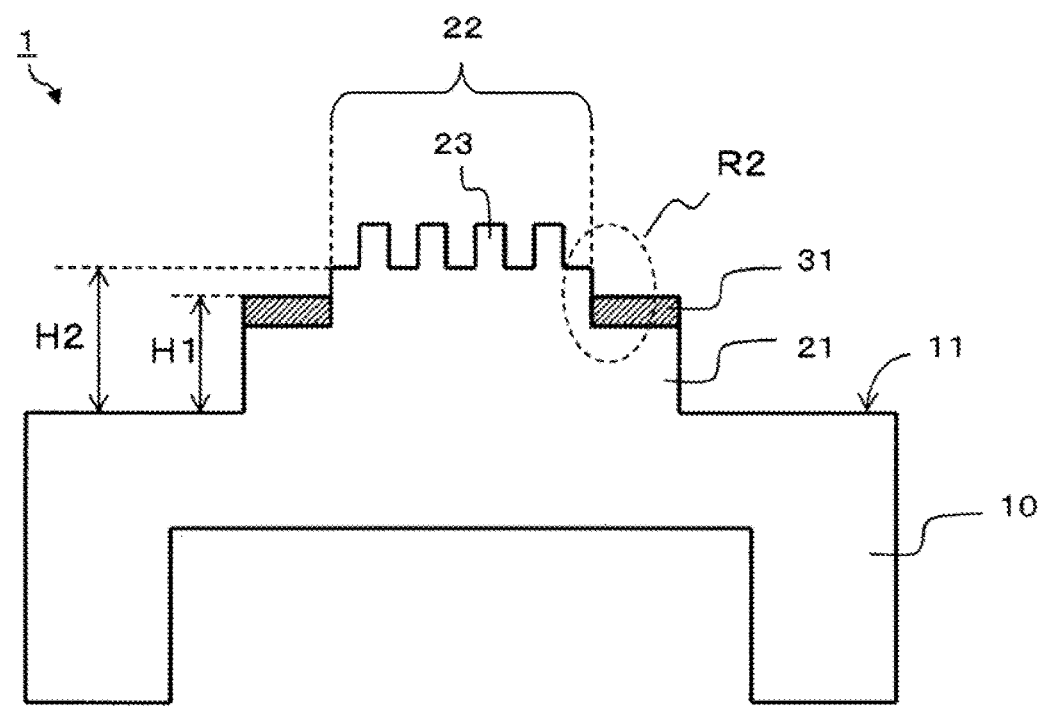
FIGS. 3A and 3B are diagrams illustrating functions and effects of the template according to the first embodiment.
Figure 3B:
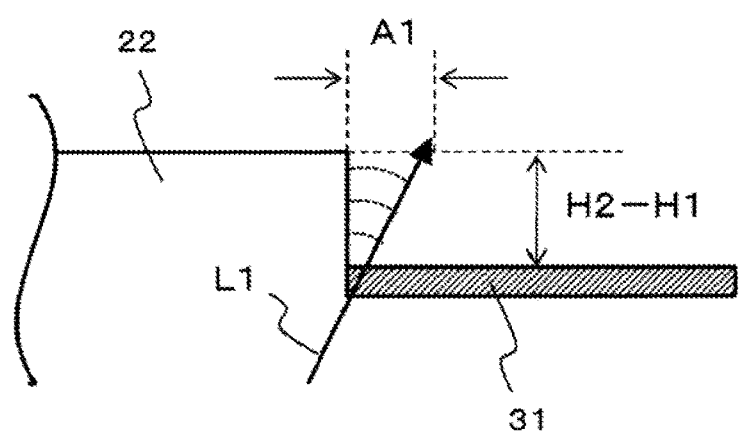

Herein, FIGS. 3A and 3B are diagrams illustrating the function and effect of the template according to the first embodiment, FIG. 3A is a schematic cross-sectional diagram of the template according to the first embodiment, and FIG. 3B is a schematic enlarged diagram illustrating the leakage state of the exposure light L1 in the region R2 illustrated in FIG. 3A. In addition, FIGS. 12A and 12B are diagrams illustrating problems of the template in the related art, FIG. 12A is a schematic cross-sectional diagram of the template in the related art, and FIG. 12B is a schematic enlarged diagram illustrating the leakage state of the exposure light L2 in the region R102 illustrated in FIG. 12A.

First, the influence of leakage of exposure light during the imprinting in a template in the related art will be described with reference to FIGS. 12A and 12B.

Figure 12A:
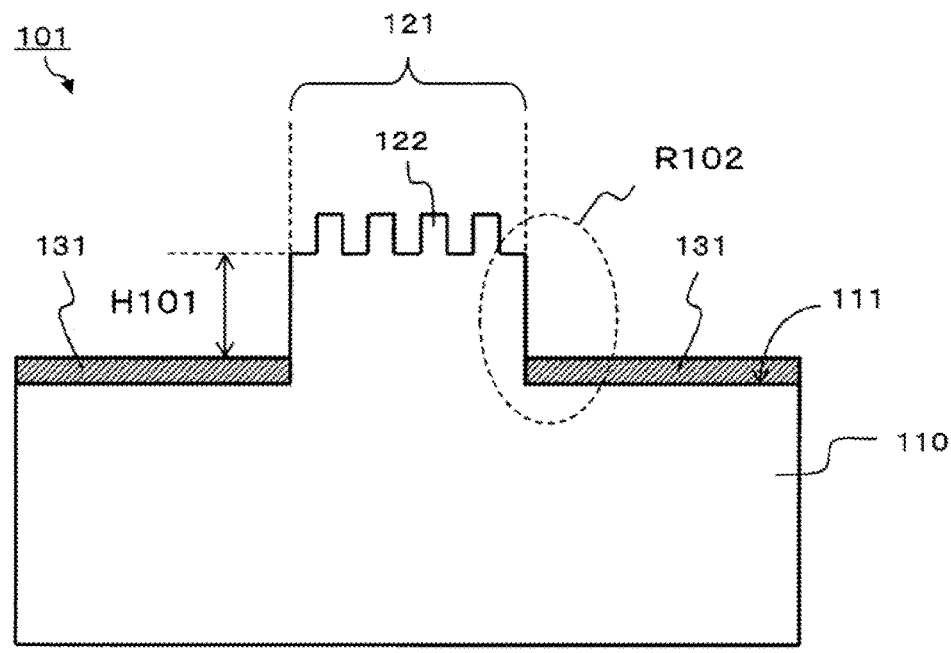
FIGS. 12A and 12B are diagrams illustrating a problem of a template in the related art.
Figure 12B:
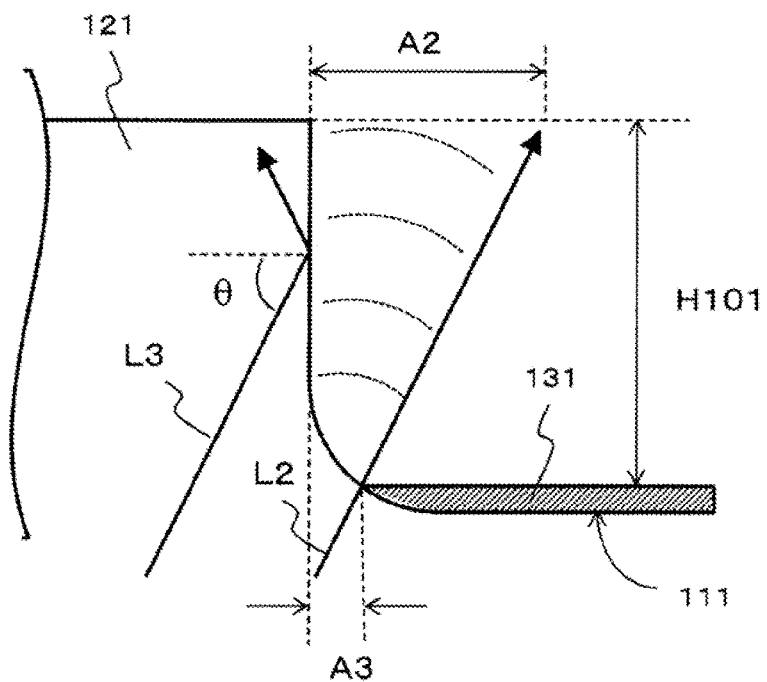

As illustrated in FIG. 12A, in the template 101 in the related art which has a step structure 121 on a main surface 111 of a base 110 and has a transfer pattern 122 on an upper surface of the step structure 121 and in which an outer side region of the step structure 121 at the main surface 111 of the base 110 is covered with a light shielding film 131, the upper surface (transfer pattern region) of the step structure 121 and the main surface 111 (more precisely, the upper surface of the light shielding film 131) of the base 110 are separated by the distance H101.

The distance H101 is determined, for example, by the mechanical accuracy of the imprinting apparatus to be used. However, the distance is typically about 30 μm.

Therefore, as illustrated in FIG. 12B, there is a problem that the exposure light L2 leaking from the part where the step structure 121 and the main surface 111 of the base 110 are in contact with each other spreads as diffracted light depending on the distance H101, so that the resin in the region corresponding to A2 is cured at the height of the upper surface (transfer pattern region) of the step structure 121.

Furthermore, since the step structure 121 requiring about 30 μm in step difference (corresponding to approximately H101) takes time to produce by dry etching, the step structure is usually formed by wet etching.

Therefore, the cross-sectional shape of the part where the step structure 121 and the main surface 111 of the base 110 are in contact with each other is hard to be a right angle, and the cross-sectional shape tends to be a rounded shape as illustrated in FIG. 12B.

Then, in this rounded shape part (the part where the step structure 121 and the main surface 111 of the base 110 are in contact with each other), it is difficult to form the light shielding film 131 with the same thickness as the other parts, and thus, the exposure light easily leaks. For example, in the example illustrated in FIG. 12B, it is difficult to form the light shielding film 131 with the same thickness as other parts in the region corresponding to A3.

Incidentally, as illustrated in FIG. 12B, in principle, the exposure light L3 directed to the side surface of the step structure 121 is totally reflected, so that it can be considered that the problem that the photocurable resin 60 in the non-transfer region 62 is unintentionally cured by the exposure light L3 does not occur in principle.

For example, if the refractive index of synthetic quartz which is appropriately used as a material of a template at a wavelength of 365 nm is about 1.47 and the refractive index of air is assumed to be 1.0, the exposure light L3 having an incident angle θ of 43° or more is totally reflected, so that light is not emitted from the side surface of the step structure 121.

Next, the influence of leakage of exposure light during the imprinting in the template according to the first embodiment will be described with reference to FIGS. 3A and 3B.

As illustrated in FIG. 3A, in the template 1 according to the first embodiment which has the first step structure 21 on the main surface 11 of the base 10, has the second step structure 22 on the first step structure 21, and has the transfer pattern 23 on the upper surface of the second step structure 22 and which has a form where an outer side region of the second step structure 22 at an upper surface of the first step structure 21 is covered with the light shielding film 31, the upper surface (more precisely, the bottom surface of the concave part of the transfer pattern 23) of the second step structure 22 and the upper surface (more precisely, the upper surface of the light shielding film 31) of the first step structure 21 are separated by a distance (H2–H1).

Incidentally, in the template 1, the combined height (H2) of the step difference of the first step structure 21 and the step difference of the second step structure 22 serves as the height of about 30 which is required, for example, depending on the mechanical precision of the imprinting apparatus to be used.

Therefore, as illustrated in FIG. 3B, the exposure light L1 leaking from the part where the second step structure 22 and the upper surface of the first step structure 21 are in contact with each other spreads as diffracted light depending on the distance (H2–H1). However, since the distance (H2–H1) can be made smaller than the distance H101 (about 30 μm) illustrated in FIG. 12B, it is possible to suppress the spreading to be small.

For this reason, at the position of the height of the upper surface (transfer pattern region) of the second step structure 22, the region (corresponding to A1 illustrated in FIG. 3B) where the resin may be cured can also be formed to be smaller than the region corresponding to A2 illustrated in FIG. 12B.

Furthermore, in the second step structure 22 in which the step difference is substantially (H2–H1), for example, if the step difference is several μm or less, the step difference can be sufficiently formed in terms of time by dry etching.

Therefore, as illustrated in FIG. 3B, by using the dry etching, the cross-sectional shape of the part where the second step structure 22 and the upper surface of the first step structure 21 are in contact with each other can be formed at a right angle compared to a rounded shape illustrated in FIG. 12B.

Therefore, it is easy to form the light shielding film 31 with the same thickness as the other parts also in the part where the second step structure 22 and the upper surface of the first step structure 21 are in contact with each other, so that the leakage of the exposure light L1 is easily suppressed.

Incidentally, the first step structure 21 in which the step difference is substantially H1 may be formed by wet etching as in the related art.

In this case, similarly to the example illustrated in FIG. 12B, the cross-sectional shape of the part where the first step structure 21 and the main surface 11 of the base 10 are in contact with each other tends to have a rounded shape. However, in the first embodiment, since the light shielding film 31 formed on the upper surface of the first step structure 22 is responsible for shielding the exposure light, the effect of the light shielding film 31 is not impaired by the rounded shape.

The value of the distance (H2–H1) can be applied as long as the value of the distance is smaller than the height (typically about 30 μm) required, for example, depending on the mechanical accuracy of the imprinting apparatus to be used. However, as described above, for the purpose of suppressing the influence of leakage of exposure light (irradiation to an unintended region) during the imprinting, the smaller the value is, the more effective the value is.

On the other hand, for the purpose of preventing the photocurable resin 60 formed on the transfer substrate 50 from adhering to the light shielding film 31 during the imprinting, as illustrated in FIG. 2, it is preferable that a gap (space) is formed between the upper surface (the downward direction in FIG. 2) of the light shielding film 31 and the bottom surface (the same as the position of the upper surface of the photocurable resin 60 in FIG. 2) of the concave part of the transfer pattern 23.

In other words, as illustrated in FIG. 1, in a case where the distance in the vertical direction from the main surface 11 of the base 10 to the upper surface of the light shielding film 31 on the first step structure 21 is regarded as H1 and the distance in the vertical direction from the main surface 11 of the base 10 to the bottom surface of the concave part of the transfer pattern 23 on the upper surface of the second step structure 22 is regarded as H2, it is preferable that a relationship of H1<H2 is satisfied.

As a range that satisfies both of the purpose of suppressing the influence of leakage of exposure light during the imprinting and the purpose of preventing the photocurable resin from adhering to the light shielding film 31 during the imprinting, for example, the above-described distance (H2–H1) can be set to be in a range of 1 or more and 5 μm or less.

Figure 4:
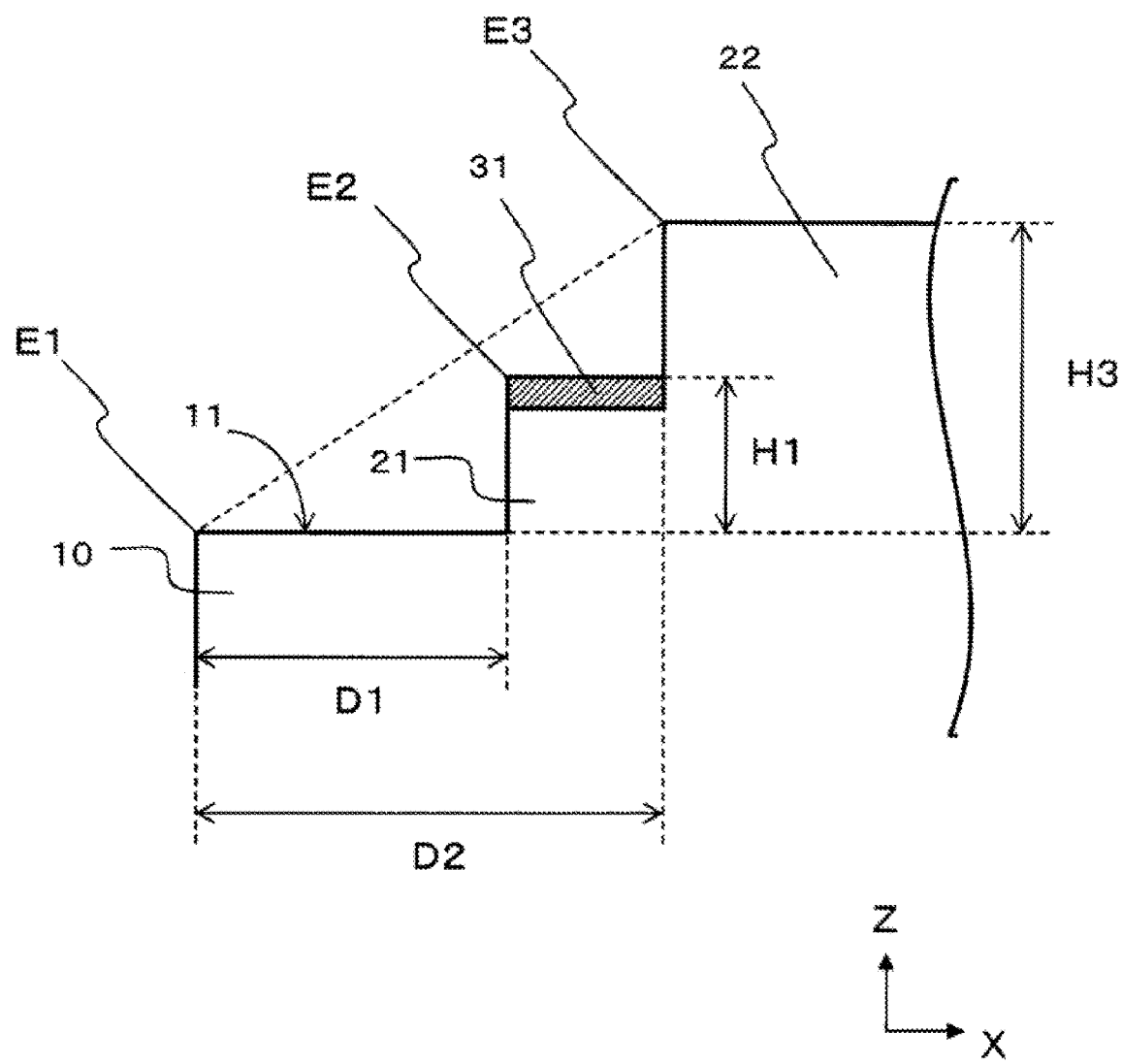
FIG. 4 is a diagram illustrating a positional relationship of step structures of the template according to the first embodiment.

In addition, in the template 1, as illustrated in FIG. 4, in a case where the distance in the vertical direction from the main surface 11 of the base 10 to the upper surface of the light shielding film 31 on the first step structure 21 is regarded as H1, the distance in the vertical direction from the main surface 11 of the base 10 to the upper surface of the second step structure 22 is regarded as H3, the distance in the horizontal direction from the outer edge of the main surface 11 of the base 10 to the outer edge of the upper surface of the first step structure 21 is regarded as D1, and the distance in the horizontal direction from the outer edge of the main surface 11 of the base 10 to the outer edge of the upper surface of the second step structure 22 is regarded as D2, it is preferable that a relationship of H1≤H3×(D1/D2) is satisfied.

Incidentally, FIG. 4 is a diagram illustrating the positional relationship of step structures of the template according to the first embodiment and corresponds to an enlarged diagram of main parts of R1 indicated by a broken line circle in FIG. 1.

In a case where the relationship is satisfied, as illustrated in FIG. 4, the outer edge E2 of the light shielding film 31 on the first step structure 21 exists in an inner side (on the template 1 side) than the broken line connecting the outer edge E1 of the main surface 11 of the base 10 and the outer edge E3 of the upper surface of the second step structure 22.

Therefore, this is because, during the imprinting as illustrated in FIG. 2, even if the template 1 (more precisely, the upper surface of the second step structure 22 of the template 1) does not face horizontally and is in contact with the transfer substrate 50 (more precisely, the photocurable resin 60 formed on the transfer substrate 50) with an inclination, the outer edge E2 (furthermore, the light shielding film 31 on the first step structure 21) can be prevented from being in contact with the transfer substrate 50 (more precisely, the photocurable resin 60 formed on the transfer substrate 50).

In addition, in the template 1, as illustrated in FIG. 1, it is preferable that a depression part 40 including the second step structure 22 in a planar view is provided on the surface (back surface 12) opposite to the main surface 11 of the base 10. This is because a step such as releasing becomes easy.

More specifically, this is because by reducing the thickness of the template 1 in the region (transfer pattern region) where the transfer pattern 23 is formed to facilitate bending, the transfer pattern region of the template 1 is bent convexly toward the transfer substrate side during the releasing, so that it is possible to perform partially releasing sequentially from the outer edge part of the transfer region 61 of the photocurable resin 60 formed on the transfer substrate 50.

Furthermore, as illustrated in FIG. 1, it is preferable that the depression part 40 includes the first step structure 21 in a planar view. This is because it is possible to prevent a problem that the light shielding film 31 formed on the upper surface of the first step structure 21 is peeled off during the bending.

More specifically, since the inside of the depression part 40 is easily deformed during the bending because the thickness of the template 1 is small, whereas the outside of the depression part 40 is not easily deformed during the bending because the thickness of the template 1 is large.

Therefore, in a planar view, in a case where the first step structure 21 is not included in the depression part 40, in other words, in a planar view, in a case where the first step structure 21 exists not only inside the depression part 40 but also outside the depression part 40, the first step structure 21 has a boundary between the region (that is, inside the depression part 40) that is easily deformed and the region (that is, outside the depression part 40) that is not easily deformed.

Then, since the stress is concentrated on the boundary during the bending, while the imprinting is repeated, the light shielding film 31 formed on the upper surface of the first step structure 21 is peeled off, and thus, there is a concern that the boundary becomes the origin of defect.

Therefore, in order to prevent such a boundary from being formed in the first step structure 21, as illustrated in FIG. 1, such a form that the depression part 40 includes the first step structure 21 in a planar view is provided.

Next, the material constituting the template 1 will be described.

The main material constituting the template 1, that is, the material constituting the base 10, the first step structure 21, the second step structure 22, and the transfer pattern 23 is a material that can be used for the photo imprinting method and can transmit exposure light during the imprinting.

In general, ultraviolet light having a wavelength in a range of 200 nm to 400 nm (in particular, in a range of 300 nm to 380 nm) is used as the exposure light.

Examples of the above-mentioned material include transparent materials such as quartz glass, heat-resistant glass, calcium fluoride ($CaF_2$), magnesium fluoride ($MgF_2$), and acrylic glass and stacked structures of these transparent materials. In particular, synthetic quartz is suitable because the synthetic quartz has high rigidity, low thermal expansion coefficient, and high transmittance in a range of commonly used wavelength of 300 nm to 380 nm.

Incidentally, in general, in the template used for nanoimprint lithography, the main material constituting the base and the main material constituting the step structure having the transfer pattern are the same material, and also in the template 1, the first step structure 21 and the second step structure 22 having the transfer pattern 23 are made of the same material as the base 10.

As a material constituting the light shielding film 31, for example, a material containing at least one of a metal material and oxide, nitride, and oxynitrides thereof can be used. Specific examples of the above-mentioned metal material which can be used include chromium (Cr), molybdenum (Mo), tantalum (Ta), tungsten (W), zirconium (Zr), and titanium (Ti).

Herein, in order to prevent irradiation with exposure light, it is preferable that the light shielding film 31 has a transmittance of 10% or less at a wavelength of 365 nm.

For example, in a case where chromium (Cr) is used as a material of the light shielding film 31, the thickness of the light shielding film 31 may be 15 nm or more.

Incidentally, in addition, the transfer pattern of the template for imprinting according to the first embodiment may be a line-and-space pattern or a pillar shape. As an example, in the case of a line-and-space pattern, the line width is about 30 nm and the height thereof is about 60 nm. In addition, in the case of the pillar shape, the diameter is about 50 nm, and the height thereof is about 60 nm.

Incidentally, in a case where the template 1 is viewed in plan, the width in the longitudinal direction and the width in the lateral direction of the first step structure 21 or the second step structure 22 are particularly limited as long as the widths satisfy the above-mentioned conditions, and the width in the longitudinal direction and the width in the lateral direction may be the same as each other or different from each other.

B. Second Embodiment

Figure 5:
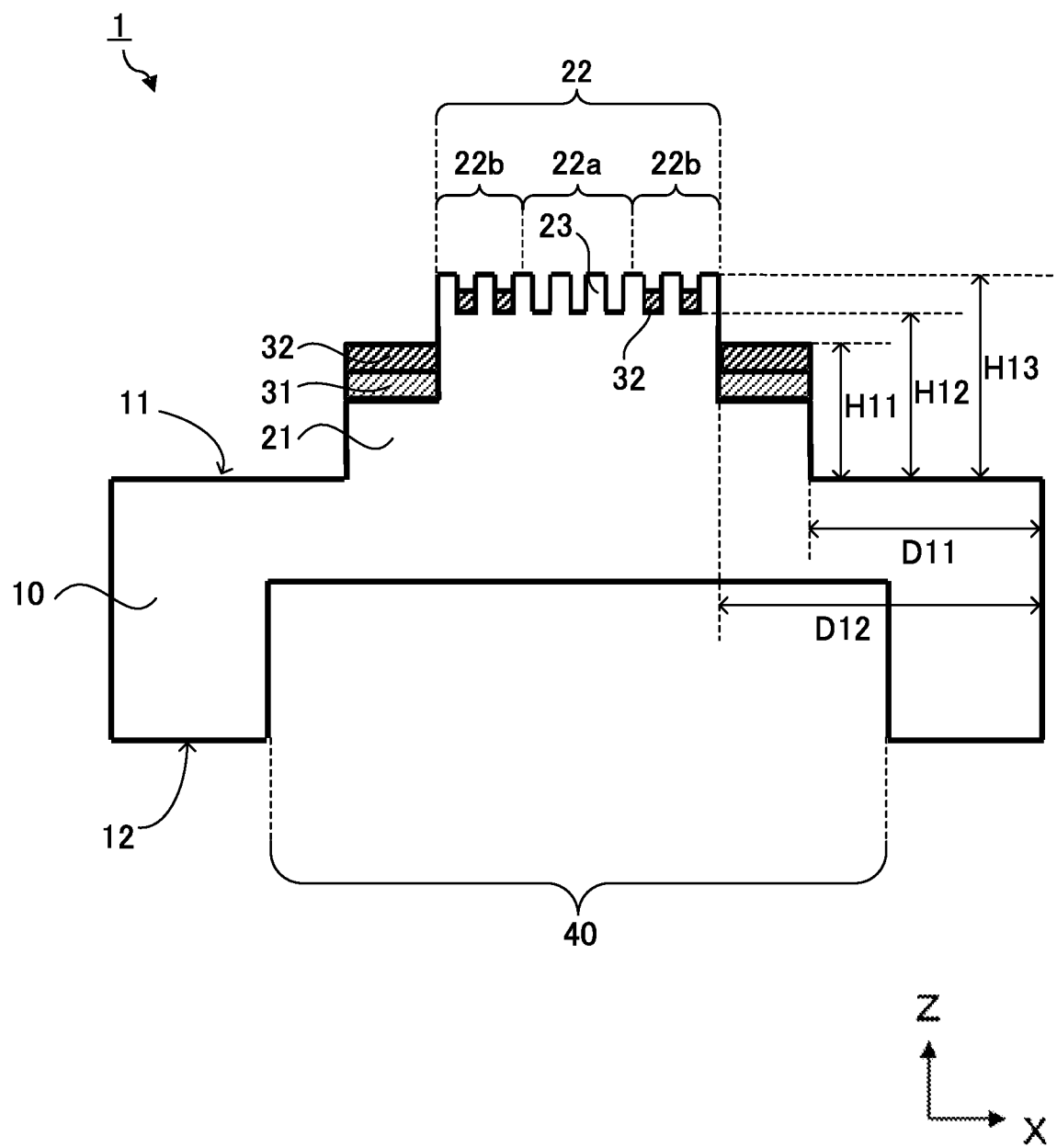
FIG. 5 is a diagram illustrating a configuration example of a template according to a second embodiment.

Next, the template according to the second embodiment will be described. FIG. 5 is a diagram illustrating a configuration example of the template according to the second embodiment.

For example, as illustrated in FIG. 5, the template 1 has a first step structure 21 on the main surface 11 of the base 10, has a second step structure 22 on the first step structure 21, and has a transfer pattern 23 on the upper surface of the second step structure 22, and an outer side region of the second step structure 22 at an upper surface of the first step structure 21 is covered with the light shielding film 31.

The template 1 has, on the upper surface of the second step structure 22, a first concave and convex structure body 22a constituting the transfer pattern 23 and a second concave and convex structure body 22b constituting an alignment mark. A high contrast film 32 made of a material film different from the material constituting the base 10 is formed on the light shielding film 31 and on the bottom surface of the concave part of the second concave and convex structure body 22b.

Incidentally, the high contrast film 32 is formed on the lower side of the concave part of the second concave and convex structure body 22b. In addition, in the template 1, the upper surface of the second concave and convex structure body 22b becomes the transfer pattern region.

Due to the above-described configuration, similarly to the template 1 illustrated in FIG. 1, in the template 1 it is possible to suppress the influence of leakage of exposure light (irradiation to an unintended region) during the imprinting, while maintaining the required height (the distance from the main surface 11 of the base 10) of the transfer pattern region.

In addition, in the above-described configuration, the high contrast film 32 is formed on the bottom surface of the concave part of the second concave and convex structure body 22b constituting the alignment mark, and the light shielding film 31 and the high contrast film 32 are sequentially stacked on the outer side region of the second step structure 22 at an upper surface of the first step structure 21. For this reason, in the template 1 illustrated in FIG. 5, it is possible to satisfy both requirements of improving the contrast of the alignment mark during the position alignment and preventing light irradiation to an unintended region during the imprinting. In addition, since the light shielding property of the stacked structure in which the light shielding film 31 and the high contrast film 32 are sequentially stacked is higher than the light shielding property of only the light shielding film 31 illustrated in FIG. 1, for example, the exposure light 82 in the originally unnecessary irradiation region 92 illustrated in FIG. 2 can be more effectively shielded than that of the template 1 illustrated in FIG. 1.

On the other hand, in the template 1 illustrated in FIG. 5, similarly to the space between the upper surface of the light shielding film 31 of the template 1 and the bottom surface of the concave part of the transfer pattern 23 illustrated in FIG. 1, it is preferable that a gap (space) is formed between the upper surface of the high contrast film 32 formed on the light shielding film 31 and the bottom surface of the concave part of the transfer pattern 23.

In other words, as illustrated in FIG. 5, in a case where the distance in the vertical direction from the main surface 11 of the base 10 to the upper surface of the high contrast film 32 formed on the light shielding film 31 is regarded as H11 and the distance in the vertical direction from the main surface 11 of the base 10 to the bottom surface of the concave part of the transfer pattern 23 on the upper surface of the second step structure 22 is regarded as H12, it is preferable that a relationship of H11<H12 is satisfied.

In addition, in the template 1 illustrated in FIG. 5, as a range that satisfies both the purpose of suppressing the influence of leakage of exposure light during the imprinting and the purpose of preventing the photocurable resin from adhering to the light shielding film 31 during the imprinting, For example, the value of the distance (H12–H11) between the bottom surface of the concave part of the transfer pattern 23 and the upper surface of the high contrast film 32 formed on the light shielding film 31 can be set to be in a range of 1 µm or more and 5 µm or less.

In addition, in the template 1 illustrated in FIG. 5, for the same reason as the relationship of H11 and H13 in the template 1 illustrated in FIG. 1, in a case where the distance in the vertical direction from the main surface 11 of the base 10 to the upper surface of the high contrast film 32 formed on the light shielding film 31 is regarded as H11, the distance in the vertical direction from the main surface 11 of the base 10 to the upper surface of the second step structure 22 is regarded as H13, the distance in the horizontal direction from the outer edge of the main surface 11 of the base 10 to the outer edge of the upper surface of the first step structure 21 is regarded as D11, and the distance in the horizontal direction from the outer edge of the main surface 11 of the base 10 to the outer edge of the upper surface of the second step structure 22 is regarded as D12, it is preferable that a relationship of H11≤H13×11/D12) is satisfied.

In addition, in the template 1 illustrated in FIG. 5, for the same reason as the template 1 illustrated in FIG. 1, it is preferable that a depression part 40 including the second step structure 22 in a planar view is provided on the surface (back surface 12) opposite to the main surface 11 of the base 10.

Furthermore, for the same reason as the template 1 illustrated in FIG. 1, it is preferable that the depression part 40 includes the first step structure 21 in a planar view.

Next, the relationship between the depths of the first concave and convex structure body 22a constituting the transfer pattern 23 and the second concave and convex structure body 22b constituting the alignment mark will be described.

Figure 6:
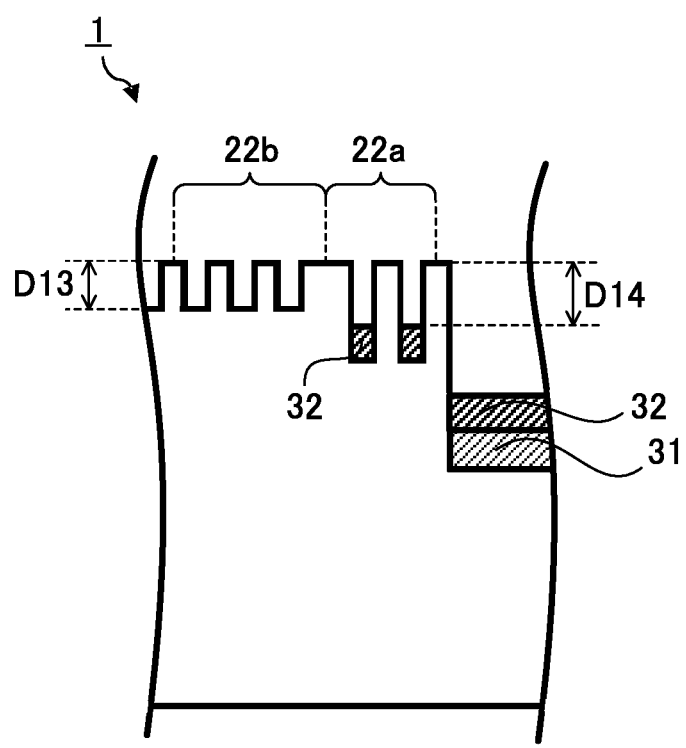
FIG. 6 is a diagram illustrating an example of main parts of a template according to the second embodiment.

FIG. 6 is a diagram illustrating an example of the main parts of the template according to the second embodiment.

In the template 1 illustrated in FIG. 5, as illustrated in FIG. 6, in a case where the distance from the upper surface of the convex part to the bottom surface of the concave part of the first concave and convex structure body 22a is regarded as D13 and the distance from the upper surface of the convex part to the upper surface of the high contrast film 32 on the bottom surface of the concave part of the second concave and convex structure body 22b is regarded as D14, it is preferable that the relationship D13 D14 is satisfied.

Figure 38J:
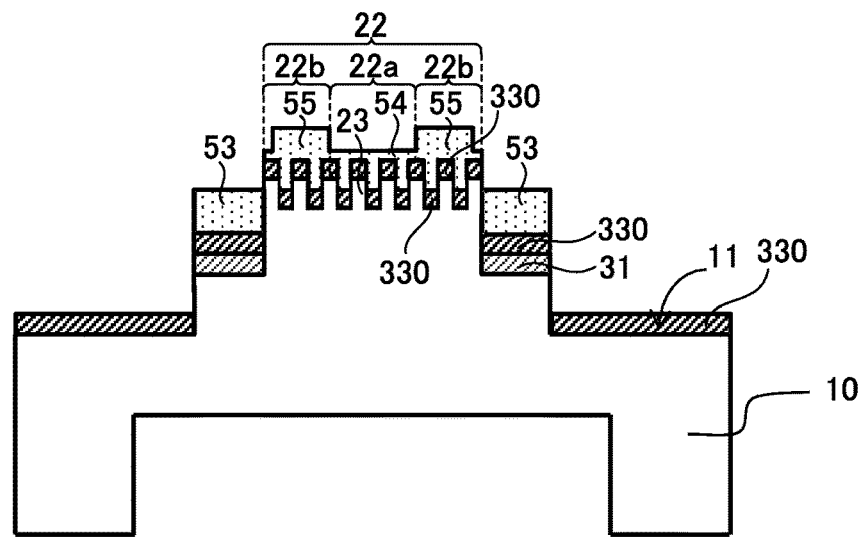
FIGS. 38J to 38L are schematic process diagrams illustrating another example of the production method of the template according to the second embodiment, following FIG. 37I.

This is because, with such a configuration, when producing the template for imprinting according to the present invention, it is possible to further increase the thickness of the resin layer (the fifth resin layer 55 formed on the bottom surface of the concave part of the second concave and convex structure body 22b illustrated in FIG. 38J) as an etching mask remaining on the high contrast film 32 on the bottom surface of the concave part of the second concave and convex structure body 22b, and thus, during the etching, it is possible to more reliably prevent the problem that the high contrast film 32 on the bottom surface of the concave part of the second concave and convex structure body 22b disappears.

The form as described above can be obtained by the method described in, for example, Japanese Patent Application No. 2014-193694.

That is, in the production method of the template for imprinting according to the present invention to be described later, it is possible to obtain the template for imprinting by forming a hard mask pattern which is to be an etching mask when forming the first concave and convex structure body 22a and the second concave and convex structure body 22b, after that, half-etching the second concave and convex structure body 22b in a state where the hard mask pattern region for forming the first concave and convex structure body 22a is covered with the resin layer, and after that, by removing the resin layer and forming the first concave and convex structure body 22a and the second concave and convex structure body 22 by etching.

Next, the material constituting the template 1 illustrated in FIG. 5 and the thickness of each film will be described.

Since the main material constituting the template 1 illustrated in FIG. 5, that is, the material constituting the base 10, the first step structure 21, and the second step structure 22 is similar to that of the template 1 illustrated in FIG. 1, the description thereof will be omitted herein. In addition, since the material constituting the first concave and convex structure body 22a and the second concave and convex structure body 22b in the template 1 illustrated in FIG. 5 is similar to the material constituting the transfer pattern 23 in the template 1 illustrated in FIG. 1, the description thereof will be omitted herein.

As the material constituting the light shielding film 31, unlike the material constituting the base 10, any material having light shielding properties can be used. For example, the same material as the light shielding film 31 in the template 1 illustrated in FIG. 1 can be used.

Herein, in order to prevent irradiation with the exposure light, it is preferable that the light shielding film 31 has a transmittance of 10% or less at a wavelength of 365 nm.

For example, in a case where chromium (Cr) is used as a material of the light shielding film 31, the thickness of the light shielding film 31 may be 15 nm or more. In particular, the thickness is preferably within a range of 35 nm to 1000 nm, particularly preferably within a range of 55 nm to 1000 nm. This is because the thickness of the light shielding film 31 is larger than these lower limits, so that the transmittance at a wavelength of 365 nm is 1% or less and the transmittance at a wavelength of 365 nm is 0.1% or less, and this is because the thickness of the light shielding film 31 is smaller than these upper limits, so that film peeling can be avoided.

As the material constituting the high contrast film 32, any material having a refractive index different from that of the material constituting the base 10 with respect to the alignment light and having a light shielding property can be used. For example, the same material as the light shielding film 31 in the template 1 illustrated in FIG. 1 can be used.

Although the thickness of the high contrast film 32 is not particularly limited as long as the thickness can satisfy the requirement of contrast of the alignment mark during the position alignment and the requirement of light shielding property, in the production method of the template for imprinting having a high contrast film described later, it is preferable to make the thickness as large as possible by forming the high contrast film 32 as thick as possible. This is because the contrast of the alignment mark is improved.

Although the thickness of the high contrast film 32 cannot be greatly changed due to restrictions on the structure and manufacturing of the first concave and convex structure body 22a and the second concave and convex structure body 22b, the thickness of the light shielding film 31 can be greatly changed. On the first step structure 21 where the light shielding film 31 and the high contrast film 32 are formed to be overlapped, it is preferable to regulate the thickness of the light shielding film 31 so that the thickness satisfying the requirement of light shielding can be obtained.

Incidentally, since the transfer pattern of the template for imprinting according to the second embodiment is similar to the transfer pattern of the template for imprinting according to the first embodiment, the description thereof will be omitted herein.

<Template Blank>

Figure 7:
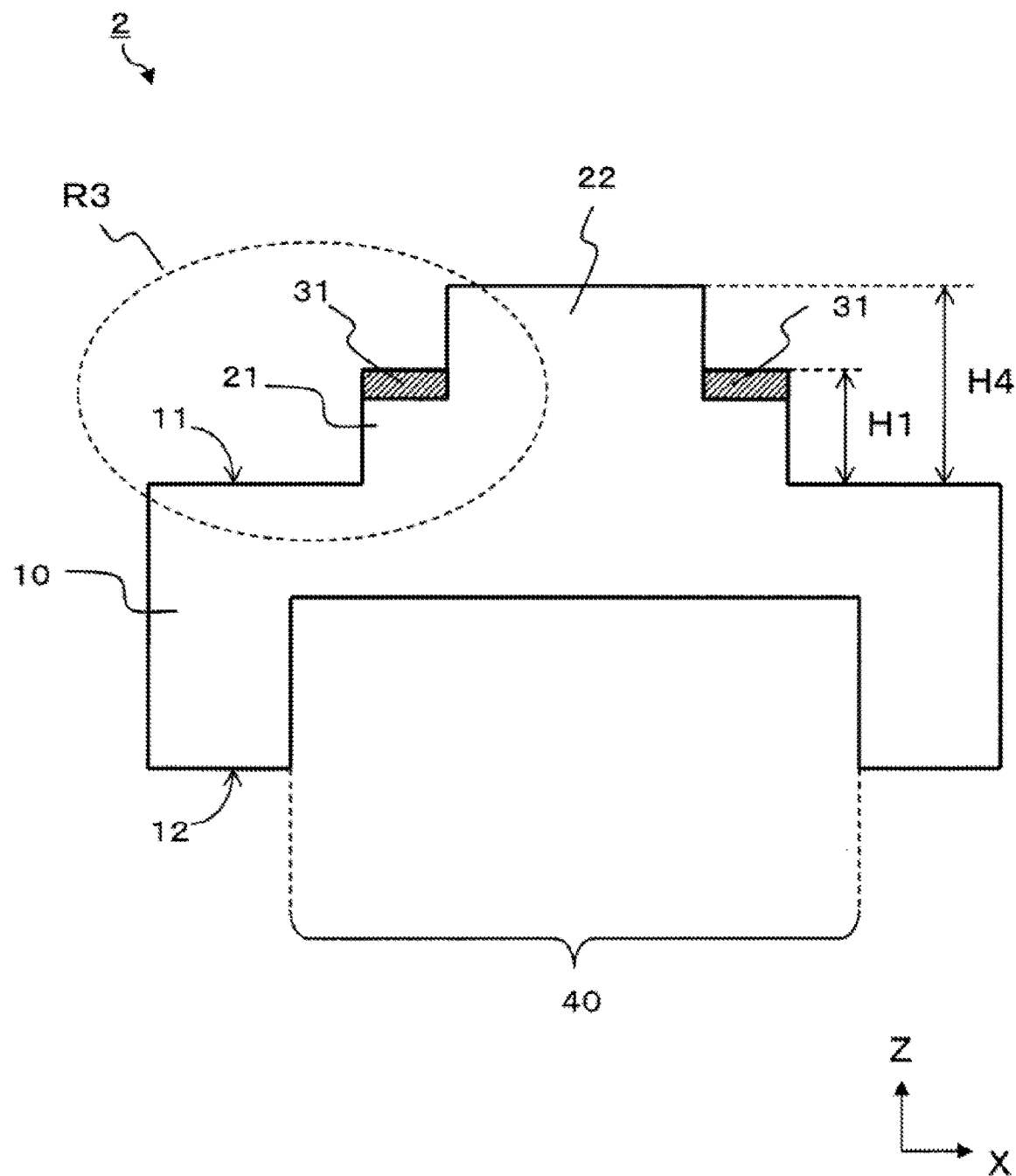
FIG. 7 is a diagram illustrating a configuration example of a template blank according to the present invention.

Next, the template blank according to the present invention will be described. FIG. 7 is a diagram illustrating a configuration example of the template blank according to the present invention.

For example, as illustrated in FIG. 7, the template blank 2 has, on the main surface 11 of the base 10, the first step structure 21 and the second step structure 22 on the first step structure 21, and an outer side region of the second step structure 22 at an upper surface of the first step structure 21 is covered with a light shielding film 31.

The template blank 2 is a template blank of producing the template 1. For example, the template 1 as illustrated in FIG. 1 can be produced by forming the transfer pattern 23 having a concave and convex structure on the upper surface of the second step structure 22 of the template blank 2.

Then, as described above, in the template 1, it is possible to suppress the influence of leakage of exposure light (irradiation to an unintended region) during the imprinting while maintaining the required height of the transfer pattern region.

Herein, in the template blank 2 illustrated in FIG. 7, the distance H4 in the vertical direction from the main surface 11 of the base 10 to the upper surface of the second step structure 22 corresponds to the sum of the distance H2 and the height of the convex part of the transfer pattern 23 in the template 1 illustrated in FIG. 1.

However, since the distance H2 is about 30 μm and the height of the convex part of the transfer pattern 23 is about 60 nm (about ⅕₀₀ of 30 μm), the distance H4 illustrated in FIG. 7 can be treated as approximately the same value as the distance H2 illustrated in FIG. 1.

Similarly to the distance (H2−H1) in the template 1 illustrated in FIG. 1, the value of the distance (H4−H1) in the template blank 2 illustrated in FIG. 7 can be applied as long as the value of the distance is smaller than the height (typically about 30 μm) required, for example, depending on the mechanical accuracy of the imprinting apparatus to be used. However, as described above, for the purpose of suppressing the influence of leakage of exposure light during the imprinting of the template 1, the smaller the value, the more effective the value is.

On the other hand, as described above, for the purpose of preventing the photocurable resin 60 formed on the transfer substrate 50 from adhering to the light shielding film 31 of the template 1 during the imprinting, as illustrated in FIG. 2, it is preferable that a gap (space) is formed between the upper surface (the downward direction in FIG. 2) of the light shielding film 31 and the bottom surface (the same as the position of the upper surface of the photocurable resin 60 in FIG. 2) of the concave part of the transfer pattern 23.

Therefore, also in the template blank 2, as illustrated in FIG. 7, in a case where the distance in the vertical direction from the main surface 11 of the base 10 to the upper surface of the light shielding film 31 on the first step structure 21 is regarded as H1 and the distance in the vertical direction from the main surface 11 of the base 10 to the upper surface of the second step structure 22 is regarded as H4, it is preferable that a relationship of H1<H4 is satisfied.

As a range that satisfies both of the purpose of suppressing the influence of leakage of exposure light during the imprinting of the template 1 and the purpose of preventing the photocurable resin from adhering to the light shielding film 31 of the template 1 during the imprinting, for example, the above-described value of the distance (H4−H1) can be set to be in a range of 1 μm or more and 5 μm or less.

Figure 8:
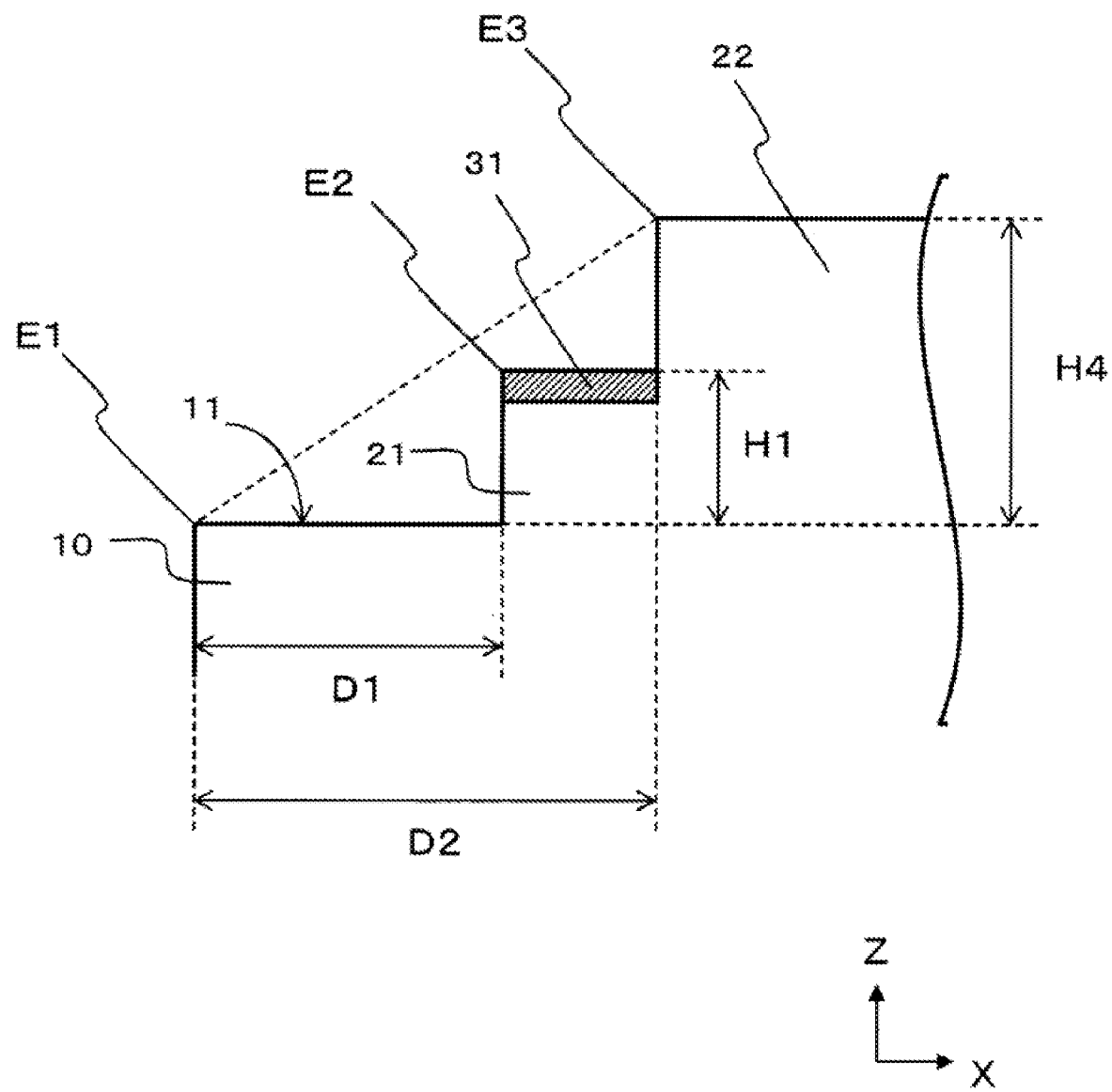
FIG. 8 is a diagram illustrating a positional relationship of step structures of the template blank according to the present invention.

In addition, in the template blank 2, as illustrated in FIG. 8, in a case where the distance in the vertical direction from the main surface 11 of the base 10 to the upper surface of the light shielding film 31 on the first step structure 21 is regarded as H1, the distance in the vertical direction from the main surface 11 of the base 10 to the upper surface of the second step structure 22 is regarded as H4, the distance in the horizontal direction from the outer edge of the main surface 11 of the base 10 to the outer edge of the upper surface of the first step structure 21 is regarded as D1, and the distance in the horizontal direction from the outer edge of the main surface 11 of the base 10 to the outer edge of the upper surface of the second step structure 22 is regarded as D2, it is preferable that a relationship of H1≤H4×(D1/D2) is satisfied.

Incidentally, FIG. 8 is a diagram illustrating the positional relationship of step structures of the template blank according to the present invention and corresponds to an enlarged diagram of main parts of R3 illustrated by a broken line circle in FIG. 7.

In a case where the relationship is satisfied, as illustrated in FIG. 8, the outer edge E2 of the light shielding film 31 on the first step structure 21 exists in an inner side (on the template blank 2 side) than the broken line connecting the outer edge E1 of the main surface 11 of the base 10 and the outer edge E3 of the upper surface of the second step structure 22.

Therefore, this is because, during the imprinting of the template 1 as illustrated in FIG. 2, even if the template 1 (more precisely, the upper surface of the second step structure 22 of the template 1) does not face horizontally and is in contact with the transfer substrate 50 (more precisely, the photocurable resin 60 formed on the transfer substrate 50) with an inclination, the outer edge E2 (furthermore, the light shielding film 31 on the first step structure 21) can be prevented from being in contact with the transfer substrate 50 (more precisely, the photocurable resin 60 formed on the transfer substrate 50).

In addition, in the template blank 2, as illustrated in FIG. 7, it is preferable that a depression part 40 including the second step structure 22 in a planar view is provided on a surface (back surface 12) opposite to the main surface 11 of the base 10. This is because a step such as releasing of the template 1 becomes easy.

More specifically, this is because, with such a configuration, it is possible to reduce the thickness of the template blank 2 in the region where the second step structure 22 is formed, so that in the template 1, by reducing the thickness of the region (transfer pattern region) where the transfer pattern 23 is formed to facilitate bending, the transfer pattern region of the template 1 is bent convexly toward the transfer substrate side during the releasing, so that it is possible to perform partially releasing sequentially from the outer edge part of the transfer region 61 of the photocurable resin 60 formed on the transfer substrate 50.

Furthermore, as illustrated in FIG. 7, it is preferable that the depression part 40 includes the first step structure 21 in a planar view. This is because it is possible to prevent a problem that the light shielding film 31 formed on the upper surface of the first step structure 21 is peeled off during the bending.

More specifically, the inside of the depression part 40 is a region that is easily deformed during the bending of the template 1 because the thickness of the template blank 2 is small, whereas the outside of the depression part 40 is a region that is not easily deformed during the bending of the template 1 since the thickness of the template blank 2 is large.

Therefore, in a planar view, in a case where the first step structure 21 is not included in the depression part 40, in other words, in a planar view, in a case where the first step structure 21 exists not only inside the depression part 40 but also outside the depression part 40, the first step structure 21 has a boundary between the region (that is, inside the depression part 40) that is easily deformed and the region (that is, outside the depression part 40) that is not easily deformed.

Then, since the stress is concentrated on the boundary during the bending of the template 1, while the imprinting is repeated, the light shielding film 31 formed on the upper surface of the first step structure 21 is peeled off, and thus, there is a concern that the boundary becomes the original of defect.

Therefore, in order to prevent such a boundary from being formed in the first step structure 21, as illustrated in FIG. 7, such a form that the depression part 40 includes the first step structure 21 in a planar view is provided.

As the material constituting the template blank 2, the same material as the above-described template 1 can be used.

<Production Method of Template Blank>

Next, a production method of a template blank according to the present invention will be described.

Figure 9:
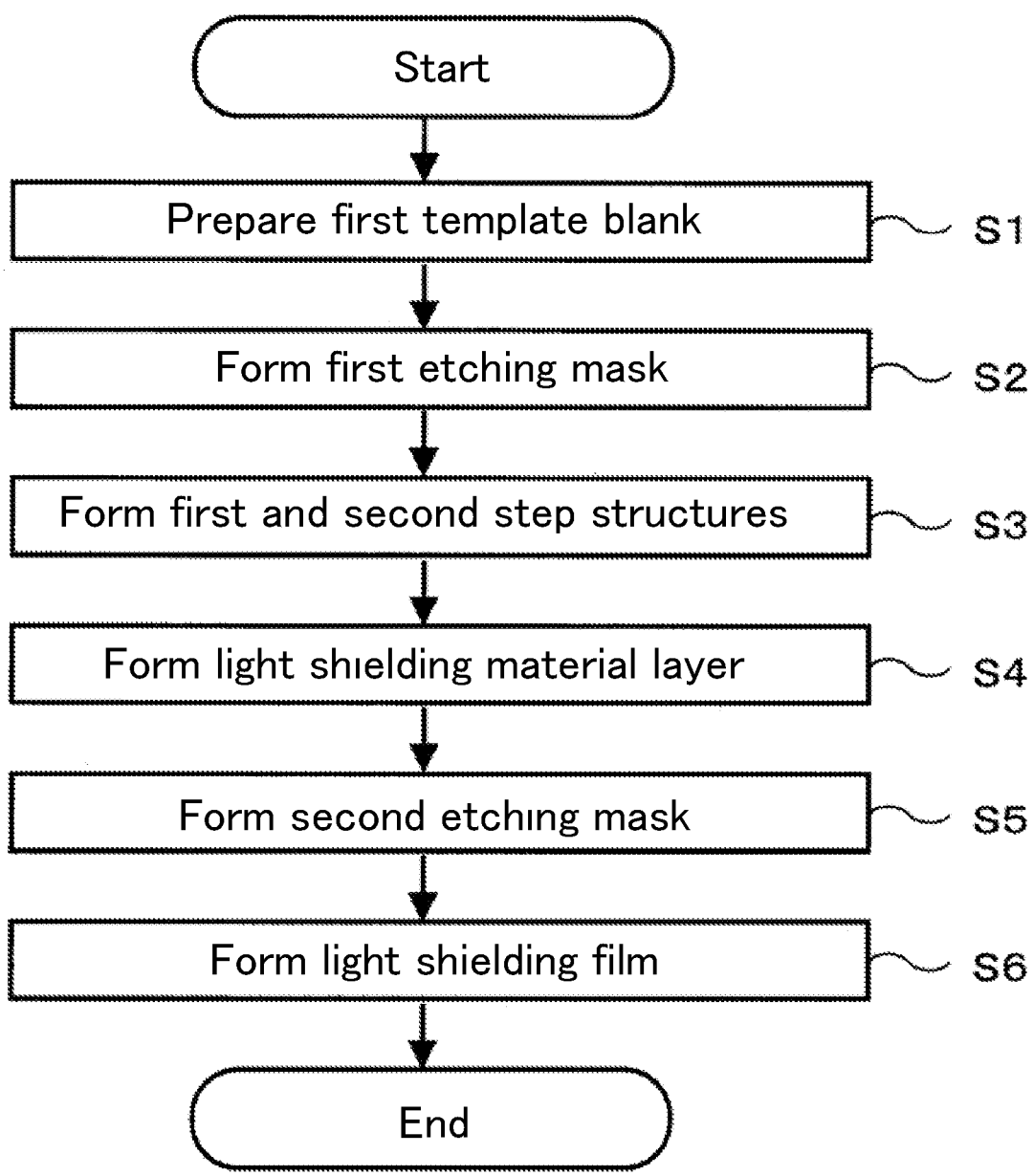
FIG. 9 is a flowchart illustrating an example of a production method of the template blank according to the present invention.

FIG. 9 is a flowchart illustrating an example of the production method of the template blank according to the present invention. In addition, FIGS. 10A to 10C and 11D to 11F are schematic process diagrams illustrating an example of the production method of the template blank according to the present invention.

Incidentally, the template according to the present invention can be produced by forming the transfer pattern 23 on the upper surface of the second step structure 22 by the same method as the method in the related art using the template blank according to the present invention. Therefore, the description of the production method of the template according to the present invention with reference to the drawings will be omitted.

Figure 10A:
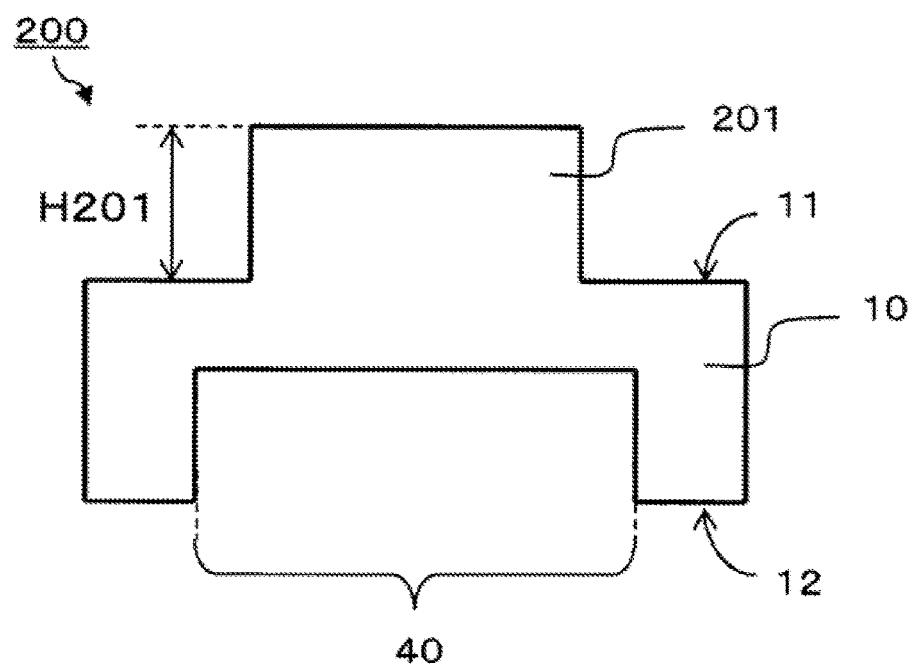
FIGS. 10A to 10C are schematic process diagrams illustrating an example of the production method of the template blank according to the present invention.

For example, in order to produce the template blank 2 by this production method, first, a first template blank 200 having a mesa-shaped step structure 201 on the main surface 11 of the base 10 is prepared (51 in FIG. 9, FIG. 10A).

As the first template blank 200, a template blank which does not have the first step structure 21, the second step structure 22, and the light shielding film 31 as in the template blank 2, for example, a template blank which is the same as the template blank used for the photo imprinting method in the related art can be used.

The first template blank 200 is made of, for example, synthetic quartz.

The distance H201 from the main surface 11 of the base 10 to the upper surface of the step structure 201 is approximately the same as the distance H4 of the template blank 2 illustrated in FIG. 7 and is typically about 30 μm.

In addition, it is preferable that a depression part 40 is provided on the back surface 12 side of the base 10.

Figure 10B:
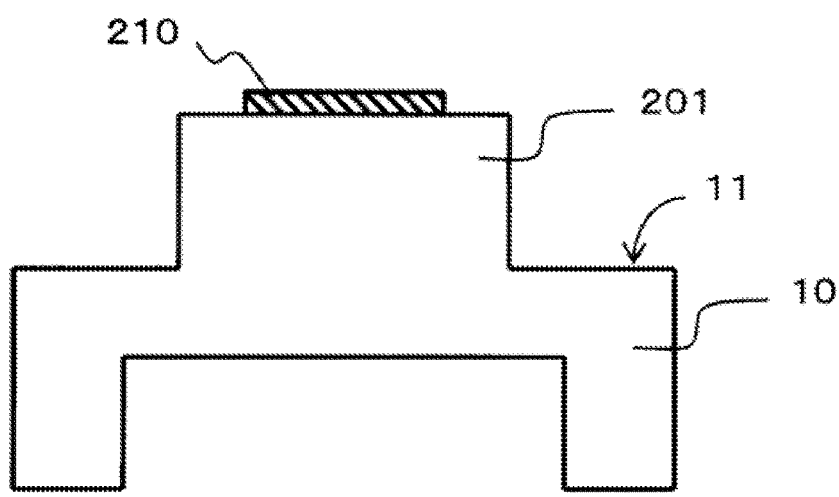

Next, a first etching mask 210 is formed on the upper surface of the step structure 201 (S2 in FIG. 9, FIG. 10B).

For example, the first etching mask 210 can be formed by performing sputtering film formation using chromium (Cr) and, after that, performing a patterning process in a mask shape.

Figure 10C:
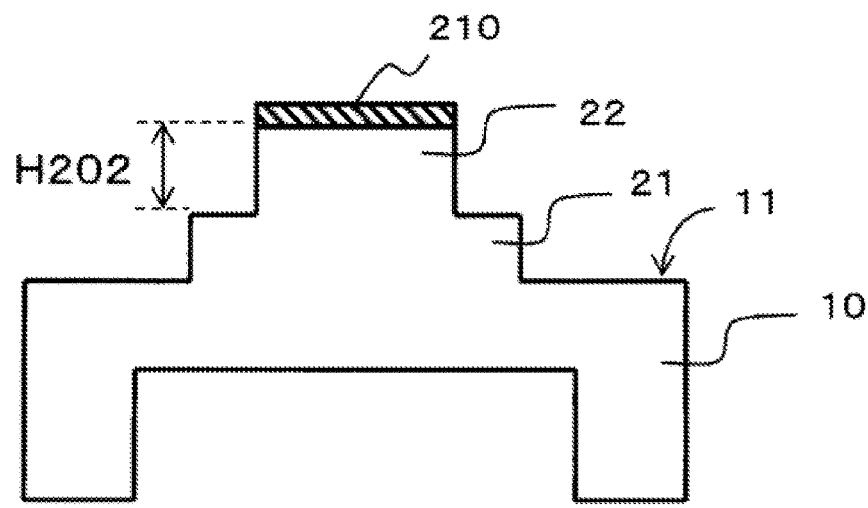

Next, the first step structure 21 and the second step structure 22 are formed by dry etching by using the first etching mask 210 as a mask (S3 in FIG. 9, FIG. 10C). As the etching gas, for example, a fluorine-based gas can be used.

Herein, the distance H202 (corresponding to the etching depth) illustrated in FIG. 10C is about several μm (in a range of 1 μm or more and 5 μm or less).

Figure 11D:
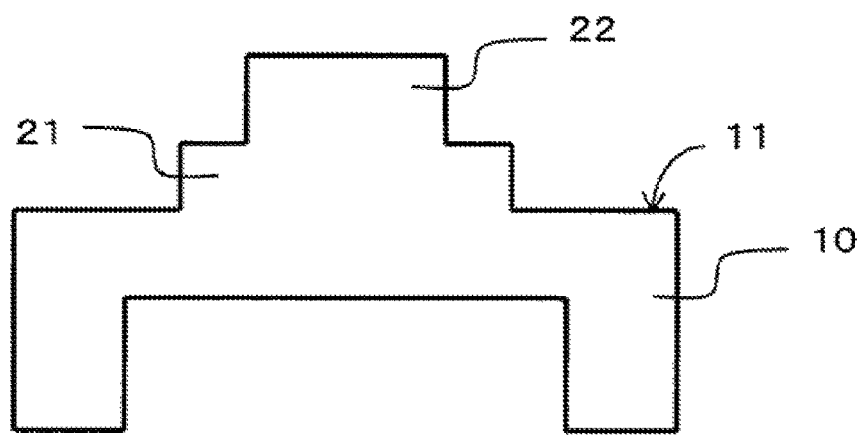
FIGS. 11D to 11F are schematic process diagrams illustrating the example of the production method of the template blank according to the present invention, following FIG. 10C.
Figure 11E:
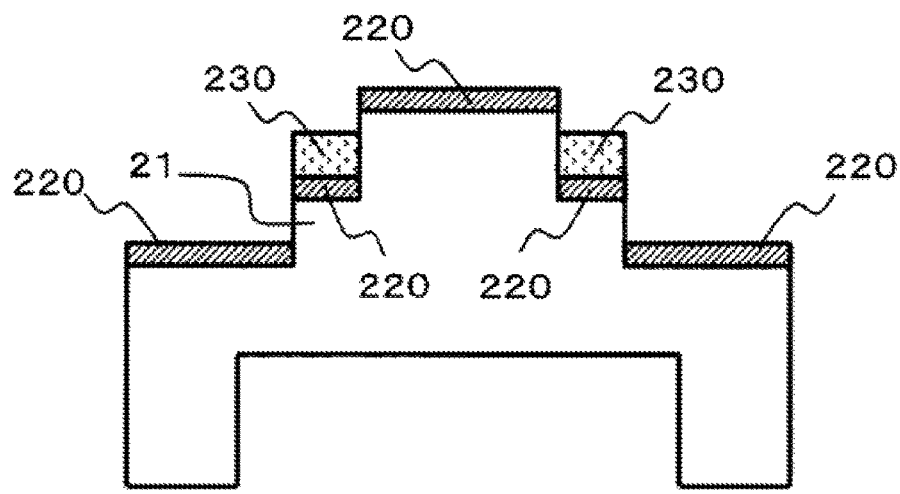

Next, the first etching mask 210 is removed (FIG. 11D), and subsequently, the light shielding material layer 220, which is to be the light shielding film 31 later, is formed on the main surface 11 of the base 10, the upper surface of the first step structure 21, and the upper surface of the second step structure 22, and the second etching mask 230 is formed in the outer side region of the second step structure 22 at an upper surface of the first step structure 21 (S4 and S5 in FIG. 9, FIG. 11E).

For example, the light shielding material layer 220 can be formed by sputtering film formation using chromium (Cr) so that the thickness is 15 nm or more.

In addition, the second etching mask 230 made of a resin can be formed by dropping a resin onto the outer side region of the second step structure 22 at an upper surface of the first step structure 21.

Figure 11F:
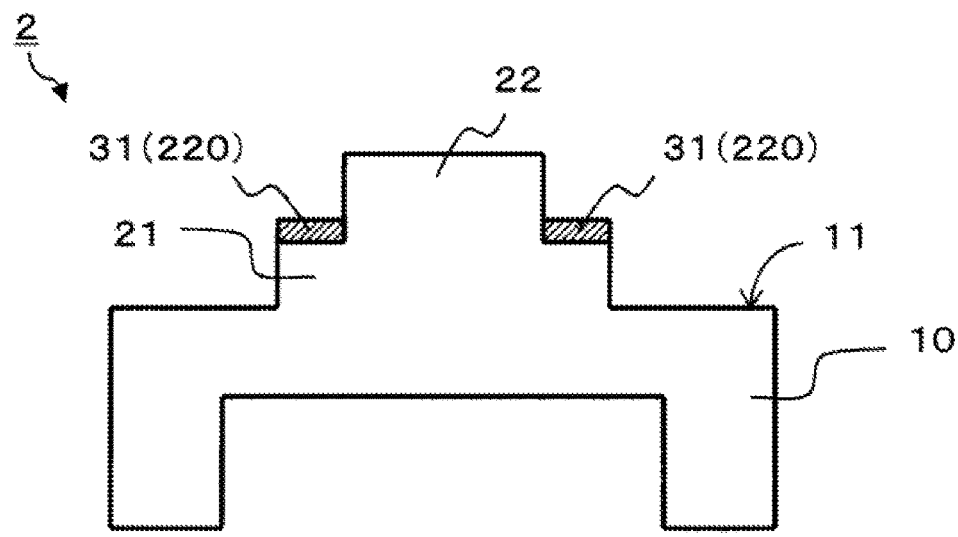

Next, by removing the light shielding material layer 220 exposed from the second etching mask 230 and, after that, removing the second etching mask 230, the template blank 2 which has the first step structure 21 on the main surface 11 of the base 10 and has the second step structure 22 on the first step structure 21 and in which the outer side region of the second step structure 22 at an upper surface of the first step structure 21 is covered with the light shielding film 31 is obtained (S6 in FIG. 9, FIG. 11F).

Heretofore, although the template and the template blank according to the present invention have been described above, the present invention is not limited to the above-described embodiments. The above-described embodiments are examples, and in any cases, those having substantially the same configuration and having the same functions and effects as the technical idea disclosed in the claims of the present invention are included in the technical scope of the present invention.

II. Production Method of Template Substrate for Imprinting, Production Method of Template for Imprinting, and Template A production method of a template substrate for imprinting, a production method of a template for imprinting, and a template according to the present invention will be described in detail with reference to the drawings.

<Template Substrate for Imprinting and Template for Imprinting>

First, a template substrate for imprinting produced by the production method according to the present invention and a template for imprinting will be described.

Incidentally, in order to avoid complication, the template substrate for imprinting and the template for imprinting are appropriately simply referred to as a template substrate and a template, respectively.

Figure 13:
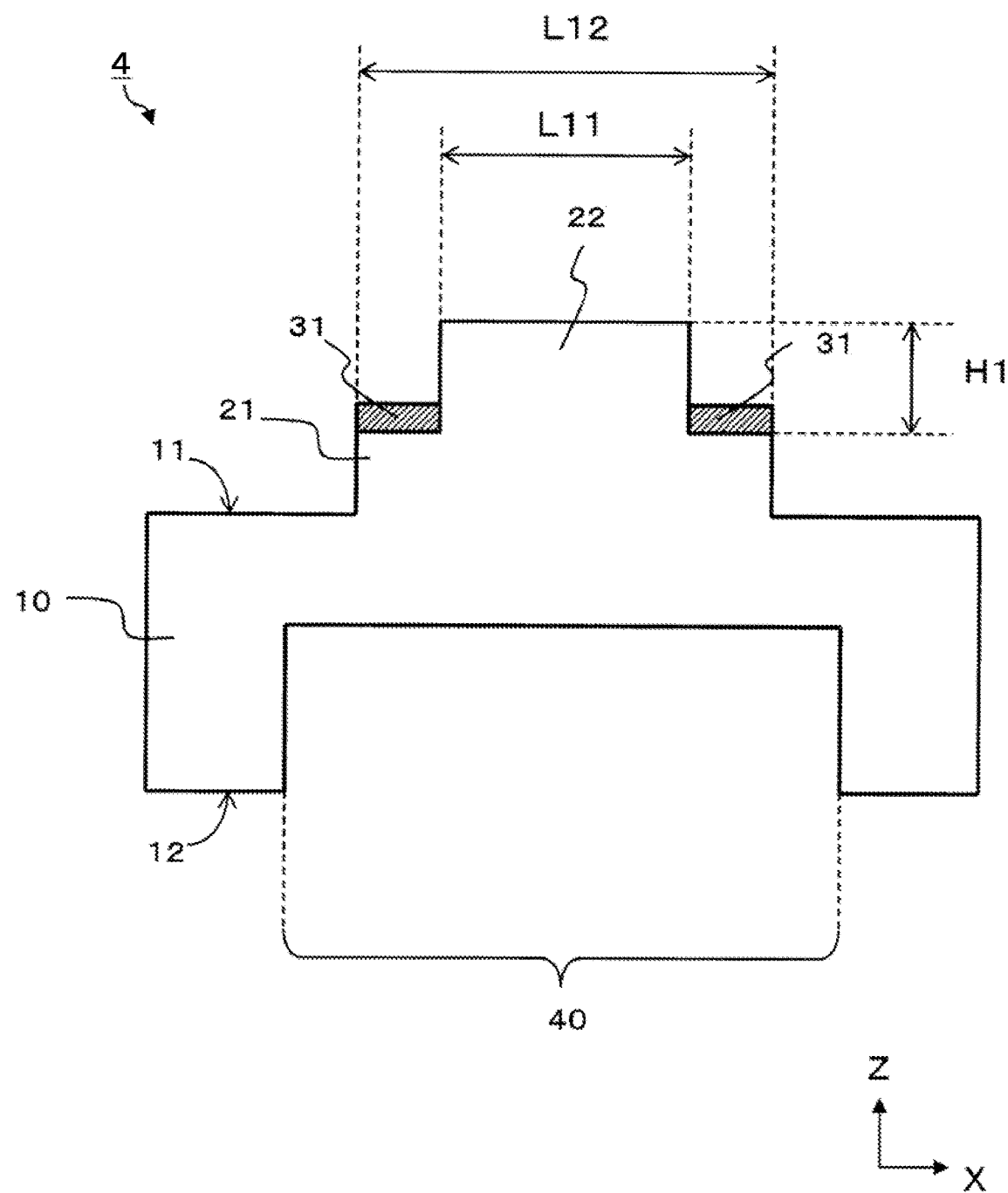
FIG. 13 is a diagram illustrating an example of a template substrate for imprinting according to the present invention.

FIG. 13 is a diagram illustrating an example of the template substrate according to the present invention. In addition, FIG. 14 is a diagram illustrating an example of the template according to the present invention.

For example, as illustrated in FIG. 13, the template substrate 4 has a first step structure 21 on a main surface 11 of a base 10 and has a second step structure 22 on the first step structure 21, and an outer side region of the second step structure 22 at an upper surface (exposed table, terrace) of the first step structure 21 is covered with a light shielding film 31.

Figure 14:
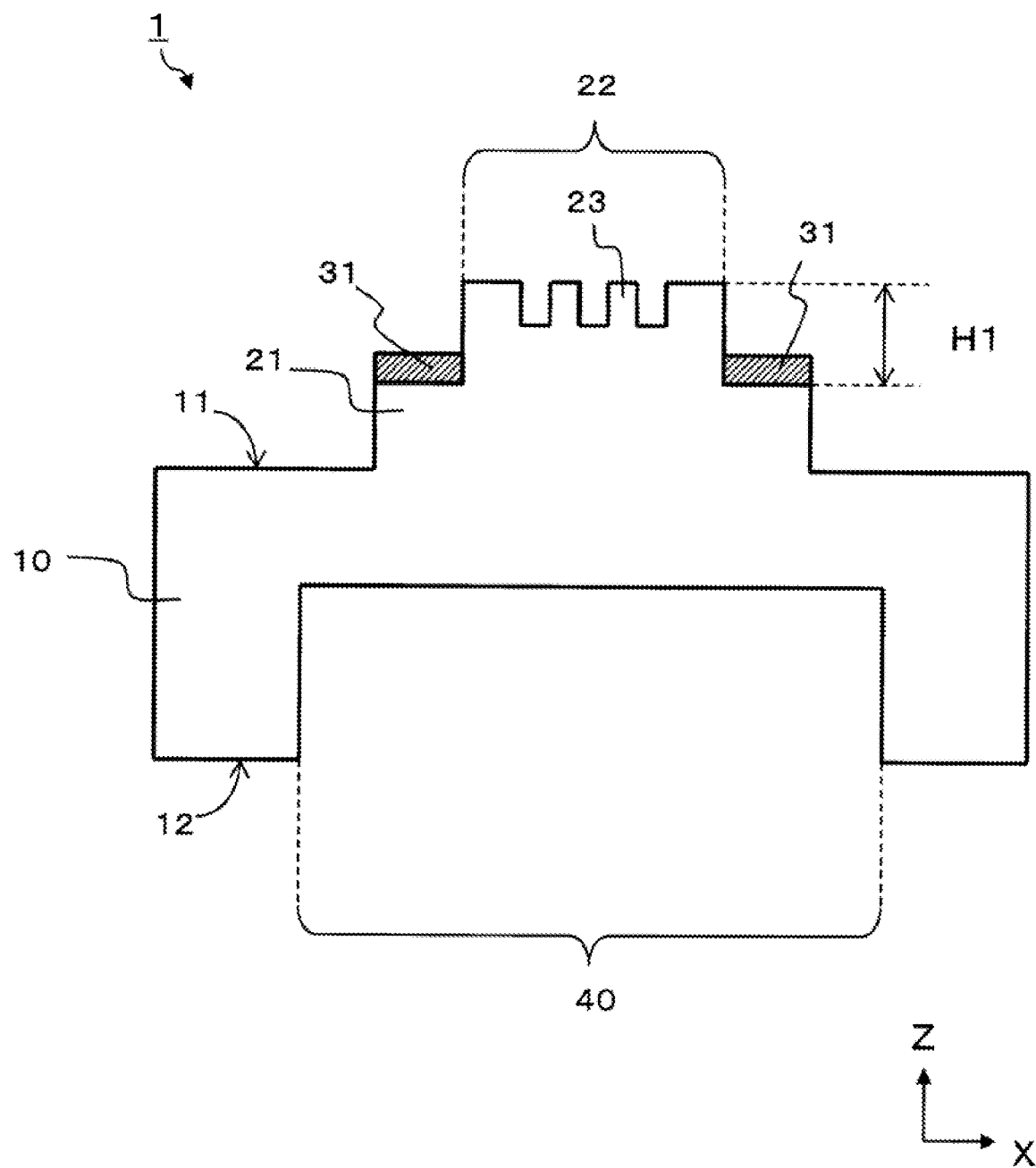
FIG. 14 is a diagram illustrating an example of a template for imprinting according to the present invention.

The template substrate 4 is a template substrate of producing a template 1 having the light shielding film 31 as illustrated in FIG. 14, and it is possible to produce the template 1 as illustrated in FIG. 14, for example, by forming a transfer pattern in a concave and convex structure on the upper surface of the second step structure 22 of the template substrate 4. Incidentally, in the template 1 illustrated in FIG. 14, the upper surface of the second step structure 22 becomes the transfer pattern region.

In addition, in the template 1, it is possible to suppress the influence of leakage of exposure light (irradiation to an unintended region) during the imprinting while maintaining the required height of the transfer pattern region.

For example, by producing the combined height of the step difference of the first step structure 21 and the step difference of the second step structure 22 in the template 1 illustrated in FIG. 14 to a required height (for example, 30 μm), in the template 1, the height (the distance from the main surface 11 of the base 10) of the transfer pattern region can be maintained at a required height (for example, 30 μm).

In addition, since the template 1 has the light shielding film 31 on the upper surface of the first step structure 21, in comparison with a form (for example, FIG. 7C in Patent Document 5) in which a light shielding member is provided only on the main surface 11 of the base 10 as in the related art, the light shielding film 31 exists at a distance closer to the upper surface of the second step structure 22 which is the transfer pattern region in the vertical direction (the Z direction in the figure). Therefore, it is possible to suppress the influence of leakage of exposure light (irradiation to an unintended region) during the imprinting.

For example, the value of the step difference (H1) of the second step structure 22 can be set to be in a range of 1 μm or more and 5 μm or less. If the step difference is several μm or less, the step difference can be sufficiently formed in terms of time by dry etching.

Therefore, by formation by the dry etching, the cross-sectional shape of the part where the second step structure 22 and the upper surface of the first step structure 21 are in contact with each other can be formed at a right angle compared to the case of formation by wet etching.

Therefore, it is easy to form the light shielding film 31 with the same thickness as the other parts also in the part where the second step structure 22 and the upper surface of the first step structure 21 are in contact with each other, so that the leakage of the exposure light L1 is easily suppressed.

<Production Method of Template Substrate for Imprinting>

Next, a production method of the template substrate for imprinting according to the present invention will be described.

Figure 15:
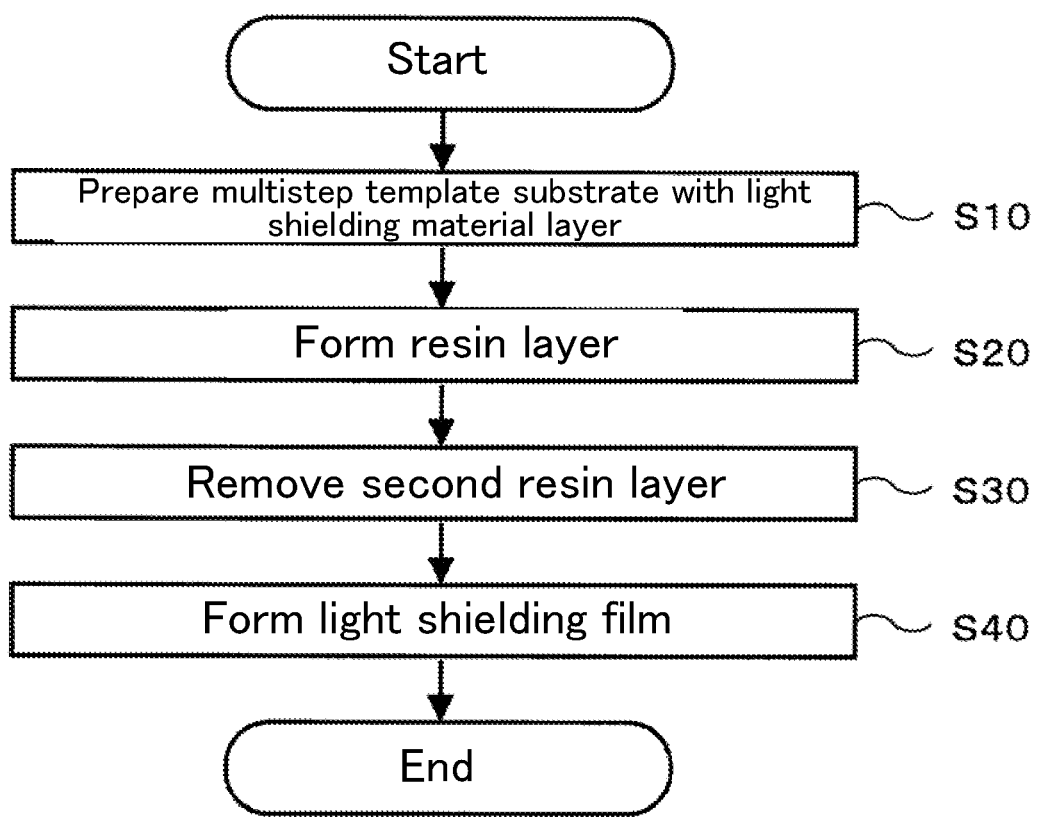
FIG. 15 is a flowchart illustrating an example of a production method of the template substrate according to the present invention.
Figure 16:
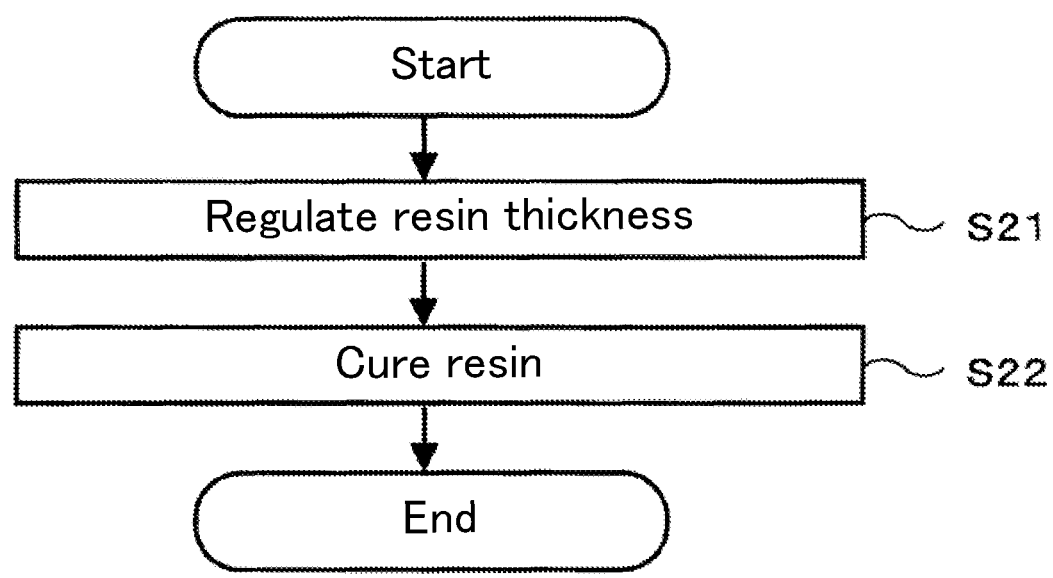
FIG. 16 is a flowchart illustrating an example of a resin layer forming step according to the present invention.

FIG. 15 is a flowchart illustrating an example of the production method of the template substrate for imprinting according to the present invention. In addition, FIG. 16 is a flowchart illustrating an example of a resin layer forming step according to the present invention. FIGS. 17A to 17C and 18D to 18F are schematic process diagrams illustrating an example of the production method of the template substrate for imprinting according to the present invention.

The production method of the template substrate for imprinting according to the present invention is a production method of a template substrate for imprinting having a first step structure on a main surface of a base, having a second step structure on the first step structure, and having a light shielding film on an upper surface of the first step structure, and as illustrated in FIG. 15, includes, in order, a multistep template substrate with the light shielding material layer preparing step (S10) of preparing a multistep template substrate with the light shielding material layer having the first step structure and the second step structure and having the light shielding material layer on the upper surface of the first step structure and the upper surface of the second step structure, a resin layer forming step (S20) of forming a first resin layer on the light shielding material layer formed on the upper surface of the first step structure and forming a second resin layer of which the thickness is smaller than that of the first resin layer on the light shielding material layer formed on the upper surface of the second step structure, a second resin layer removing step (S30) of removing the second resin layer by dry etching while allowing the first resin layer to remain, and a light shielding film forming step (S40) of removing the light shielding material layer formed on the upper surface of the second step structure by etching the light shielding material layer by using the remaining first resin layer as a mask while allowing the light shielding material layer formed on the upper surface of the first step structure to remain.

Then, the resin layer forming step (S20) includes a resin thickness specifying step (S21 in FIG. 16) of, by using a template for specifying resin thickness having a concave part having a rectangular shape in a planar view on the main surface side in contact with the resin, pressing the upper surface of the outer peripheral part of the concave part of the template for specifying resin thickness against the first resin dropped onto the light shielding material layer formed on the upper surface of the first step structure, and pressing the bottom surface of the concave part of the template for specifying resin thickness against the second resin dropped onto the light shielding material layer formed on the upper surface of the second step structure, and the depth of the concave part of the template for specifying resin thickness is smaller than the height from the upper surface of the first step structure to the upper surface of the second step structure.

Hereinafter, each step will be explained in order.

(Preparation of Multistep Template Substrate with Light Shielding Material Layer)

Figure 17A:
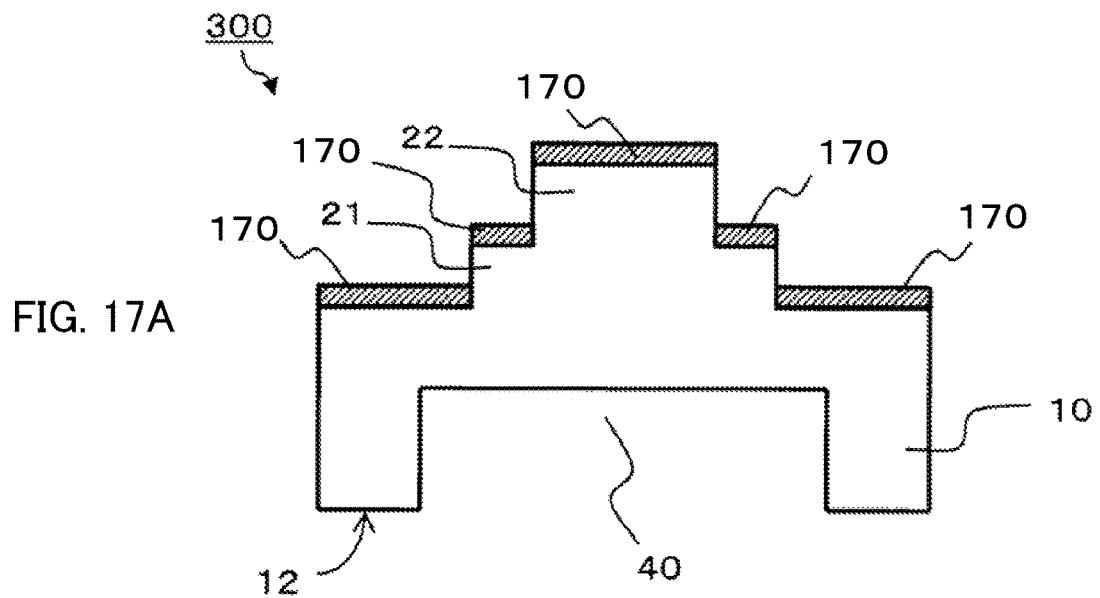
FIGS. 17A to 17C are schematic process diagrams illustrating an example of a production method of the template substrate for imprinting according to the present invention.

For example, in order to produce the template substrate 4 by this production method, first, a multistep template substrate 300 with a light shielding material layer which has the first step structure 21 and the second step structure 22 and has a light shielding material layer 170 on the upper surface (exposed table, terrace) of the first step structure 21 and on the upper surface of the second step structure 22 is prepared (S10 in FIG. 15, FIG. 17A).

In the multistep template substrate 300 with the light shielding material layer, the combined height of the first step structure 21 and the second step structure 22 is a height which is the same as or similar to the step difference of the template substrate having a one step structure used in the photo imprinting method in the related art and is typically about 30 μm. In addition, it is preferable that a depression part 40 is provided on the back surface 12 side of the base 10.

As illustrated in FIGS. 22 to 24E, for example, the multistep template substrate 300 with the light shielding material layer can be produced from a template substrate having a one step structure used in a photo imprinting method in the related art. The production method of the multistep template substrate with the light shielding material layer will be described later in detail.

(Resin Layer Formation)

Figure 17B:
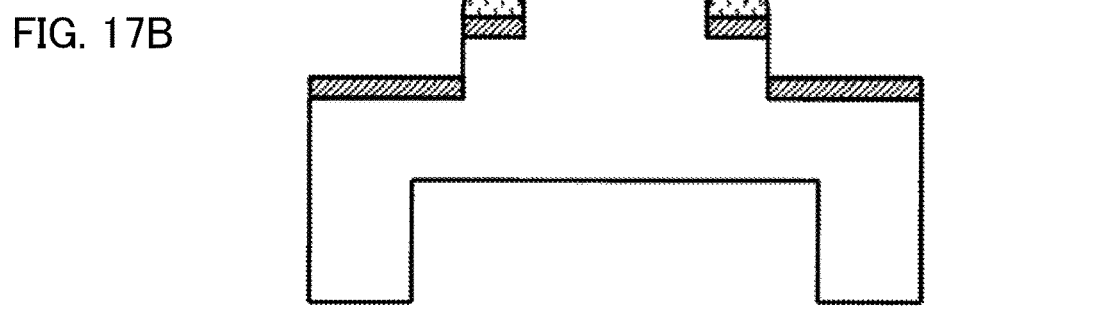
Figure 17C:
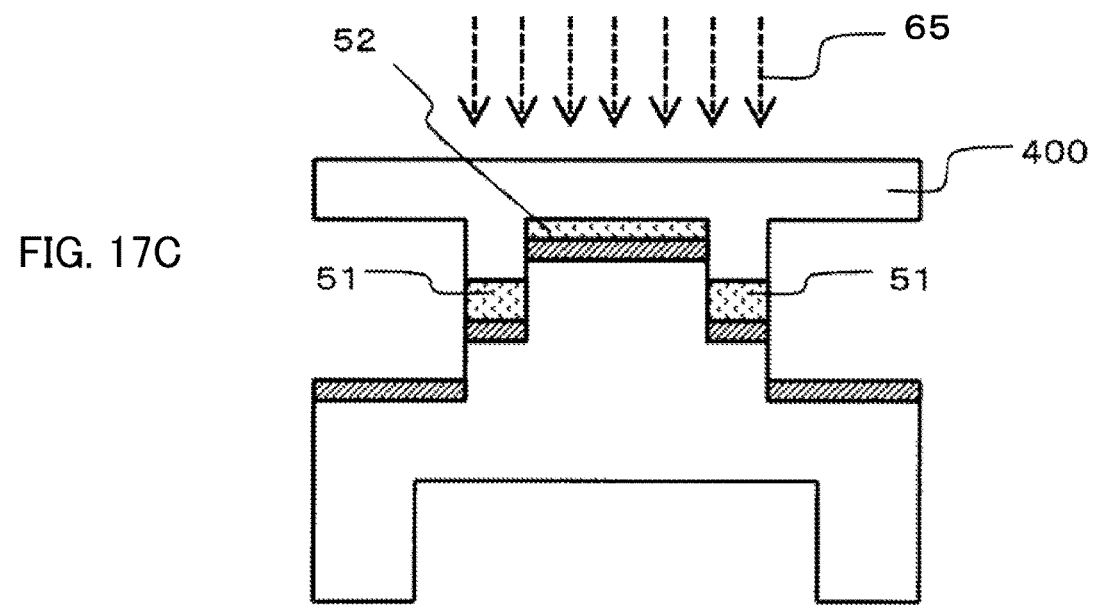
Figure 18D:
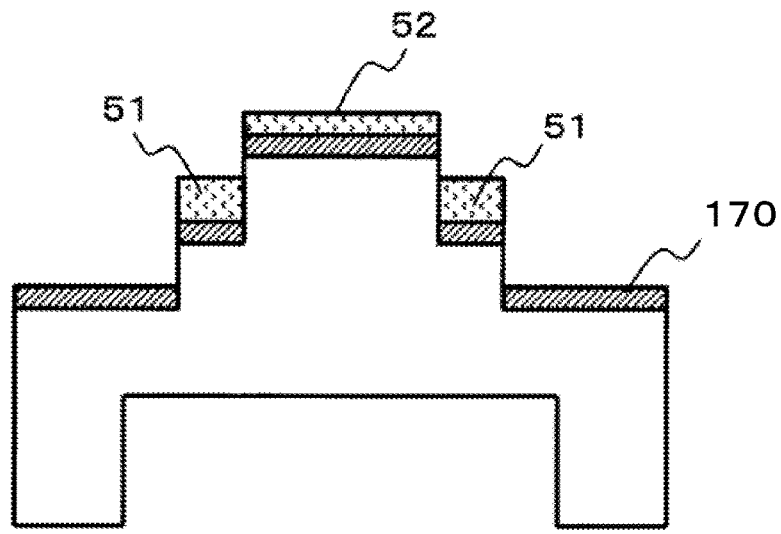
FIGS. 18D to 18F are schematic process diagrams illustrating the example of the production method of the template substrate according to the present invention, following FIG. 17C.

Next, as illustrated in FIG. 17B, by dropping the first resin 51a onto the light shielding material layer 170 formed on the upper surface of the first step structure 21, dropping the second resin 52a onto the light shielding material layer 170 formed on the upper surface of the second step structure 22, after that, as illustrated in FIG. 17C, pressing the template 400 for thickness regulation of the resin to define the thickness of each resin (S21 in FIG. 16), curing the first resin 51a and the second resin 52a in this state (S22 in FIG. 16), and after that, releasing the template 400 for thickness regulation of the resin, as illustrated in FIG. 18D, the first resin layer 51 and the second resin layer 52, each having a defined thickness, are obtained (S20 in FIG. 15).

Herein, in the production method, by using the template 400 for thickness regulation of the resin having a predetermined form, the thickness of the second resin layer 52 can be formed so as to be smaller than the thickness of the first resin layer 51.

In addition, by using the template 400 for thickness regulation of the resin, as illustrated in FIG. 18D, the first resin layer 51 can be formed as a resin layer having a uniform thickness. For example, the height difference of the thickness of the first resin layer 51 can be set to be 50 nm or less.

(Second Resin Layer Removal)

Figure 18E:
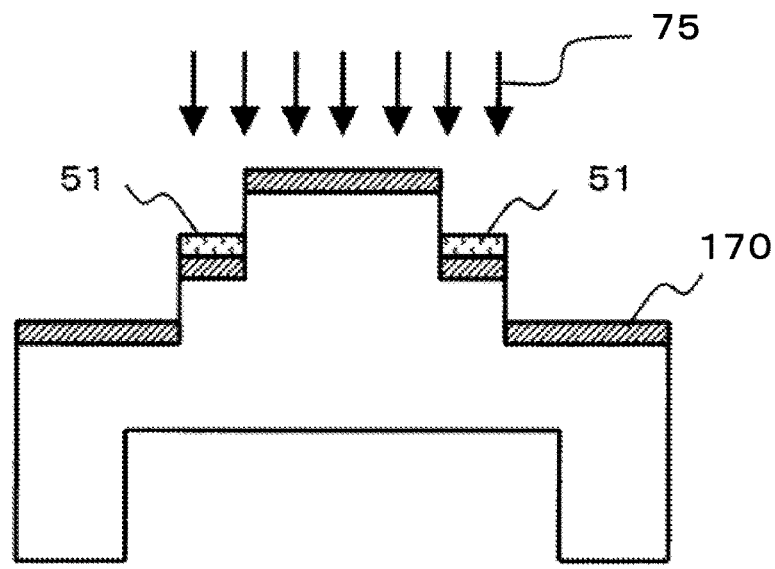

Next, as illustrated in FIG. 18E, by dry etching (etch-back) by using the etching gas 75, the second resin layer 52 is removed while allowing the first resin layer 51 to remain.

As described above, since the thickness of the second resin layer 52 is smaller than the thickness of the first resin layer 51, by the etch-back method, the second resin layer 52 can be removed while allowing the first resin layer 51 to remain.

As the etching gas 75, for example, oxygen gas can be used.

(Light Shielding Film Formation)

Next, by using the remaining first resin layer 51 as a mask, the light shielding material layer 170 exposed from the first resin layer 51 is etched, so that the light shielding material layer 170 formed on the upper surface of the second step structure 22 is removed while allowing the light shielding material layer 170 formed on the upper surface of the first step structure 21 to remain. The light shielding material layer 170 formed on the upper surface of the first step structure 21 remaining in this step becomes the light shielding film 31 of the template substrate 4.

For example, in a case where a material containing chromium (Cr) is used for the light shielding material layer 170, any one of dry etching and wet etching can be used for this etching. For example, in the case of dry etching, the dry etching by using a mixed gas of oxygen and chlorine can be used. In addition, in the case of wet etching, the wet etching by using an aqueous solution containing ceric ammonium nitrate and perchloric acid can be used.

Figure 18F:
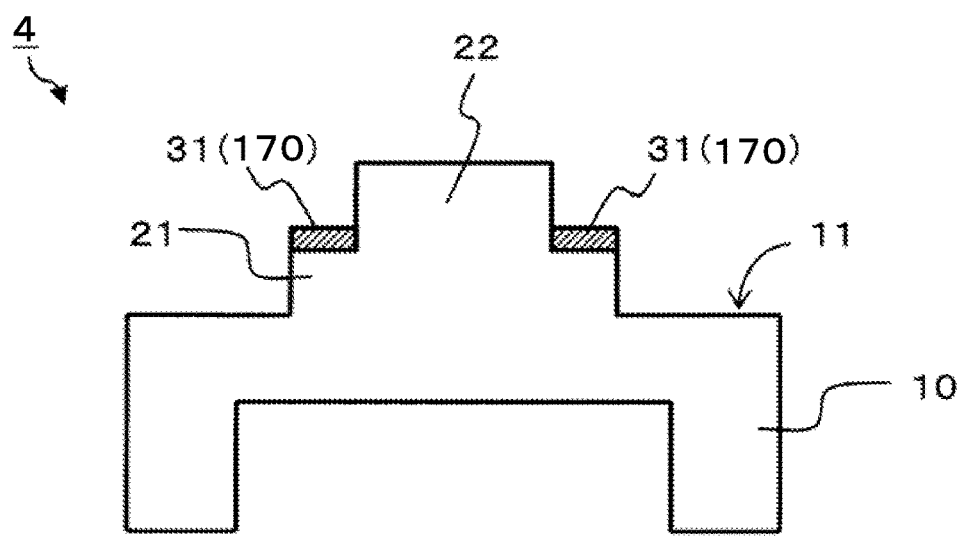

After that, by removing the remaining first resin layer 51, as illustrated in FIG. 18F, the template substrate 4 having the first step structure 21 on the main surface 11 of the base 10, having the second step structure 22 on the first step structure 21, and having the light shielding film 31 on the upper surface (exposed table, terrace) of the first step structure 21 can be obtained.

For removing the remaining first resin layer 51, for example, ashing by using oxygen gas can be used.

Problem 1 of the Related Art

Herein, in the step illustrated in FIG. 17B, in a case where the second resin 52a is not dropped onto the light shielding material layer 170 formed on the upper surface of the second step structure 22 (that is, the resin layer is not formed on the light shielding material layer 170 formed on the upper surface of the second step structure 22) and the light shielding material layer 170 formed on the upper surface of the second step structure 22 is to be removed by etching, there is a problem that it is not possible to prevent the first resin 51a from adhering to the light shielding material layer 170 formed on the upper surface of the second step structure 22, for example, due to splashes when the first resin 51a is dropped, and the unnecessary light shielding material layer 170 also remains on the upper surface of the second step structure 22 of the template substrate 4 illustrated in FIG. 18F due to this unnecessary first resin 51a.

Problem 2 of the Related Art

In addition, as illustrated in FIG. 17B, only by dropping the first resin 51a onto the light shielding material layer 170 formed on the upper surface of the first step structure 21, the formed resin layer has a defective part (a part without resin) or a thin film part (a part with a thin resin) according to the density distribution of the dropped first resin 51a. Then, if dry etching (etch-back) illustrated in FIG. 18E is performed, such a defective part and a thin film part are further increased.

Therefore, there is a problem that, if the light shielding material layer 170 is etched in a subsequent step, the light shielding material layer 170 formed on the upper surface of the first step structure 21 which is to be the light shielding film 31 also has a defective part or a thin film part.

Effect of Production Method According to the Present Invention

On the other hand, in the production method of the template substrate for imprinting according to the present invention, as illustrated in FIG. 17C, by using the template 400 for thickness regulation of the resin having a predetermined form, the thickness of the second resin layer 52, for example, including splashes when the first resin 51a is dropped can be formed to be smaller than the thickness of the first resin layer 51. Besides, both the first resin layer 51 and the second resin layer 52 can be formed as a resin layer having a uniform thickness.

Then, as illustrated in FIG. 18E, by the etch-back method, the second resin layer 52 can be removed while allowing the first resin layer 51 to remain.

Therefore, in the subsequent step, the light shielding material layer 170 exposed from the first resin layer 51 is etched, so that as illustrated in FIG. 18F, on the upper surface of the second step structure 22, the light shielding material layer 170 can be removed without allowing the light shielding material layer 170 to remain.

In addition, since the first resin layer 51 can be formed as a resin layer having a uniform thickness without a defective part, the light shielding material layer 170 formed on the upper surface of the first step structure 21 which is to be the light shielding film 31 can also be a film without a defective part or a thin film part.

(Resin)

The first resin 51a and the second resin 52a are made of a material that is cured by heat or light and are preferably ultraviolet curable resins used in the field of nanoimprint lithography.

In a case where the first resin 51a and the second resin 52a are ultraviolet curable resins, in the step of curing the first resin 51a and the second resin 52a (S22 in FIG. 16), as illustrated in FIG. 17C, a method of irradiating with the ultraviolet light 65 can be used.

Incidentally, the first resin 51a and the second resin 52a may be made of different materials as long as the second resin layer 52 can be removed by dry etching in the second resin layer removing step described later (S30 in FIG. 15, FIG. 18E) while allowing the first resin layer 51 to remain. However, from the viewpoint of ease of handling, it is preferable that these resins are made of the same material.

(Template for Thickness Regulation of Resin)

Figure 19A:
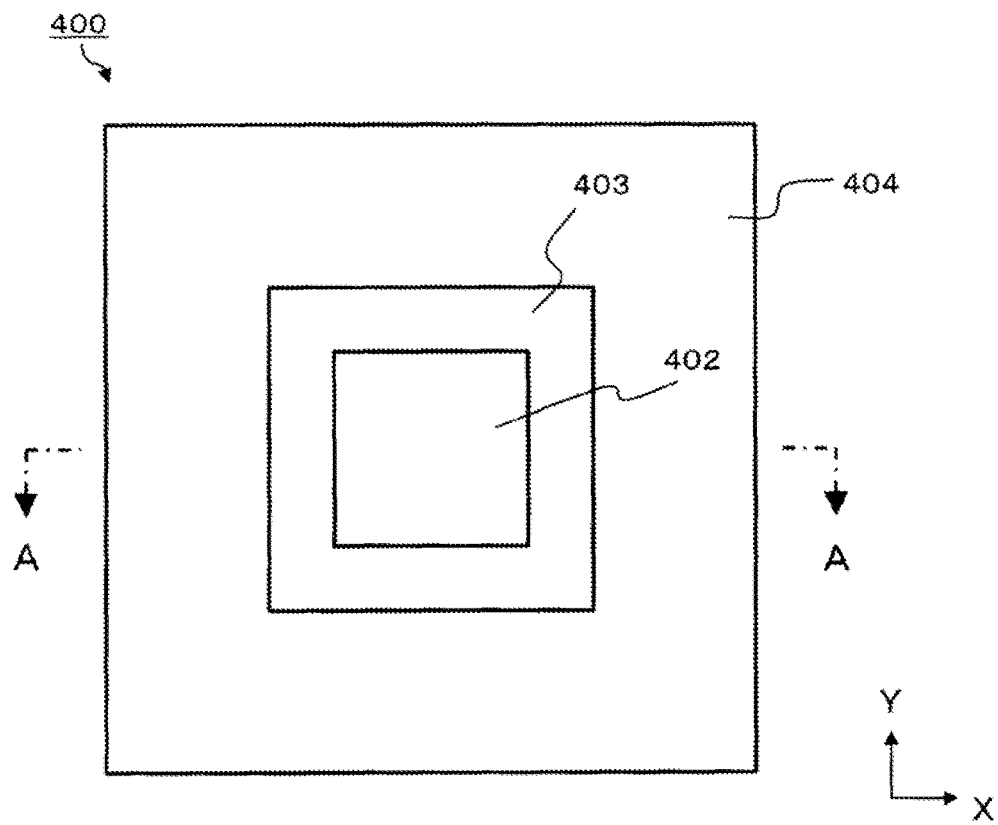
FIGS. 19A and 19B are diagrams illustrating an example of a template for specifying resin thickness according to the present invention.
Figure 19B:
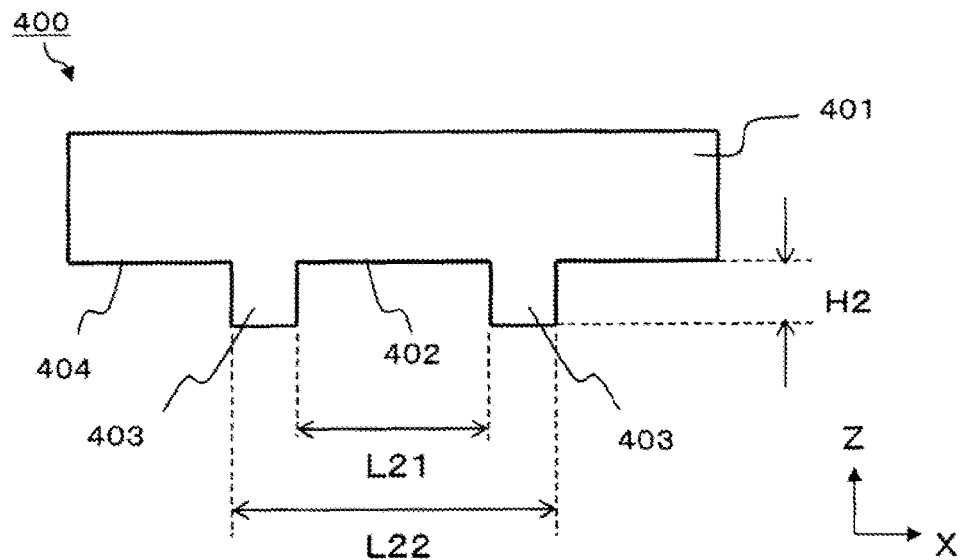

FIGS. 19A and 19B are diagrams illustrating an example of the template for specifying resin thickness according to the present invention. Herein, FIG. 19A illustrates a schematic bottom diagram of the template 400 for thickness regulation of the resin, and FIG. 19B illustrates a cross sectional diagram taken along line A-A in FIG. 19A.

For example, the template 400 for thickness regulation of the resin illustrated in FIGS. 19A and 19B has a concave part 402 on the main surface side (lower side in FIG. 19B) which is in contact with resin, and the concave part 402 is surrounded by a frame-shaped convex part 403 in a planar view. That is, in the template 400 for thickness regulation of the resin, the upper surface of the outer peripheral part of the concave part 402 corresponds to the upper surface of the frame-shaped convex part 403 in a planar view.

More specifically, in a planar view, the concave part 402 of the template 400 for thickness regulation of the resin has a size of enclosing the upper surface of the second step structure 22 of the multistep template substrate 300 with the light shielding material layer and being enclosed in a region surrounded by the outer edge of the upper surface of the first step structure 21 of the multistep template substrate 300 with the light shielding material layer, and the depth of the concave part 402 of the template 400 for thickness regulation of the resin is set to be smaller than the height from the upper surface of the first step structure 21 to the upper surface of the second step structure 22 of the multistep template substrate 300 with the light shielding material layer.

Figure 20:
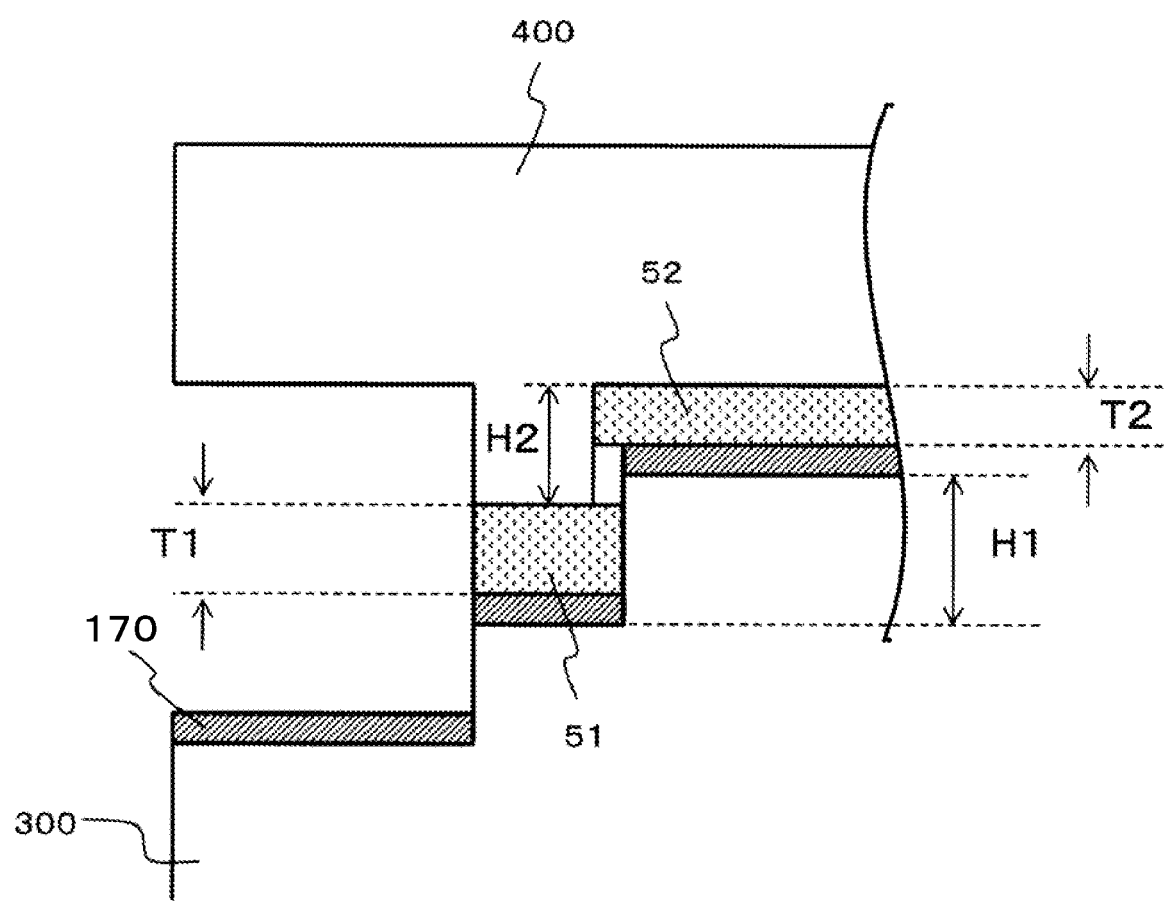
FIG. 20 is a diagram illustrating the function and effect of the template for specifying resin thickness according to the present invention.

FIG. 20 is a diagram illustrating the function and effect of the template for specifying resin thickness according to the present invention. FIG. 20 corresponds to an enlarged diagram of the main parts in FIG. 17C.

For example, as illustrated in FIG. 20, when defining the thicknesses of the first resin layer 51 and the second resin layer 52 by pressing the template 400 for thickness regulation of the resin, in a case where the height (the same as the height from the upper surface of the first step structure 21 to the upper surface of the second step structure 22 of the template substrate 4 for imprinting) from the upper surface of the first step structure 21 to the upper surface of the second step structure 22 of the multistep template substrate 300 with the light shielding material layer is regarded as H1, the depth (the same as the height of the convex part 403 in the template 400 for thickness regulation of the resin illustrated in FIG. 19) of the concave part 402 is regarded as H2, the thickness of the first resin layer 51 to be formed is regarded as T1, and the thickness of the second resin layer 52 to be formed is regarded as T2, by designing so that H2<H1, a relationship of T2<T1 is obtained.

For example, the depth H2 of the concave part 402 may be in a range of 0.3 μm or more and 10 μm or less.

Therefore, if this template 400 for thickness regulation of the resin is used in the step illustrated in FIG. 17C, the thickness of the second resin layer 52 can be formed so as to be smaller than the thickness of the first resin layer 51. In addition, by using the template 400 for thickness regulation of the resin, as illustrated in FIG. 18D, the first resin layer 51 can be formed as a resin layer having a uniform thickness.

As a result, as illustrated in FIG. 18F, on the upper surface of the second step structure 22, the light shielding material layer 170 can be removed without allowing the light shielding material layer 170 to remain, and the light shielding material layer 170 formed on the upper surface of the first step structure 21 which is to be the light shielding film 31 can be a film without a defective part or a thin film part.

Herein, it is preferable that the bottom surface of the concave part 402 of the template 400 for thickness regulation of the resin has a size of enclosing the upper surface (the same as the upper surface of the second step structure 22 of the template substrate 4 for imprinting) of the second step structure 22 of the multistep template substrate 300 with the light shielding material layer.

More specifically, in a case where the width of the bottom surface of the concave part 402 of the template 400 for thickness regulation of the resin illustrated in FIG. 19B is regarded as L21 and the width of the upper surface of the second step structure 22 of the template substrate 4 for imprinting illustrated in FIG. 13 is regarded as L11, it is preferable that a relationship of L21>L11 is satisfied.

This is because the step of pressing the template 400 for thickness regulation of the resin and the step of releasing the template 400 for thickness regulation of the resin from the multistep template substrate 300 with the light shielding material layer become easier.

For example, a bottom surface size of the concave part 402 may be set to be in a range of 10 mm×10 mm or more and 70 mm×70 mm or less.

In addition, it is preferable that the region surrounded by the outer edge of the upper surface of the outer peripheral part of the concave part 402 of the template 400 for thickness regulation of the resin has the same shape and the same area as the region surrounded by the outer edge of the upper surface (the same as the upper surface of the first step structure 21 of the template substrate for imprinting) of the first step structure 21 of the multistep template substrate 300 with the light shielding material layer or has a size of enclosing the region surrounded by the outer edge of the upper surface (the same as the upper surface of the first step structure 21 of the template substrate for imprinting) of the first step structure 21 of the multistep template substrate 300 with the light shielding material layer.

More specifically, in a case where the width of the region surrounded by the outer edge of the upper surface of the convex part 403 of the template 400 for thickness regulation of the resin illustrated in FIG. 19B is regarded as L22 and the width of the region surrounded by the outer edge of the upper surface of the first step structure 21 of the template substrate 4 for imprinting illustrated in FIG. 13 is regarded as L12, it is preferable that a relationship of L22≥L12 is satisfied.

This is because the first resin layer 51 can be formed as a resin layer having a uniform thickness without a defective part to the extent of reaching the outer edge of the upper surface (the same as the upper surface of the first step structure 21 of the template substrate 4 for imprinting) of the first step structure 21 of the multistep template substrate 300 with the light shielding material layer.

In addition, it is preferable that the template 400 for thickness regulation of the resin has a region 404 having the same depth as the concave part 402 on the outer peripheral side of the convex part 403.

For example, as illustrated in FIG. 17C, when pressing the template 400 for thickness regulation of the resin, it is usually difficult to directly measure the position of the height of the concave part 402 in order to bring the bottom surface of the concave part 402 of the template 400 for thickness regulation of the resin and the upper surface of the second step structure 22 of the multistep template substrate 300 with the light shielding material layer uniformly into contact with each other.

This is because, for example, the measurement light is shielded by the convex part 403 and the multistep template substrate 300 with the light shielding material layer.

On the other hand, if the template 400 for thickness regulation of the resin has the region 404 as described above, when pressing the template 400 for thickness regulation of the resin, for example, the measurement light is not shielded by the convex part 403 and the multistep template substrate 300 with the light shielding material, and it is possible to measure the position of the height of the region 404. Therefore, from this measurement result, the position of the height of the concave part 402 can be grasped.

In addition, it is preferable that the template 400 for thickness regulation of the resin has marks for position matching on the main surface side.

This is because, as illustrated in FIG. 17C, when pressing the template 400 for thickness regulation of the resin, the relative positions with respect to the multistep template substrate 300 with the light shielding material layer can be aligned, and thus, the pressing can be performed with good positional accuracy.

Figure 21A:
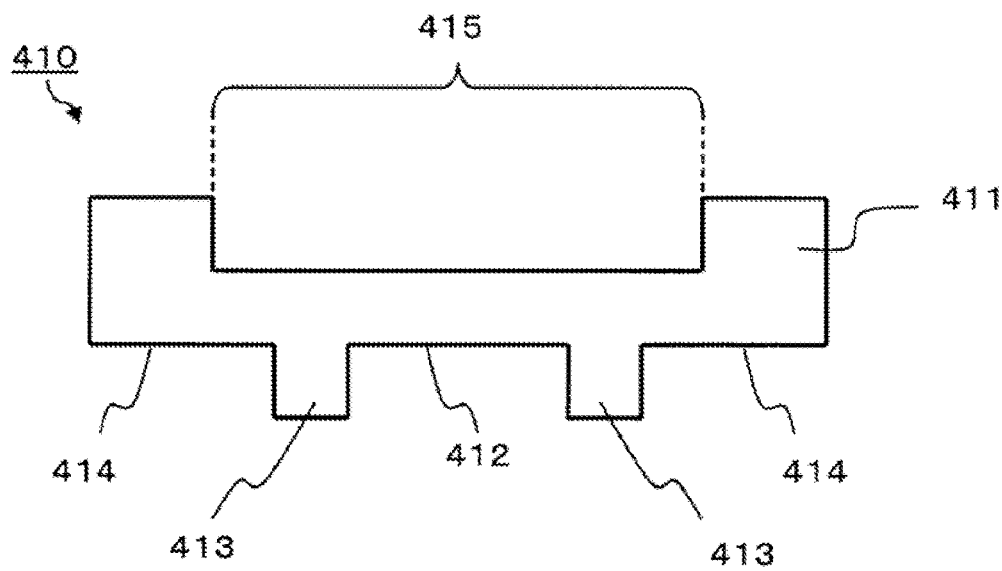
FIGS. 21A and 21B are diagrams illustrating another example of the template for specifying resin thickness according to the present invention.
Figure 21B:

FIGS. 21A and 21B are diagrams illustrating another example of the template for specifying resin thickness according to the present invention.

For example, the template 410 for thickness regulation of the resin illustrated in FIG. 21A has a depression part 415 including the concave part 412 in a planar view on the surface opposite to the main surface side.

With such a configuration, this is because it is possible to facilitate bending by reducing the thickness of the region where the concave part 412 of the template 410 for thickness regulation of the resin is provided, it is possible to further exclude mixing of air bubbles during the pressing, and it is possible to perform partially releasing sequentially from the outer edge part of the concave part 412 during the releasing.

In addition, besides a form in which the concave part 402 is surrounded by the frame-shaped convex part 403 in a planar view as in the template 400 for thickness regulation of the resin illustrated in FIGS. 19A and 19B, the template for specifying resin thickness according to the present invention may be a form in which the outer edge of the upper surface of the outer peripheral part of the concave part 422 reaches the outer edge of the template for specifying resin thickness as in the template 420 for thickness regulation of the resin illustrated in FIG. 21B.

Even with such a configuration, similarly to the template 400 for thickness regulation of the resin illustrated in FIGS. 19A and 19B, this is because the thickness of the second resin layer 52 can be formed so as to be smaller than the thickness of the first resin layer 51. In addition, the first resin layer 51 can also be formed as a resin layer having a uniform thickness.

Furthermore, in addition to such a configuration, as in the template 410 for thickness regulation of the resin illustrated in FIG. 21A, a depression part including the concave part 422 may be provided on the surface opposite to the main surface side in a planar view.

With such a configuration, this is because it is possible to facilitate bending by reducing the thickness of the region where the concave part 422 of the template 420 for thickness regulation of the resin is provided, it is possible to further exclude mixing of air bubbles during the pressing, and it is possible to perform partially releasing sequentially from the outer edge part of the concave part 422 during the releasing.

<Production Method of Multistep Template Substrate with Light Shielding Material Layer>

Next, a production method of the multistep template substrate with the light shielding material layer according to the present invention will be described.

Figure 22:
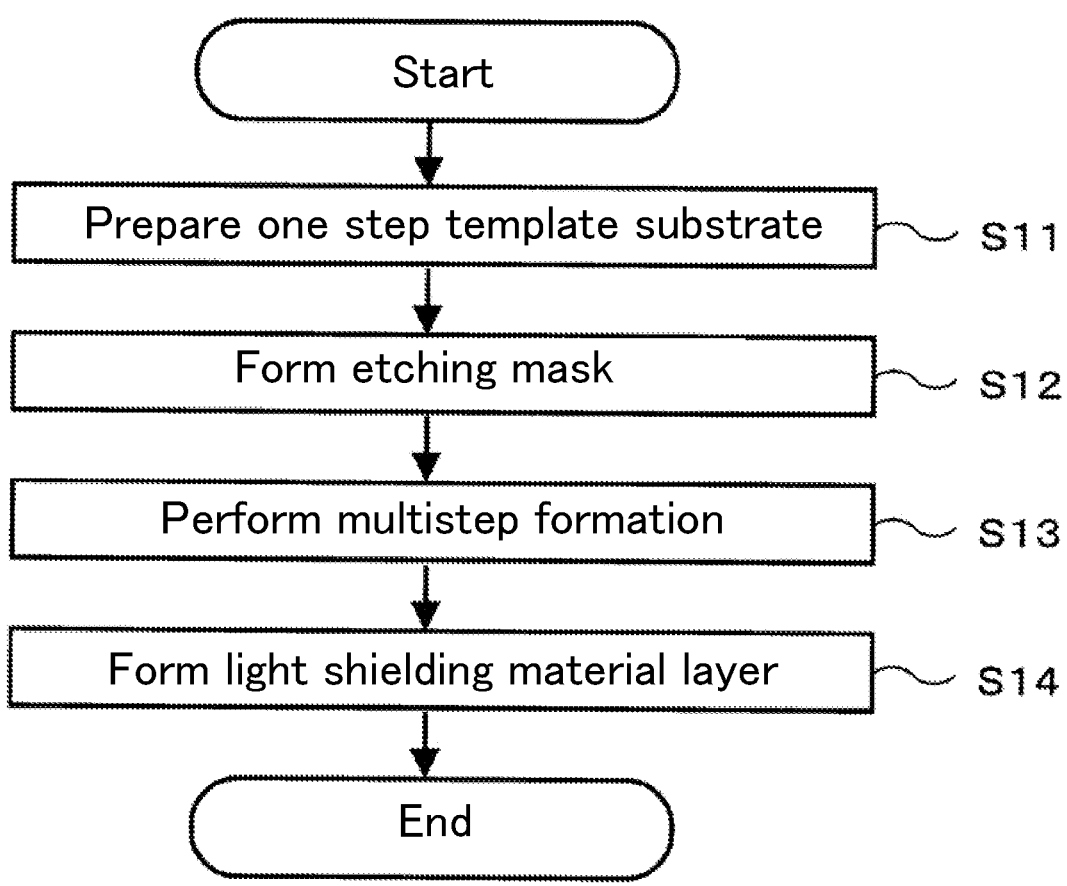
FIG. 22 is a flowchart illustrating an example of a production method of a multistep template substrate with the light shielding material layer according to the present invention.

FIG. 22 is a flowchart illustrating an example of the production method of the multistep template substrate with the light shielding material layer according to the present invention. FIGS. 23A to 23C and 24D to 24E are schematic process diagrams illustrating an example of the production method of the multistep template substrate with the light shielding material layer according to the present invention.

The production method of the multistep template substrate with the light shielding material layer according to the present invention includes, in order, a one step template substrate preparing step (S11 in FIG. 22) of preparing a one step template substrate having a one step structure on a main surface of a base, an etching mask forming step (S12 in FIG. 22) of forming an etching mask in a region which is to be a transfer pattern region of an upper surface of the step structure of the one step template substrate, a multistep forming step (S13 in FIG. 22) of forming a first step structure of the lower step and a second step structure of the upper step by etching the step structure by using the etching mask, and a light shielding material layer forming step (S14 in FIG. 22) of forming a light shielding material layer on an upper surface of the first step structure and on an upper surface of the second step structure.

Hereinafter, the production method will be described in order along with the steps.

(One Step Template Substrate Preparation)

Figure 23A:
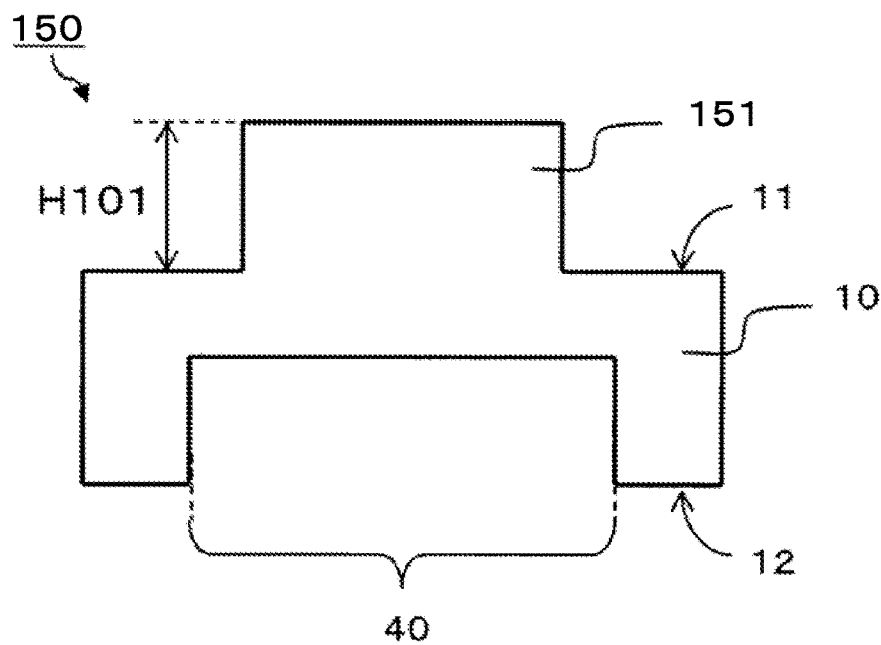
FIGS. 23A to 23C are schematic process diagrams illustrating an example of the production method of the multistep template substrate with the light shielding material layer according to the present invention.

For example, in order to produce the multistep template substrate 300 with the light shielding material layer by this production method, first, a one step template substrate 150 having a one step structure 151 is prepared on the main surface 11 of the base 10 (FIG. 23A).

The material constituting the one step template substrate 150 is a material that can be used for the photo imprinting method and can transmit exposure light during the imprinting.

In general, ultraviolet light having a wavelength in a range of 200 nm to 400 nm (in particular, in a range of 300 nm to 380 nm) is used as the exposure light.

Examples of the above-mentioned material include transparent materials such as quartz glass, heat-resistant glass, calcium fluoride ($CaF_2$), magnesium fluoride ($MgF_2$), and acrylic glass and stacked structures of these transparent materials. In particular, synthetic quartz is suitable because the synthetic quartz has high rigidity, low thermal expansion coefficient, and high transmittance in a range of commonly used wavelength of 300 nm to 380 nm.

In the one step template substrate 150, the height H101 of the step structure 151 is a height which is the same as or similar to the step difference of the template substrate having a one step structure used in the photo imprinting method in the related art and is typically about 30 μm.

In addition, it is preferable that a depression part 40 is provided on the side of the back surface 12 of the base 10 of the one step template substrate 150.

(Etching Mask Formation)

Figure 23B:
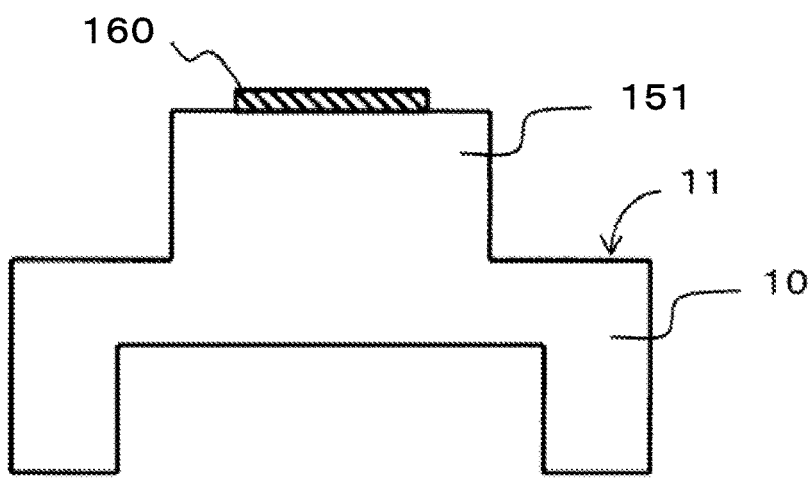

Next, an etching mask 160 is formed in a region which is to be a transfer pattern region on the upper surface of the step structure 151 of the one step template substrate 150 (FIG. 23B).

Incidentally, the above-mentioned "region which is to be a transfer pattern region" denotes a region where the transfer pattern 23 is formed in a template 1 for imprinting finally produced (FIG. 14) through a multistep template substrate 300 with the light shielding material layer produced from the one step template substrate 150. In the template 1 illustrated in FIG. 14, the upper surface of the second step structure 22 corresponds to a transfer pattern region.

As a material constituting the etching mask 160, any material can be used as long as the material serves as an etching mask in dry etching the material constituting the one step template substrate 150 in the following multistep forming step.

For example, a metal material and one containing at least one of oxide, nitride, and oxynitride thereof can be used. Specific examples of the above-mentioned metal material which can be used include chromium (Cr), molybdenum (Mo), tantalum (Ta), tungsten (W), zirconium (Zr), and titanium (Ti).

For example, by forming a chromium (Cr) film having a thickness of 30 nm or more and 200 nm or less by sputtering film formation, applying a photoresist, performing pattering, and after that, etching the chromium (Cr) film exposed from the photoresist, a desired etching mask 160 can be formed.

For etching the chromium (Cr) film, for example, dry etching with a mixed gas of oxygen and chlorine can be used.

(Multistep Formation)

Figure 23C:
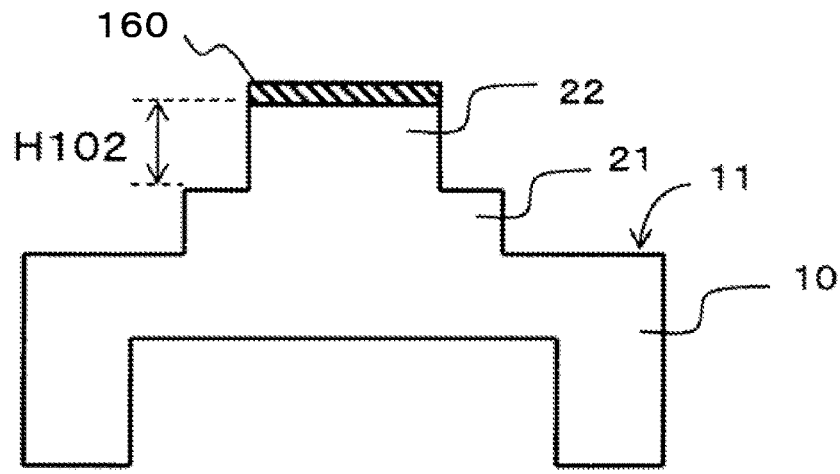
Figure 24D:
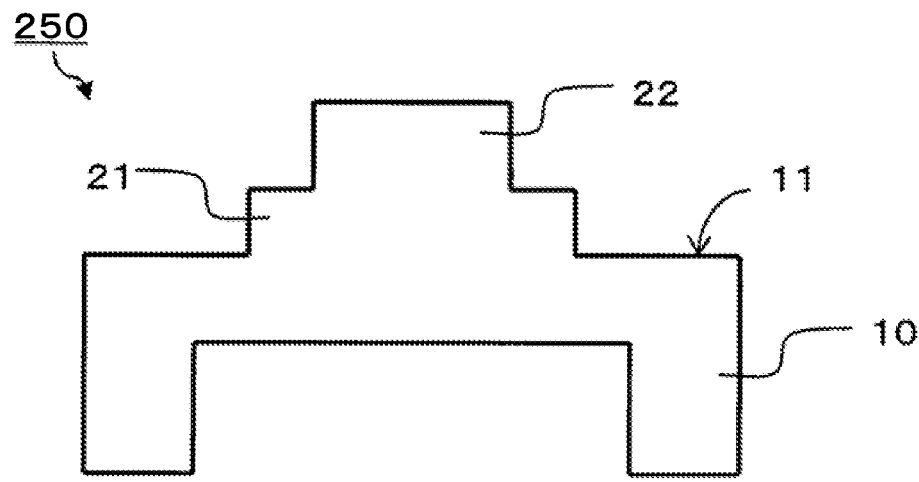
FIGS. 24D and 24E are schematic process diagrams illustrating the example of the production method of the multistep template substrate with the light shielding material layer according to the present invention, following FIG. 23C.

Next, the step structure 151 is etched by using the etching mask 160 as a mask to form the first step structure 21 of the lower step and the second step structure 22 of the upper step (FIG. 23C), and after that, the etching mask 160 is removed (FIG. 24D).

The value of the step difference (H102) of the second step structure 22 illustrated in FIG. 23C is the same as the value of the step difference (H1) of the second step structure 22 of the template substrate 4 illustrated in FIG. 13 and can be set to be in a range of 1 μm or more and 5 μm or less. If the step difference is several μm or less, the step difference can be sufficiently formed in terms of time by dry etching.

Therefore, by using the dry etching, the cross-sectional shape of the part where the second step structure 22 and the upper surface of the first step structure 21 are in contact with each other can be formed at a right angle compared to the case of formation by wet etching.

Herein, the material constituting the one step template substrate 150 is generally synthetic quartz, and dry etching by using a fluorine-based gas can be appropriately used for the etching.

In addition, in the case of using a material containing chromium (Cr), for example, removal of the etching mask 160 can be performed by dry etching by using a mixed gas of oxygen and chlorine.

Alternatively, removal of the etching mask may be performed by wet etching by using an aqueous solution containing ceric ammonium nitrate and perchloric acid.

(Light Shielding Material Layer Formation)

Figure 24E:
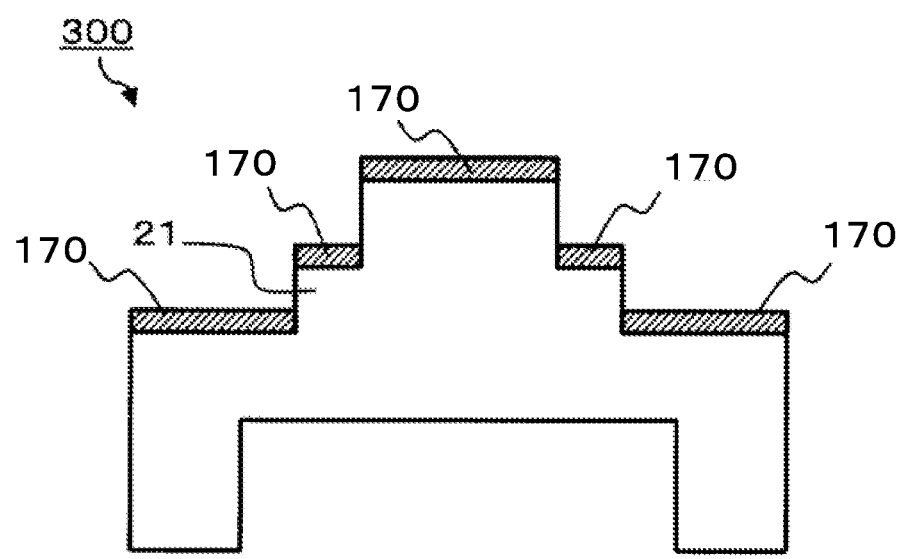

Next, a light shielding material layer 170 is formed on the upper surface of the first step structure 21 and on the upper surface of the second step structure 22 to obtain a multistep template substrate 300 with the light shielding material layer (FIG. 24E).

Incidentally, in the multistep template substrate 300 with the light shielding material layer illustrated in FIG. 24E, the light shielding material layer 170 is also formed on the main surface 11 of the base 10. However, in the production method of the template substrate for imprinting according to the present invention, the light shielding material layer 170 on the main surface 11 is usually removed in the steps of FIGS. 18E to 18F.

As a material constituting the light shielding material layer 170, for example, a material containing at least one of a metal material and oxide, nitride, and oxynitride thereof can be used. Specific examples of the above-mentioned metal material which can be used include chromium (Cr), molybdenum (Mo), tantalum (Ta), tungsten (W), zirconium (Zr), and titanium (Ti).

Herein, in order to prevent irradiation with exposure light, it is preferable that the light shielding material layer 170 has a transmittance of 10% or less at a wavelength of 365 nm.

For example, in a case where chromium (Cr) is used as a material of the light shielding material layer 170, the thickness of the light shielding material layer 170 may be 15 nm or more.

As a method of forming the light shielding material layer 170, sputtering film formation which has been proven in the production of a photomask, for example, can be appropriately exemplified.

<Production Method of Template for Imprinting>

Next, a production method of a template for imprinting according to the present invention will be described.

The production method of a template for imprinting according to the present invention is substantially divided into a first embodiment and a second embodiment. Hereinafter, the first embodiment and the second embodiment will be described.

A. First Embodiment

First, the first embodiment of the production method of a template for imprinting according to the present invention will be described.

As a production method of the template 1 having the first step structure 21 on the main surface of the base 10, having the second step structure 22 on the first step structure 21, having the light shielding film 31 on the upper surface of the first step structure 21, and having the transfer pattern 23 of the concave and convex structure on the upper surface of the second step structure 22 as illustrated in FIG. 14, a method of forming the desired transfer pattern 23 having a concave and convex structure by preparing the template substrate 4 produced by the production method of the template substrate for imprinting and performing the same step on the upper surface of the second step structure 22 as the production method of the template for imprinting in the related art as illustrated in FIG. 13 can be exemplified.

The above-described methods of producing the template for imprinting in the related art include a method of forming resist patterns of the transfer pattern 23, for example, by using an electron beam lithography technique and a method of forming resin patterns of the transfer pattern 23 by using an imprinting technique.

B. Second Embodiment

Next, the second embodiment of the production method of the template for imprinting according to the present invention will be described.

In this production method, by preparing the multistep template 700 with the light shielding material layer in which the transfer pattern of the concave and convex structure has already been formed and performing the same step as the above-described production method of the template substrate for imprinting according to the present invention, for example, as illustrated in FIG. 14, the template 1 having the first step structure 21 on the main surface of the base 10, having the second step structure 22 on the first step structure 21, having the light shielding film 31 on the upper surface of the first step structure 21, and having the transfer pattern 23 of the concave and convex structure on the upper surface of the second step structure 22 is produced.

The above-described multistep template 700 with the light shielding material layer can be produced, for example, by preparing a template having the same configuration as the template in the related art, that is, a one step template 500 having a one step structure on the main surface of the base and having a transfer pattern 23 of a concave and convex structure on the upper surface of the step structure and performing the same steps as the production method of the multistep template substrate with the light shielding material layer according to the present invention (the first embodiment described later).

Hereinafter, first, the production method of the multistep template with the light shielding material layer according to the second embodiment will be described. Next, the method (the production method of the template for imprinting according to the second embodiment) of producing the template for imprinting according to the present invention from the multistep template with the light shielding material layer will be described. In addition, subsequently, the method (the production method of the template for imprinting according to the second embodiment) of producing the template for imprinting having the high contrast film according to the present invention from the multistep template with the light shielding material layer will be described.

Incidentally, in order to avoid complication, the descriptions of matters overlapping with matters described in detail in the production method of the template substrate for imprinting according to the present invention will be omitted as appropriate.

<Production Method of Multistep Template with Light Shielding Material Layer>

The production method of the multistep template with the light shielding material layer according to the second embodiment is substantially divided into the first embodiment and the second embodiment. Hereinafter, the first embodiment and the second embodiment will be described.

a. First Embodiment

Figure 25:
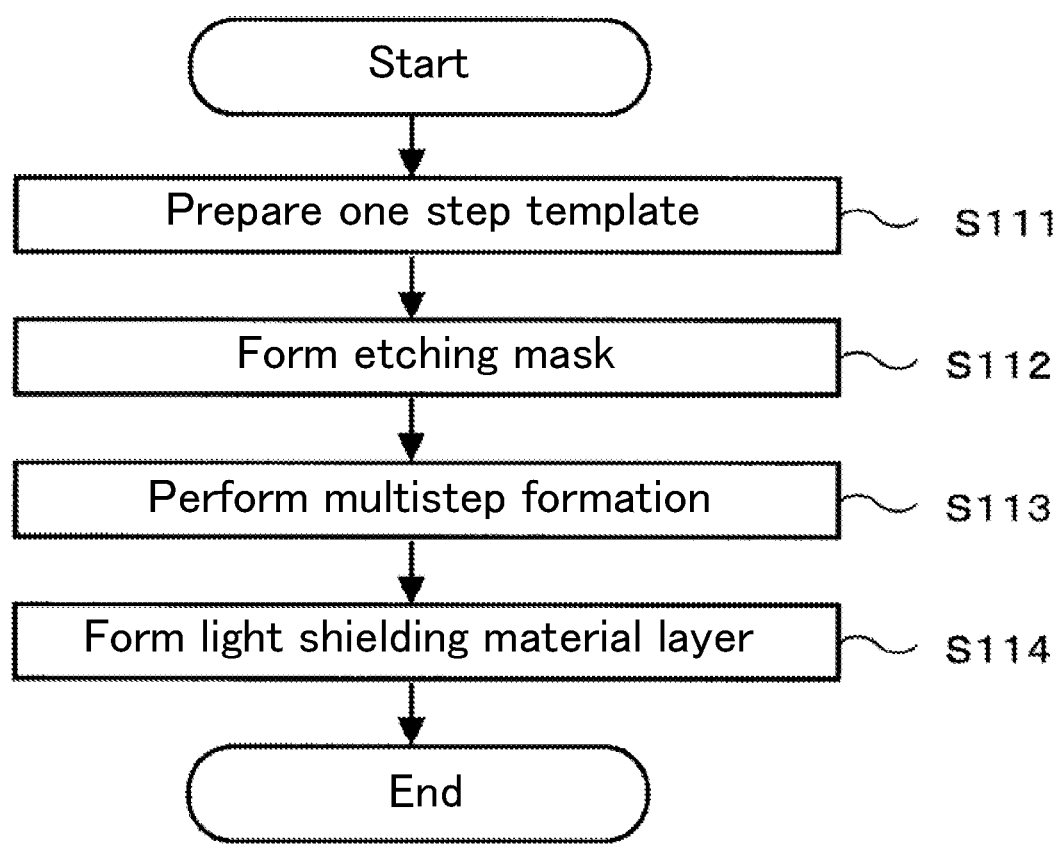
FIG. 25 is a flowchart illustrating an example of a production method of a multistep template with the light shielding material layer according to a first embodiment.

FIG. 25 is a flowchart illustrating an example of the production method of the multistep template with the light shielding material layer according to the first embodiment. In addition, FIGS. 26A to 26C and 27D to 27E are schematic process diagrams illustrating the example of the production method of the multistep template with the light shielding material layer according to the first embodiment.

(One Step Template Preparation)

Figure 26A:
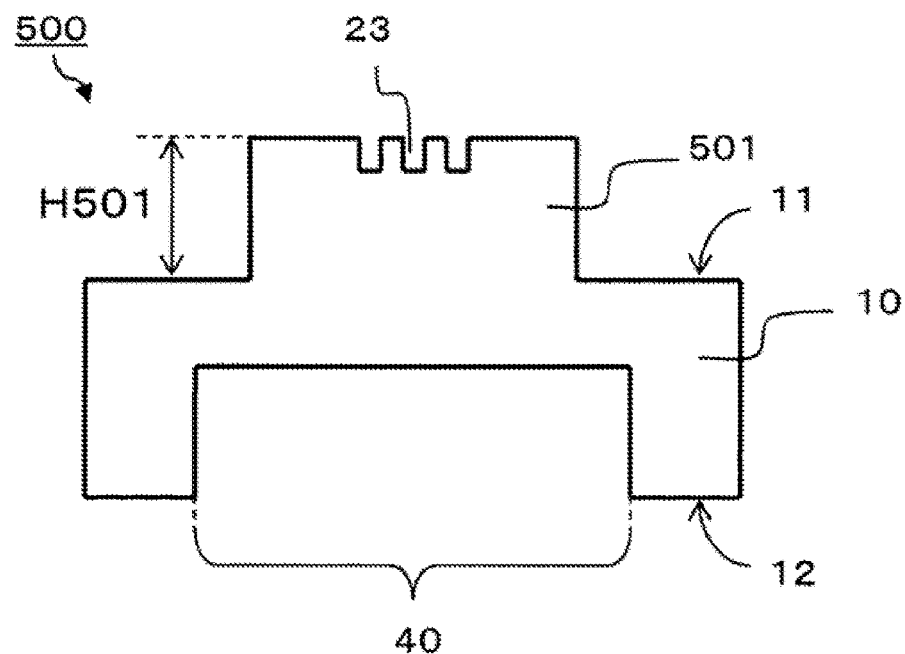
FIGS. 26A to 26C are schematic process diagrams illustrating the example of the production method of the multistep template with the light shielding material layer according to the first embodiment.

For example, in order to produce the multistep template 700 with the light shielding material layer by the production method of this embodiment, first, a one step template 500 having a one step structure 501 on the main surface 11 of the base 10 and having a transfer pattern 23 with a concave and convex structure on the upper surface of the step structure 501 is prepared (S111 in FIG. 25, FIG. 26A).

This one step template 500 is made of the same material as the template for imprinting in the related art.

In addition, the one step template 500 has a configuration similar to that of the template for imprinting in the related art, and for example, the height H501 of the step structure 501 is a height which is the same as or similar to the step difference of the template having a one step structure used in the photo imprinting method in the related art and is typically about 30 µm.

In addition, it is preferable that a depression part 40 is provided on the back surface 12 side of the base 10 of the one step template 500.

However, the upper surface of the step structure 501 of the one step template 500 has an area larger than the upper surface of the second step structure 22 of the finally obtained template 1.

This is because the outer peripheral part of the upper surface of the step structure 501 of the one step template 500 is etched to form the upper surface of the first step structure 21 as described later.

That is, the upper surface of the step structure 501 of the one step template 500 is wider than the transfer pattern region (equal to the upper surface of the second step structure 22 of the template 1) in the template 1, and the transfer pattern 23 formed in the one step template 500 is formed in a region which is to be the transfer pattern region in the template 1.

(Etching Mask Formation)

Figure 26B:
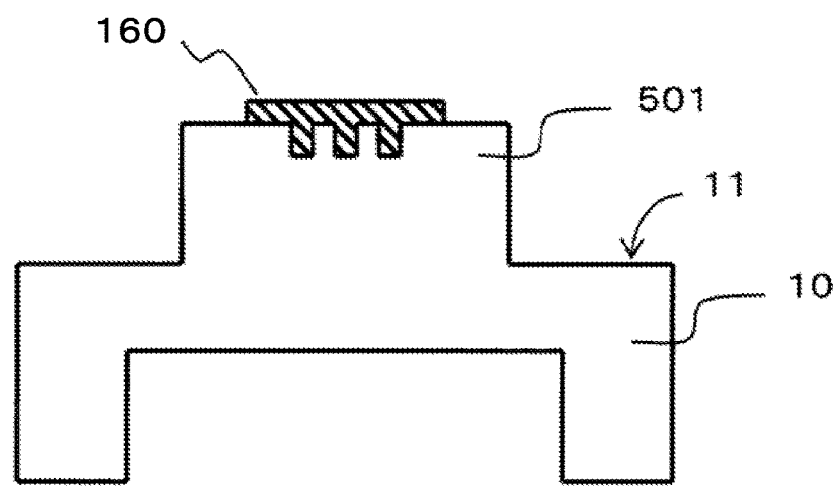

Next, an etching mask 160 is formed in a region which is to be a transfer pattern region on the upper surface of the step structure 501 of the one step template 500 (S112 in FIG. 25, FIG. 26B).

(Multistep Formation)

Figure 26C:
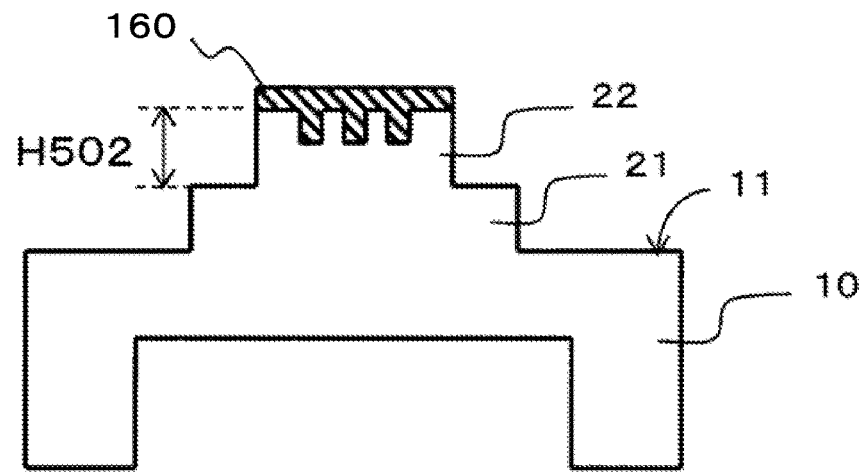
Figure 27D:
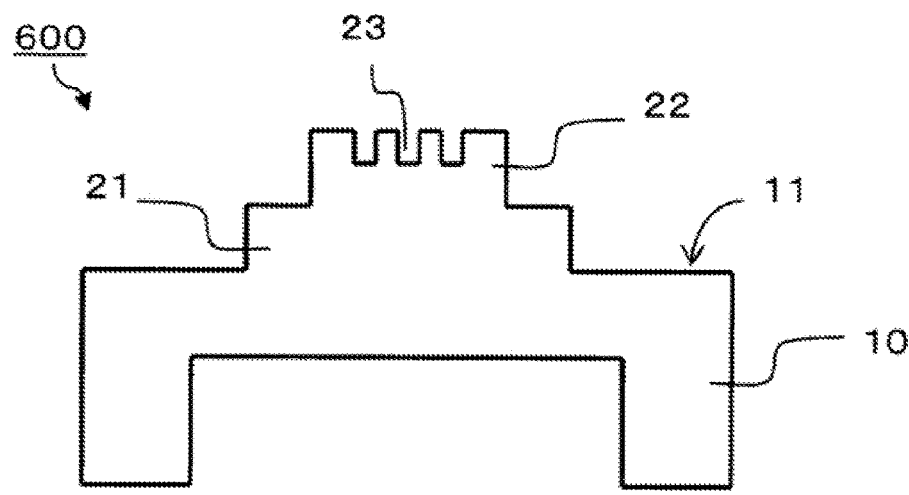
FIGS. 27D and 27E are schematic process diagrams illustrating an example of a production method of a multistep template with the light shielding material layer according to the first embodiment, following FIG. 26C.

Next, the step structure 501 is etched by using the etching mask 160 to form the first step structure 21 of the lower step and the second step structure 22 of the upper step, and after that, the etching mask 160 is removed (S113 in FIG. 25, FIG. 26C, FIG. 27D).

The value of the step difference (H502) of the second step structure 22 illustrated in FIG. 26C is the same as the value of the step difference (H1) of the second step structure 22 of the template 1 illustrated in FIG. 14 and can be set in a range of 1 µm or more and 5 µm or less. If the step difference is several µm or less, the step difference can be sufficiently formed in terms of time by dry etching.

Therefore, by using the dry etching, the cross-sectional shape of the part where the second step structure 22 and the upper surface of the first step structure 21 are in contact with each other can be formed at a right angle compared to the case of formation by wet etching.

(Light Shielding Material Layer Formation)

Figure 27E:
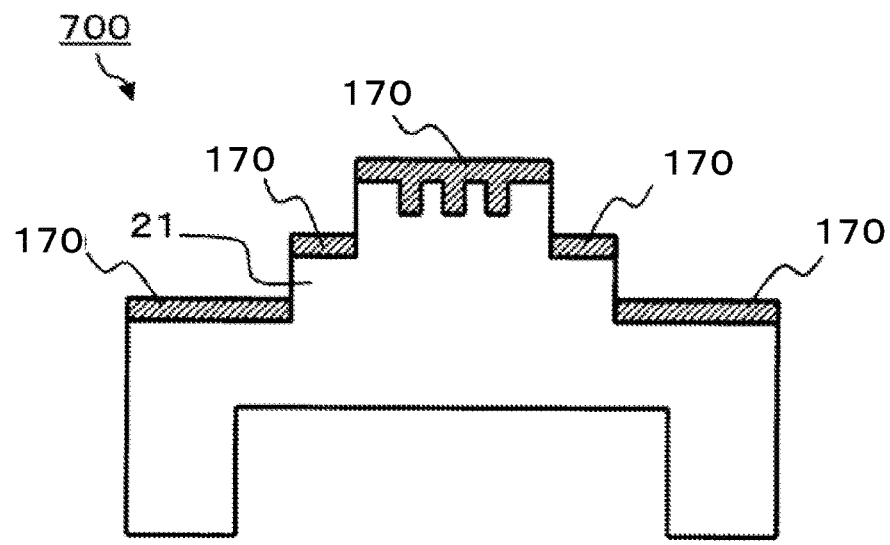

Next, a light shielding material layer 170 is formed on the upper surface of the first step structure 21 and on the upper surface of the second step structure 22 to obtain a multistep template 700 with the light shielding material layer (S114 in FIG. 25, FIG. 27E).

Incidentally, in the multistep template 700 with the light shielding material layer illustrated in FIG. 27E, the light shielding material layer 170 is also formed on the main surface 11 of the base 10, but in the production method of the template for imprinting according to the present invention, the light shielding material layer 170 on the main surface 11 is usually removed.

b. Second Embodiment

Figure 28:
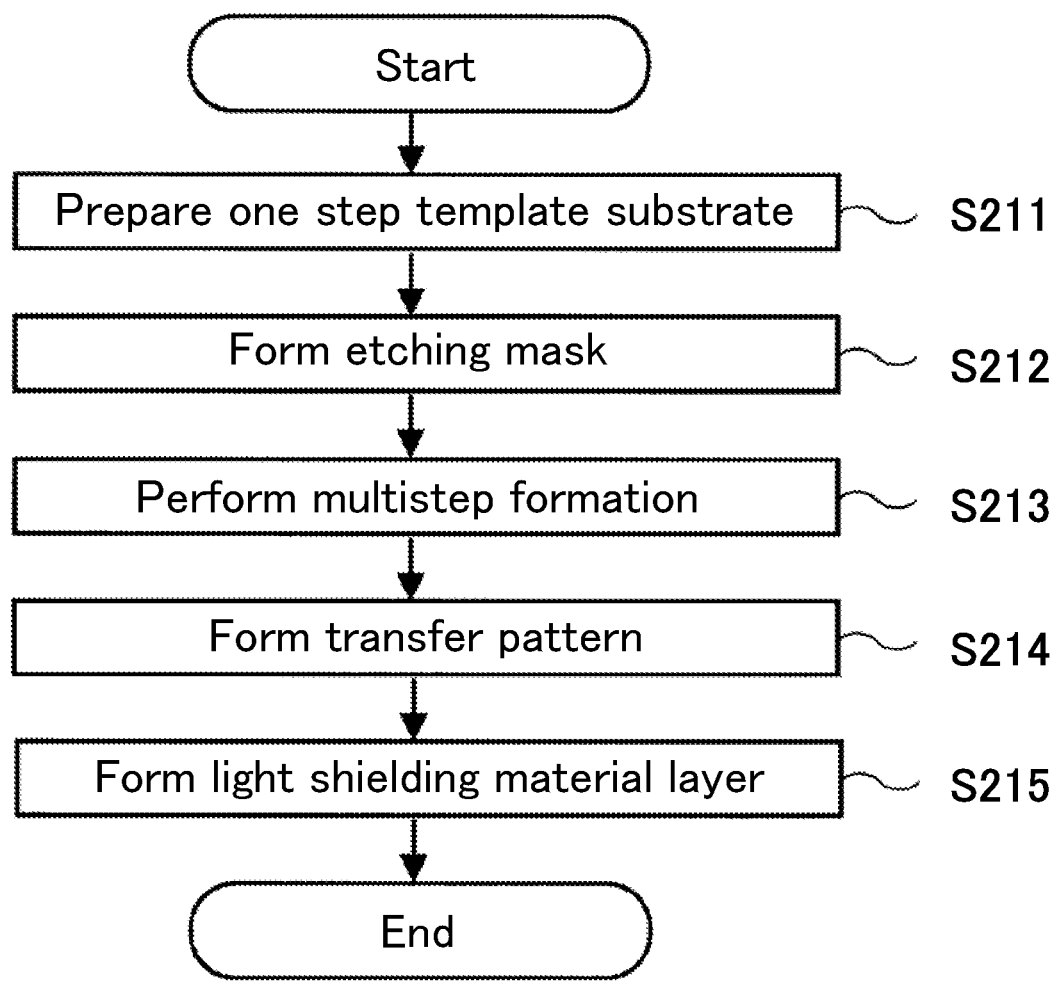
FIG. 28 is a flowchart illustrating another example of a production method of a multistep template with the light shielding material layer according to a second embodiment.

FIG. 28 is a flow chart illustrating another example of the production method of the multistep template with the light shielding material layer according to the second embodiment. In addition, FIGS. 29A to 29C and 30D to 30F are schematic process diagrams illustrating another example of the production method of the multistep template with the light shielding material layer according to the second embodiment.

(One Step Template Substrate Preparation)

Figure 29A:
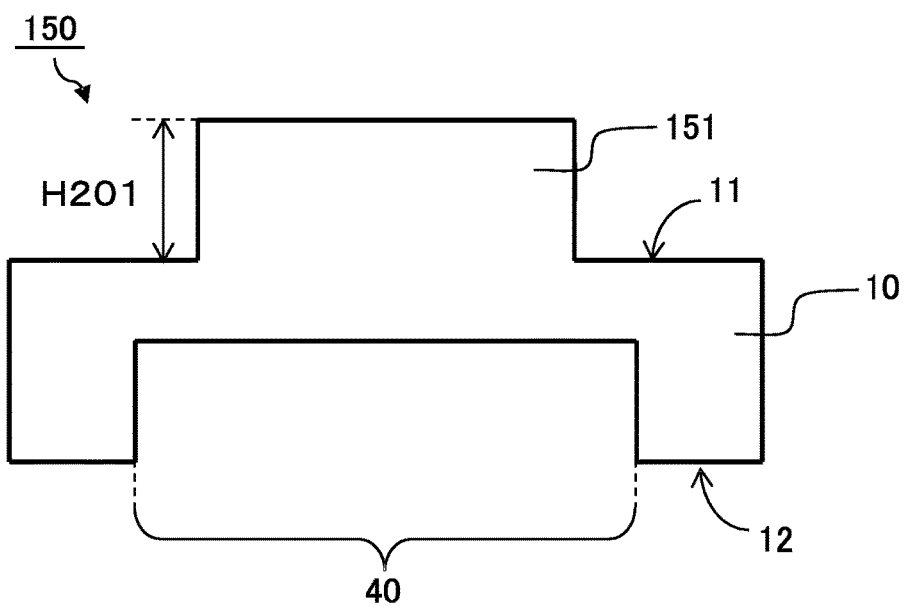
FIGS. 29A to 29C are schematic process diagrams illustrating another example of the production method of the multistep template with the light shielding material layer according to the second embodiment.

For example, in order to produce the multistep template 700 with the light shielding material layer by the production method according to the present embodiment, first, a one step template substrate 150 having a one step structure 151 on the main surface 11 of the base 10 is prepared (S211 in FIG. 28, FIG. 29A).

Since the material constituting the one step template substrate 150 illustrated in FIG. 29A is similar to that of the one step template substrate 150 illustrated in FIG. 23, the description thereof will be omitted herein.

In the one step template substrate 150 illustrated in FIG. 29(*a*), since the height H201 of the step structure 151 is similar to the height H101 of the step structure 151 of the one step template substrate 150 illustrated in FIG. 23, the description thereof will be omitted herein.

In addition, similarly to the one step template substrate 150 illustrated in FIG. 23, it is preferable that a depression part 40 is provided on the back surface 12 side of the base 10 of the one step template substrate 150 illustrated in FIG. 29A.

(Etching Mask Formation)

Figure 29B:
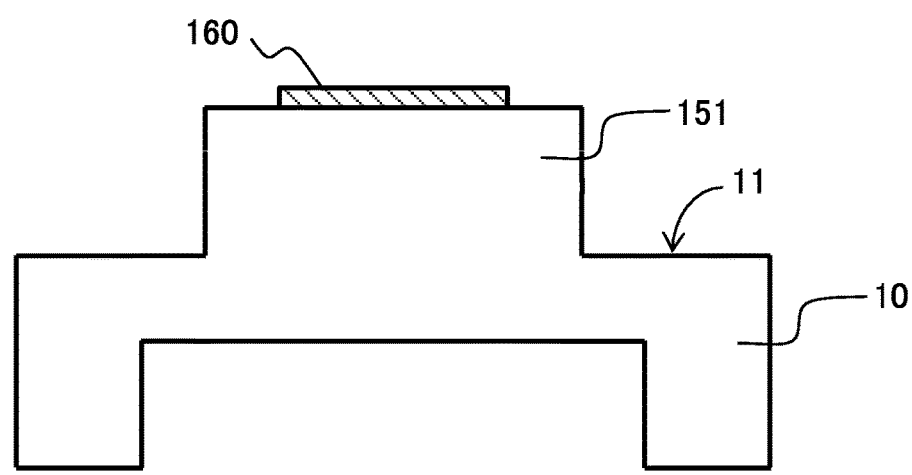

Next, an etching mask 160 is formed in a region which is to be the first concave and convex structure body constituting the transfer pattern on the upper surface of the step structure 151 of the one step template substrate 150 and the second concave and convex structure body constituting the alignment mark (S212 in FIG. 28, FIG. 29B).

Incidentally, the above "a region which is to be the first concave and convex structure body constituting the transfer pattern and the second concave and convex structure body constituting the alignment mark" denotes a region where the first concave and convex structure body 22*a* and the second concave and convex structure body 22*b* are formed in the template 1 for imprinting (FIG. 38L) finally produced through the multistep template 700 (FIG. 30F) with the light shielding material layer produced from the one step template substrate 150.

Since the material constituting the etching mask 160 is similar to the material constituting the etching mask 160 illustrated in FIG. 23B, the description thereof will be omitted herein.

Since the method of forming the etching mask 160 is similar to the method of forming the etching mask 160 illustrated in FIG. 23B, the description thereof will be omitted herein.

(Multistep Formation)

Figure 29C:
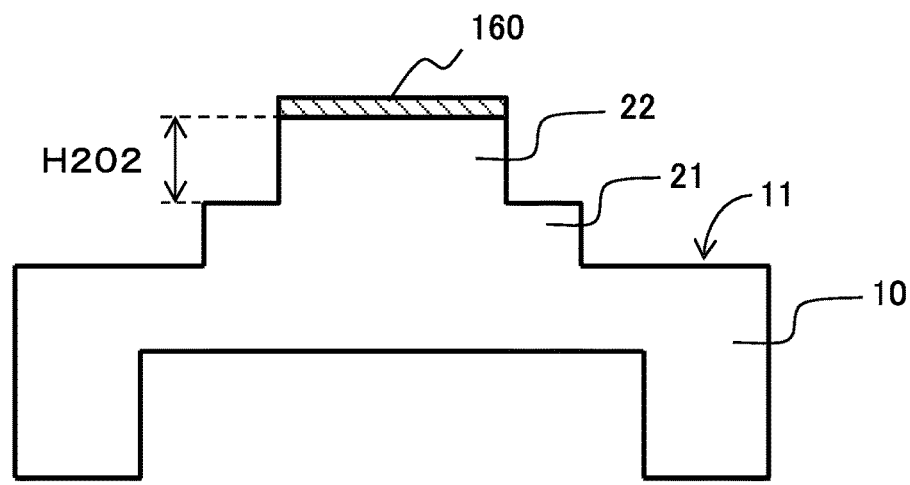
Figure 30D:
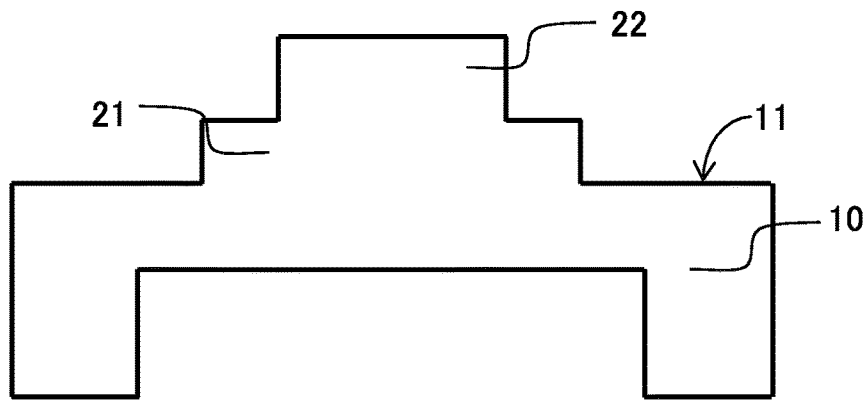
FIGS. 30D to 30F are schematic process diagrams illustrating another example of the production method of the multistep template with the light shielding material layer according to the second embodiment, following FIG. 29C.

Next, the step structure 151 is etched by using the etching mask 160 as a mask to form the first step structure 21 of the lower step and the second step structure 22 of the upper step, and after that, the etching mask 160 is removed (S213 in FIG. 28, FIG. 29C, FIG. 30D).

The value of the step difference (H202) of the second step structure 22 illustrated in FIG. 29(*c*) is the same as the value of the step difference (H1) of the second step structure 22 of the template 1 illustrated in FIG. 14 and can be set in a range of 1 µm or more and 5 µm or less. If the step difference is several µm or less, the step difference can be sufficiently formed in terms of time by dry etching.

Therefore, by using the dry etching, the cross-sectional shape of the part where the second step structure 22 and the upper surface of the first step structure 21 are in contact with each other can be formed at a right angle compared to the case of formation by wet etching.

Herein, similarly to the case of etching the one step structure 151 of the one step template substrate 150 illustrated in FIG. 23B, dry etching by using a fluorine-based gas can be appropriately used for the above etching.

In addition, since the method of removing the etching mask 160 is similar to the method of removing the etching mask 160 illustrated in FIG. 23C, the description thereof will be omitted herein.

(Transfer Pattern Formation)

Figure 30E:
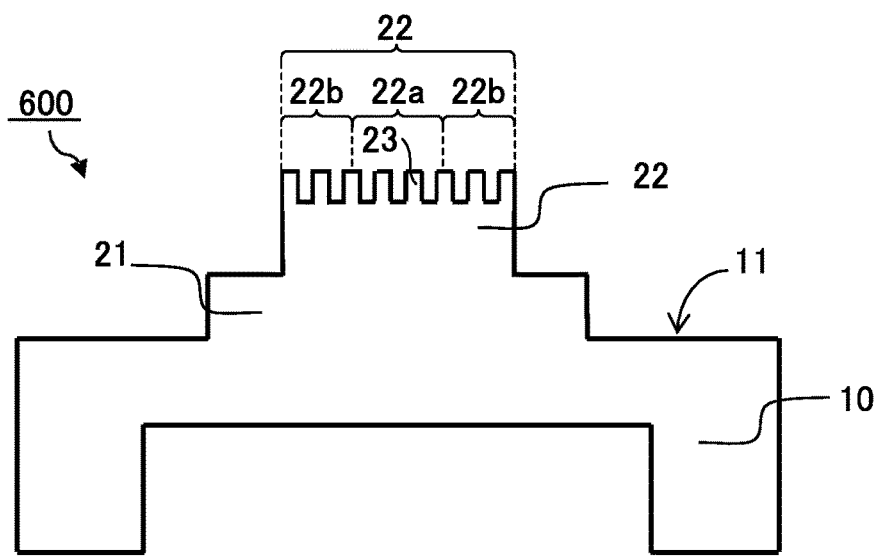

Next, a first concave and convex structure body 22*a* constituting the transfer pattern 23 and a second concave and convex structure body 22*b* constituting the alignment mark are formed on the upper surface of the second step structure 22 to obtain a multistep template 600 (S214 in FIG. 28, FIG. 30E).

As a method of forming the first concave and convex structure body 22*a* and the second concave and convex structure body 22*b*, a method of forming the desired first concave and convex structure body 22*a* and the desired second concave and convex structure body 22*b* by performing the same step as the production method of the template for imprinting in the related art can be exemplified.

The above-described methods of producing the template for imprinting in the related art include a method of forming resist patterns of the first concave and convex structure body 22a and the second concave and convex structure body 22b, for example, by using an electron beam lithography technique and a method of forming resin patterns of the first concave and convex structure body 22a and the second concave and convex structure body 22b by using an imprinting technique.

(Light Shielding Material Layer Formation)

Figure 30F:
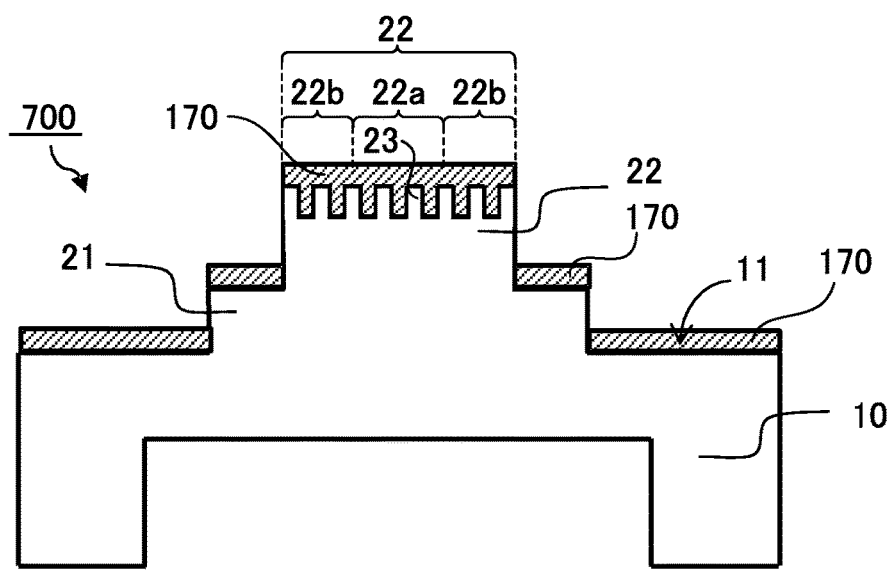

Next, a light shielding material layer 170 is formed on the main surface 11 of the base 10, on the upper surface of the first step structure 21, and on the upper surface of the second step structure 22 to form a multistep template 700 with the light shielding material layer (S215 in FIG. 28, FIG. 30F).

Incidentally, in the multistep template 700 with the light shielding material layer illustrated in FIG. 30F, the light shielding material layer 170 is also formed on the main surface 11 of the base 10. However, in the production method of the template for the imprinting according to the present invention hereinafter, the light shielding material layer 170 on the main surface 11 is usually removed.

Since the material constituting the light shielding material layer 170 is similar to the material constituting the light shielding film 31 in the template 1 illustrated in FIG. 5, the description thereof will be omitted herein. Since the thickness of the light shielding material layer 170 is similar to the thickness constituting the light shielding film 31 in the template 1 illustrated in FIG. 5, the description thereof will be omitted herein.

c. Production Method of Multistep Template with Light Shielding Material Layer According to Second Embodiment As described above, as the production method of the multistep template with the light shielding material layer according to the second embodiment, any one of the first embodiment as illustrated in FIGS. 25, 26A to 26C, and 27D to 27F, and the second embodiment as illustrated in FIGS. 28, 29A to 29C, and 30D to 30F may be employed, but the second embodiment is more preferable than the first embodiment. Unlike in the first embodiment, in the second embodiment, this is because, in the step of forming the transfer pattern after the step of the multistep formation, the formation of the concave and convex structure body on the upper surface of the second step structure 22, which is finer than the multistep formation, is performed, so that the risk of damage and destruction of the concave and convex structure body is reduced.

<Production Method of Template for Imprinting>

Next, a method (a production method of a template for imprinting according to the second embodiment) of producing the template 1 for imprinting according to the present invention from the multistep template 700 with the light shielding material layer obtained above will be described.

Figure 31:
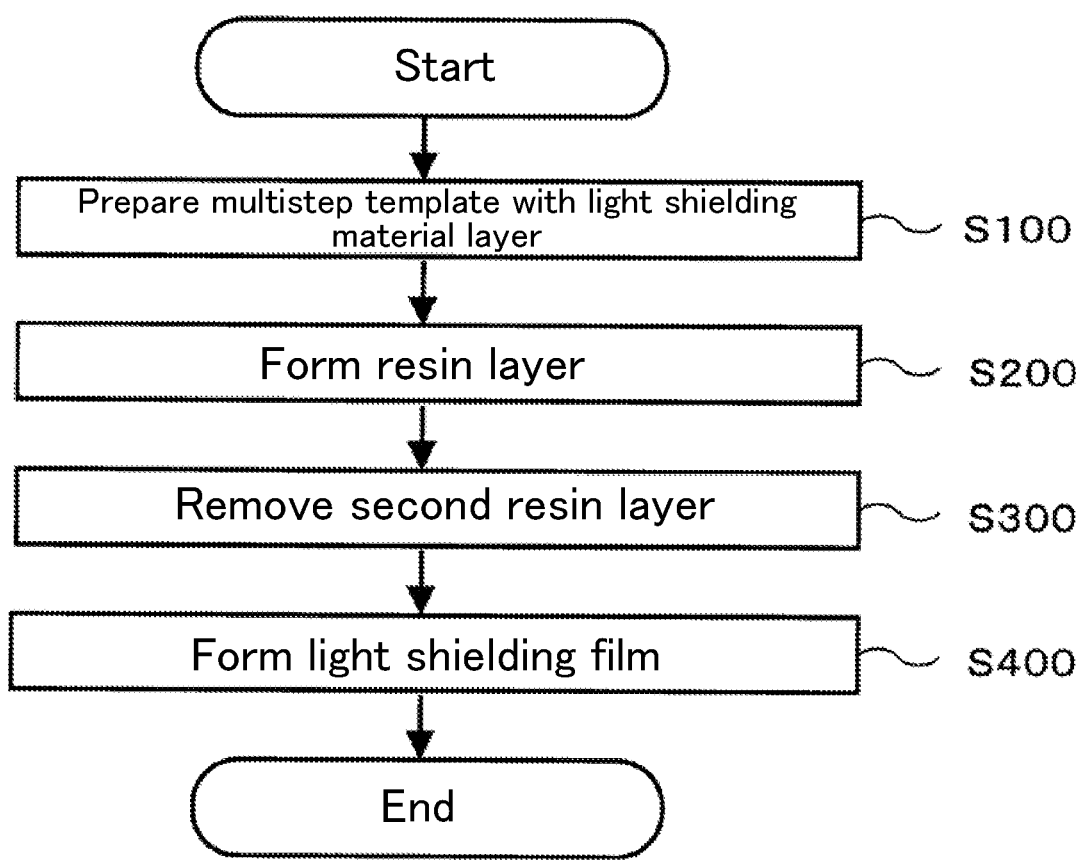
FIG. 31 is a flowchart illustrating an example of a production method of a template according to the second embodiment.

FIG. 31 is a flowchart illustrating an example of the production method of the template according to the second embodiment. FIGS. 32A to 32C and 33D to 33F are schematic process diagrams illustrating the example of the production method of the template according to the second embodiment.

(Multistep Template with Light Shielding Material Layer Preparation)

Figure 32A:
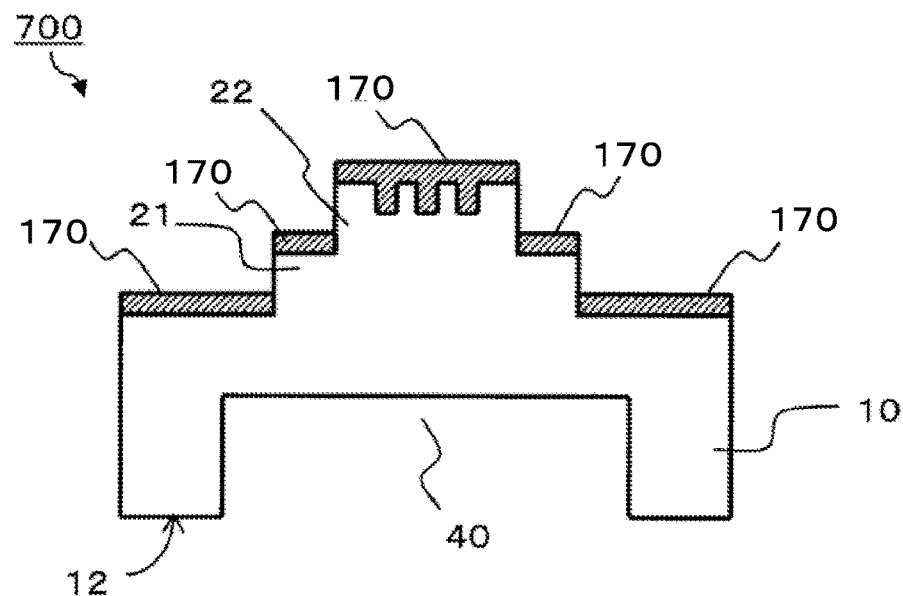
FIGS. 32A to 32C are schematic process diagrams illustrating an example of the production method of the template according to the second embodiment.

For example, in order to produce the template 1 according to this production method, first, a multistep template 700 with a light shielding material layer having a first step structure 21 and a second step structure 22, having a transfer pattern 23 of a concave and convex structure on an upper surface of the second step structure 22, and having the light shielding material layer 170 on an upper surface of the first step structure 21 and on the upper surface of the second step structure 22 is prepared (S100 in FIG. 31, FIG. 32A).

In the multistep template 700 with the light shielding material layer, the combined height of the first step structure 21 and the second step structure 22 is a height which is the same as or similar to the step difference of the template substrate having a one step structure used in the photo imprinting method in the related art and is typically about 30 µm. In addition, it is preferable that a depression part 40 is provided on the back surface 12 side of the base 10.

The multistep template 700 with the light shielding material layer can be produced, for example, by the method (FIGS. 25 to 27E) of producing the multistep template with the light shielding material layer according to the first embodiment.

(Resin Layer Formation)

Figure 32B:
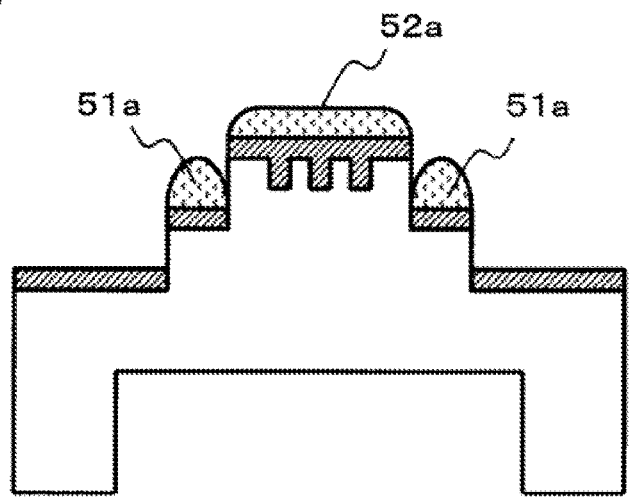
Figure 32C:
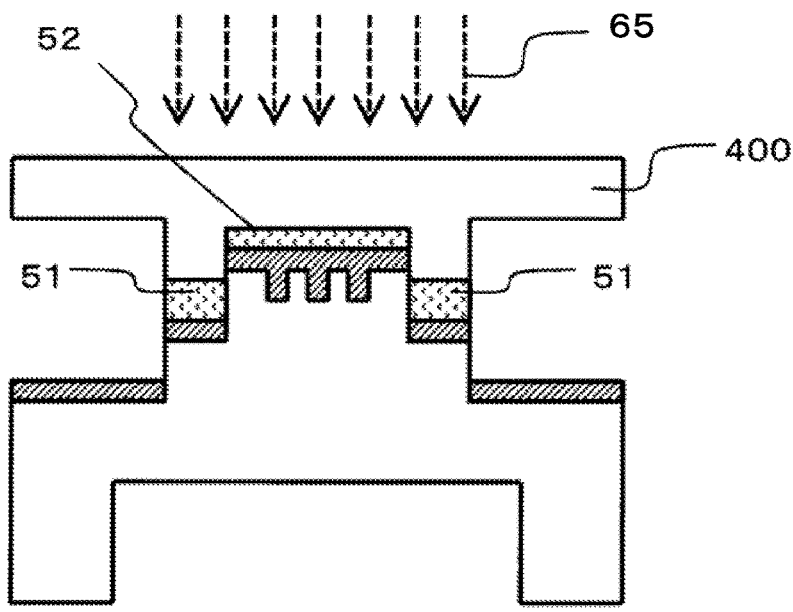
Figure 33D:
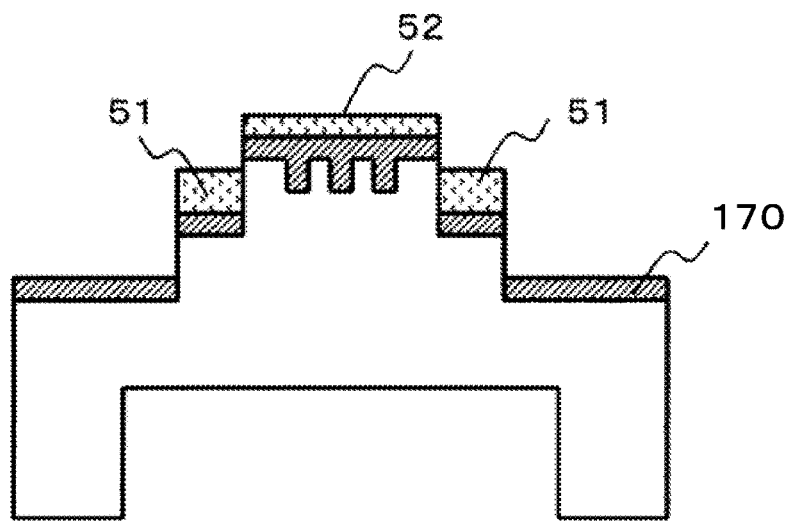
FIGS. 33D to 33F are schematic process diagrams illustrating the example of the production method of the template according to the second embodiment, following FIG. 32C.

Next, as illustrated in FIG. 32B, by dropping the first resin 51a onto the light shielding material layer 170 formed on the upper surface of the first step structure 21, dropping the second resin 52a onto the light shielding material layer 170 formed on the upper surface of the second step structure 22, after that, as illustrated in FIG. 32C, pressing the template 400 for thickness regulation of the resin to define the thickness of each resin, curing the first resin 51a and the second resin 52a in this state, and after that, releasing the template 400 for thickness regulation of the resin, as illustrated in FIG. 33D, the first resin layer 51 and the second resin layer 52, each having a defined thickness, are obtained (S200 in FIG. 31).

The thickness of the second resin layer 52 can be formed to be smaller than the thickness of the first resin layer 51 by using the template 400 for thickness regulation of the resin having a predetermined form.

In addition, by using the template 400 for thickness regulation of the resin, the first resin layer 51 can be formed as a resin layer having a uniform thickness.

(Second Resin Layer Removal)

Figure 33E:
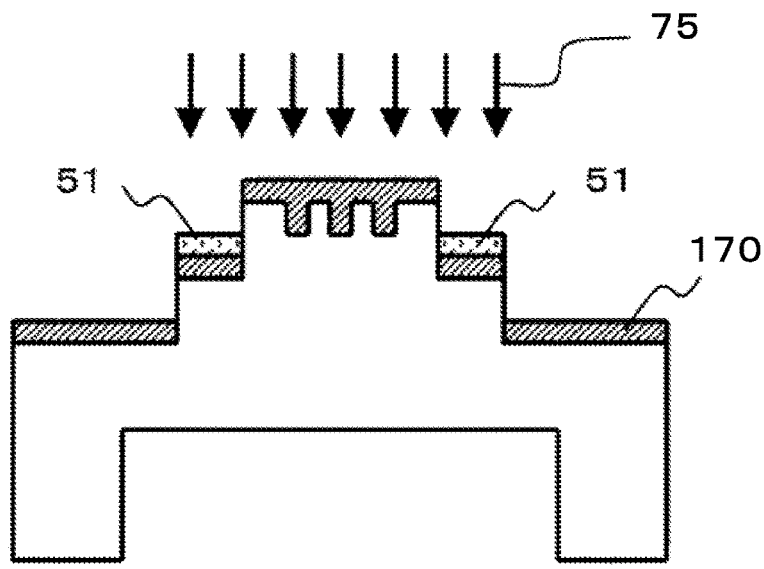

Next, as illustrated in FIG. 33E, the second resin layer 52 is removed while allowing the first resin layer 51 to remain by dry etching (etch-back) by using the etching gas 75.

As described above, since the thickness of the second resin layer 52 is smaller than the thickness of the first resin layer 51, by the etch-back method, the second resin layer 52 can be removed while allowing the first resin layer 51 to remain.

(Light Shielding Film Formation)

Next, by etching the light shielding material layer 170 exposed from the first resin layer 51 by using the remaining first resin layer 51 as a mask, the light shielding material layer 170 formed on the upper surface of the second step structure 22 is removed while allowing the light shielding material layer 170 formed on the upper surface of the first step structure 21 to remain, which is to be a light shielding film 31.

Figure 33F:
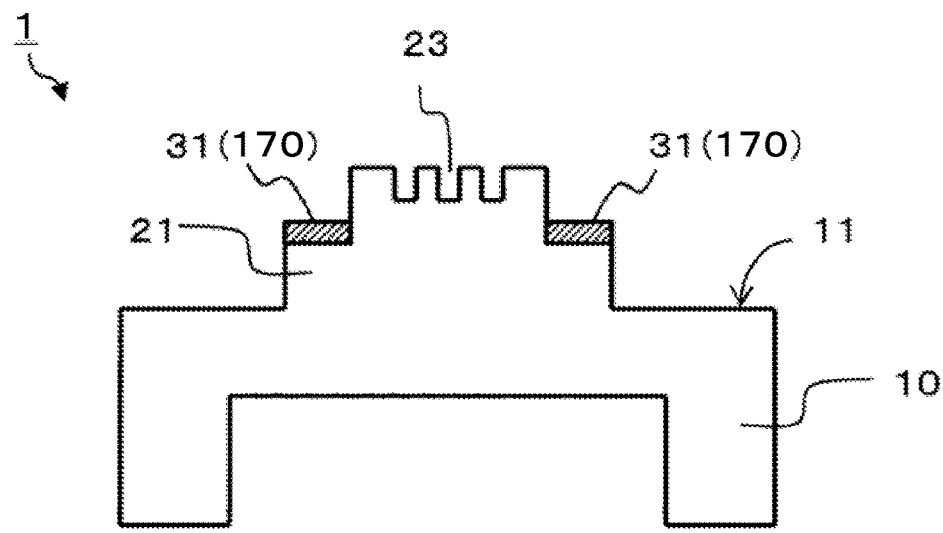

After that, by removing the remaining first resin layer 51, as illustrated in FIG. 33F, the template 1 having the first step structure 21 on the main surface 11 of the base 10, having the second step structure 22 on the first step structure 21, having the transfer pattern 23 of the concave and convex structure on the upper surface of the second step structure 22, and having the light shielding film 31 on the upper surface of the first step structure 21 can be obtained.

<Production Method of Template for Imprinting Having High Contrast Film>

Next, a production method (production method of a template for imprinting according to the second embodiment) of the template 1 for imprinting having a high contrast film according to the present invention from the multistep template 700 with the light shielding material layer obtained above will be described.

Figure 34:
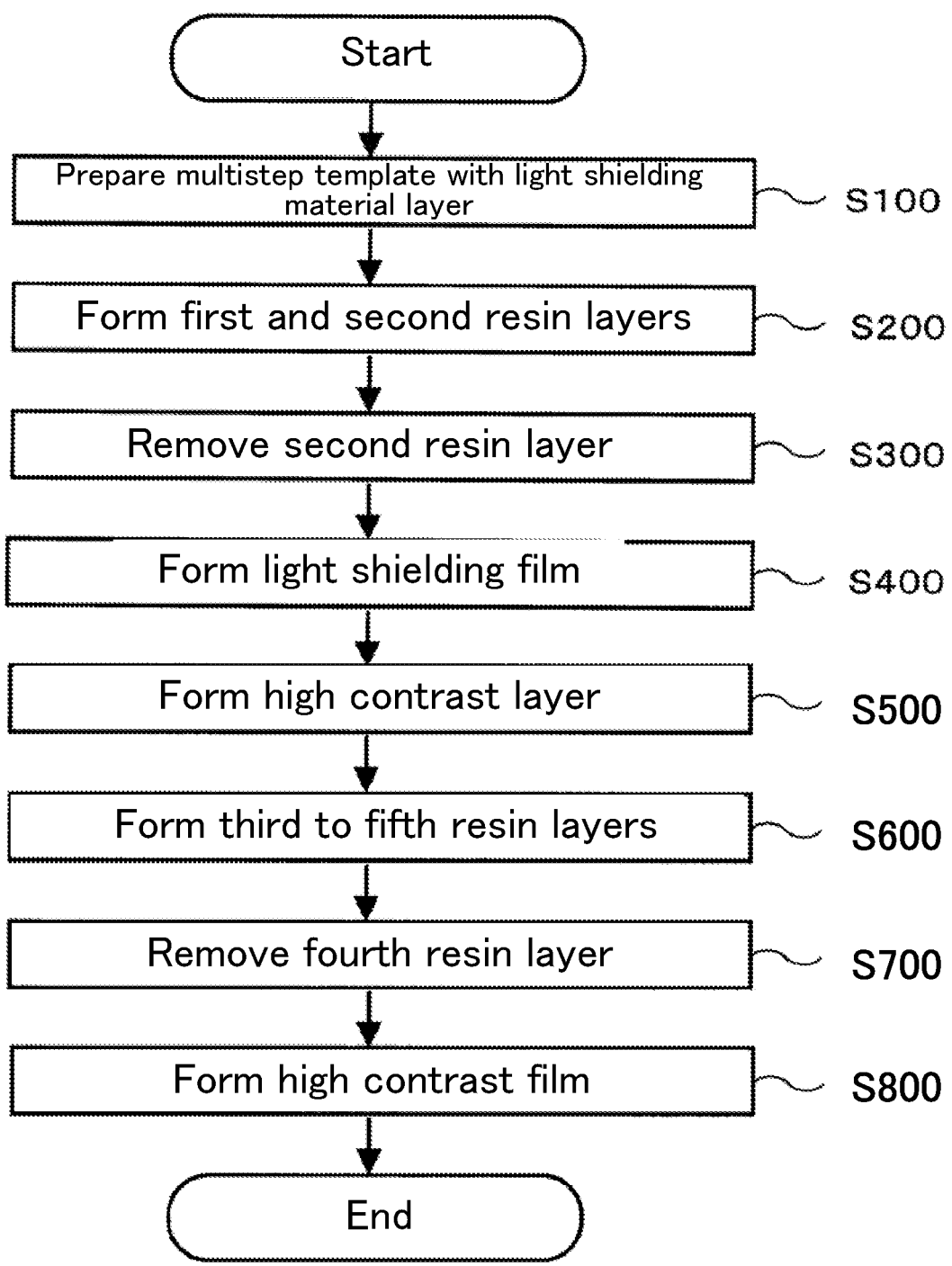
FIG. 34 is a flowchart illustrating another example of the production method of the template according to the second embodiment.

FIG. 34 is a flowchart illustrating another example of the production method of the template according to the second embodiment. In addition, FIGS. 35A to 35C, 36D to 36F, 37G to 37I, and 38J to 38L are schematic process diagrams illustrating another example of the production method of the template according to the second embodiment.

(Multistep Template with Light Shielding Material Layer Preparation)

Figure 35A:
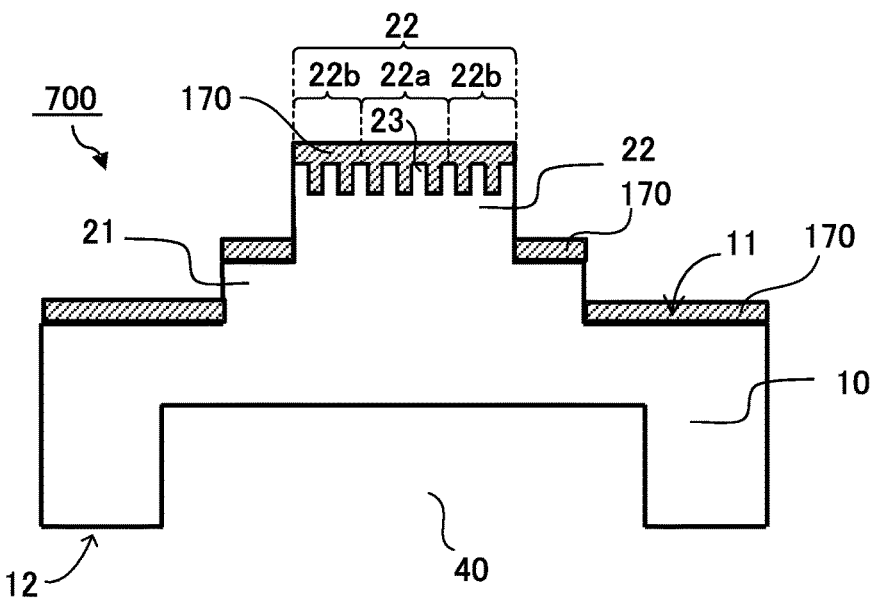
FIGS. 35A to 35C are schematic process diagrams illustrating another example of the production method of the template according to the second embodiment.

For example, in order to produce the template 1 by this production method, first, a multistep template 700 with a light shielding material layer having a first step structure 21 and a second step structure 22, having a first concave and convex structure body 22a constituting a transfer pattern 23 and a second concave and convex structure body 22b constituting an alignment mark on an upper surface of the second step structure 22, and having a light shielding material layer 170 on an upper surface of the first step structure 21 and on the upper surface of the second step structure 22, is prepared (S100 in FIG. 34, FIG. 35A).

In the multistep template 700 with the light shielding material layer, the combined height of the first step structure 21 and the second step structure 22 is a height which is the same as or similar to the step difference of the template substrate having a one step structure used in the photo imprinting method in the related art and is typically about 30 μm. In addition, it is preferable that a depression part 40 is provided on the back surface 12 side of the base 10.

The multistep template 700 with the light shielding material layer can be produced by, for example, the production method of the multistep template with the light shielding material layer according to the second embodiment (FIGS. 28 to 30F).

(Formation of First and Second Resin Layers)

Figure 35B:
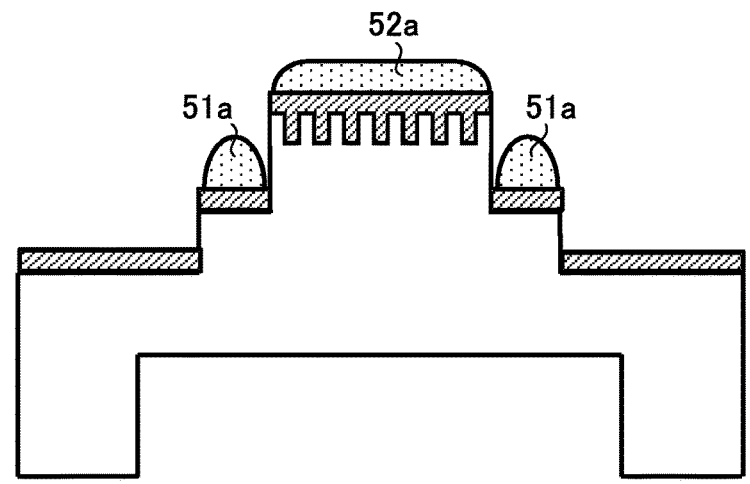
Figure 35C:
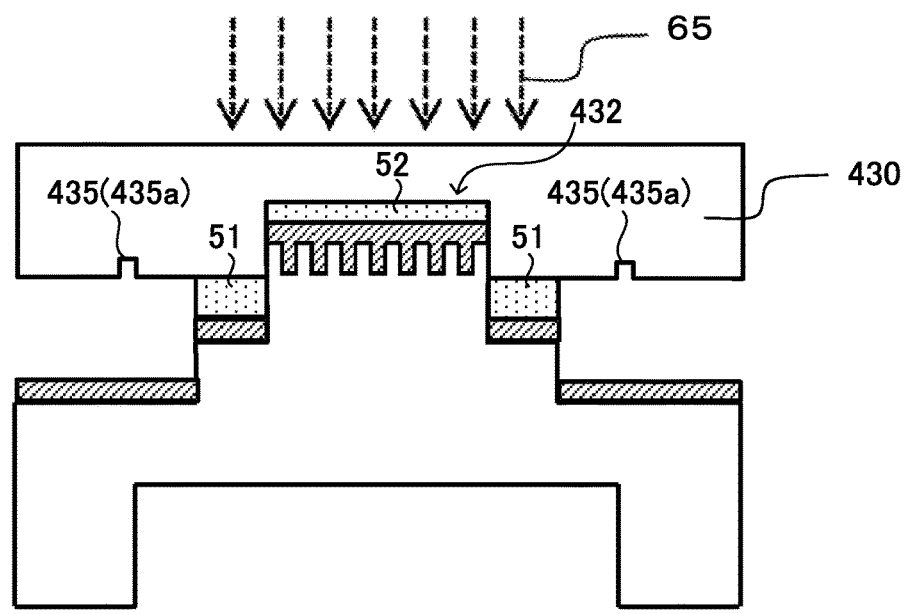
Figure 36D:
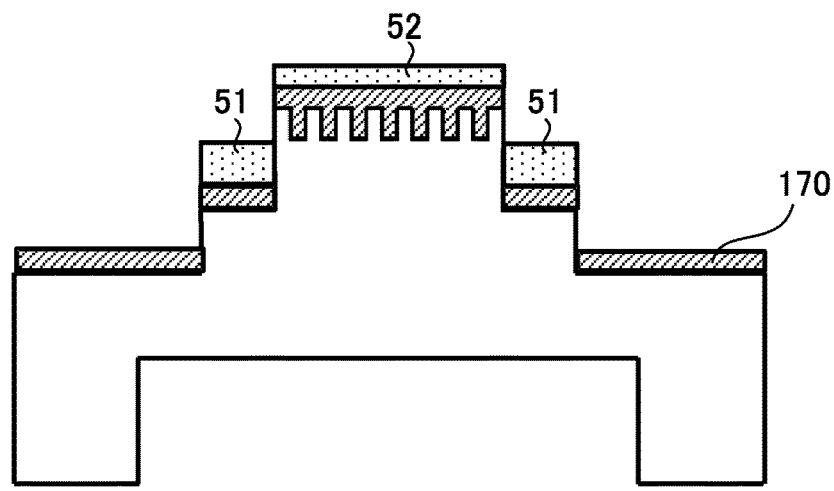
FIGS. 36D to 36F are schematic process diagrams illustrating another example of the production method of the template according to the second embodiment, following FIG. 35C.

Next, as illustrated in FIG. 35B, by dropping the first resin 51a onto the light shielding material layer 170 formed on the upper surface of the first step structure 21, dropping the second resin 52a onto the light shielding material layer 170 formed on the upper surface of the second step structure 22, after that, as illustrated in FIG. 35C, pressing the template 430 for thickness regulation of the first and second resins to define the thickness of each resin, curing the first resin 51a and the second resin 52a in this state, and after that, releasing the template 430 for thickness regulation of the first and second resins, as illustrated in FIG. 36D, the first resin layer 51 and the second resin layer 52, each having a defined thickness, are obtained (S200 in FIG. 34).

By using the template 430 for thickness regulation of the first and second resins having predetermined shapes, the thickness of the second resin layer 52 can be formed so as to be smaller than the thickness of the first resin layer 51. More specifically, as a form of the template 430 for thickness regulation of first and second resins, for example, similarly to the form of the template 400 for thickness regulation of the resin, a form in which the depth of the concave part 432 on the main surface side which is in contact with the resin is smaller than the height (the same as the height from the upper surface of the first step structure 21 of the template 1 for imprinting to the upper surface of the second step structure 22 described later) from the upper surface of the first step structure 21 to the upper surface of the second step structure 22 of the multistep template 700 with the light shielding material layer can be exemplified.

In addition, by using the template 430 for thickness regulation of the first and second resins, similarly to the case of using the template 400 for thickness regulation of the resin as described above, the first resin layer 51 can be formed as a resin layer having a uniform thickness.

(Second Resin Layer Removal)

Figure 36E:
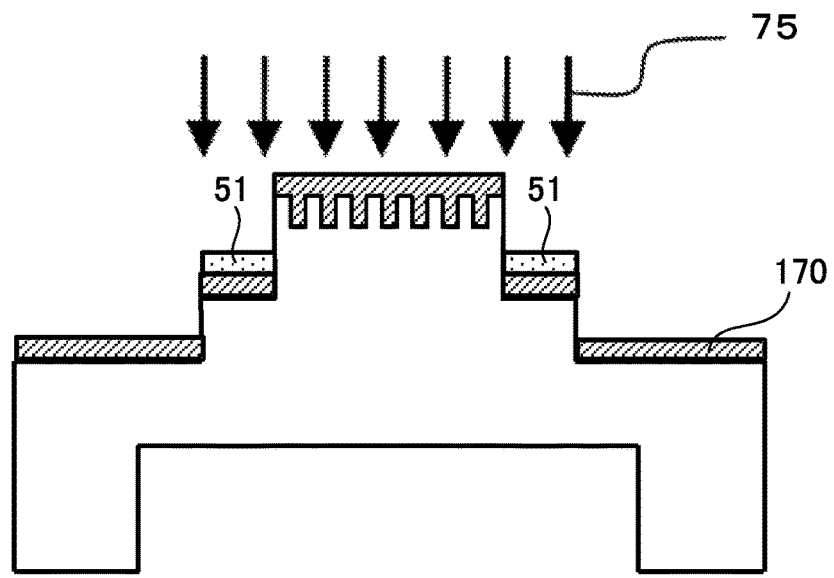

Next, as illustrated in FIG. 36E, by dry etching (etch-back) by using the etching gas 75, the second resin layer 52 is removed while allowing the first resin layer 51 to remain (S300 in FIG. 34).

As described above, since the thickness of the second resin layer 52 is smaller than the thickness of the first resin layer 51, by the etch-back method, the second resin layer 52 can be removed while allowing the first resin layer 51 to remain.

(Light Shielding Film Formation)

Next, by using the remaining first resin layer 51 as a mask, the light shielding material layer 170 exposed from the first resin layer 51 is etched, so that while allowing the light shielding material layer 170 formed on the upper surface of the first step structure 21 which is to be the light shielding film 31 to remain, the light shielding material layer 170 formed on the main surface 11 of the base 10 and on the upper surface of the second step structure 22 is removed.

Figure 36F:
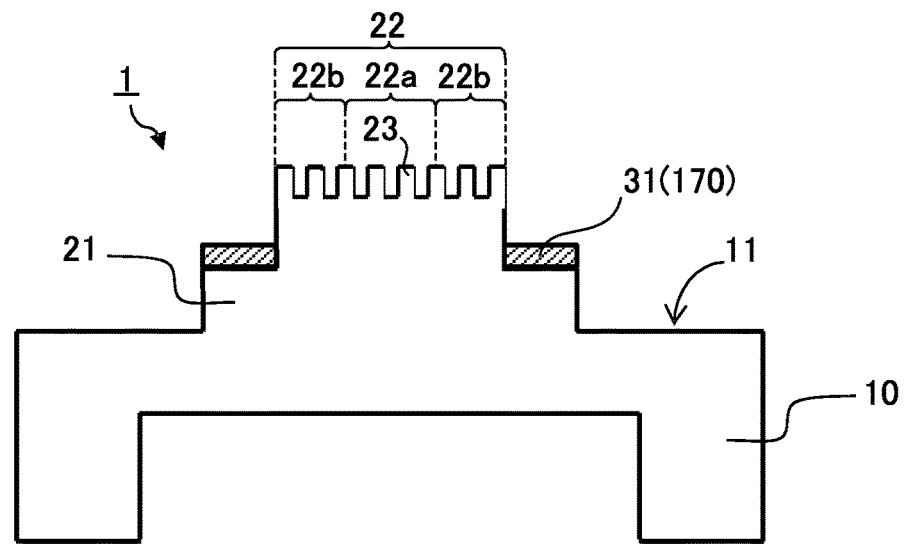

After that, by removing the remaining first resin layer 51, as illustrated in FIG. 36F, the template 1 having the first step structure 21 on the main surface 11 of the base 10, having the second step structure 22 on the first step structure 21, having the first concave and convex structure body 22a constituting the transfer pattern 23 and the second concave and convex structure body 22b constituting the alignment mark on the upper surface of the second step structure 22, and having the light shielding film 31 on the upper surface of the first step structure 21 can be obtained (S400 in FIG. 34).

(High Contrast Layer Formation)

Figure 37G:
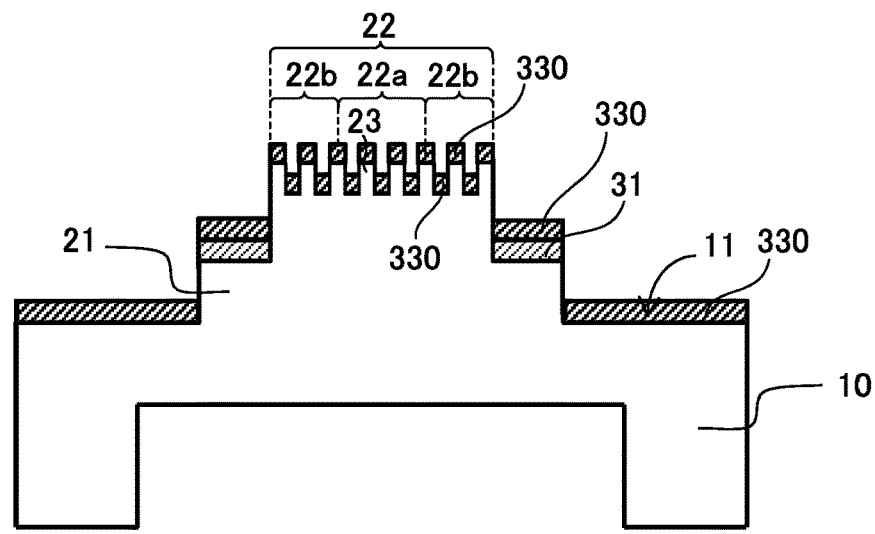
FIGS. 37G to 37I are schematic process diagrams illustrating another example of the production method of the template according to the second embodiment, following FIG. 36F.

Next, in the template 1 having the light shielding film 31 on the upper surface of the first step structure 21, the high contrast layer 330 is formed on the main surface 11 of the base 10, on the light shielding film 31, on the upper surface of the convex part and the bottom surface of the concave part of the first concave and convex structure body 22a, and on the upper surface of the convex part and the bottom surface of the concave part of the second concave and convex structure body 22b (S500 in FIG. 34, FIG. 37G).

Since the material constituting the high contrast layer 330 is similar to the material constituting the high contrast film 32 in the template 1 illustrated in FIG. 5, the description thereof will be omitted herein. Since the thickness of the high contrast layer 330 is similar to the thickness constituting the high contrast film 32 in the template 1 illustrated in FIG. 5, the description thereof will be omitted herein.

(Formation of Third to Fifth Resin Layers)

Figure 37H:
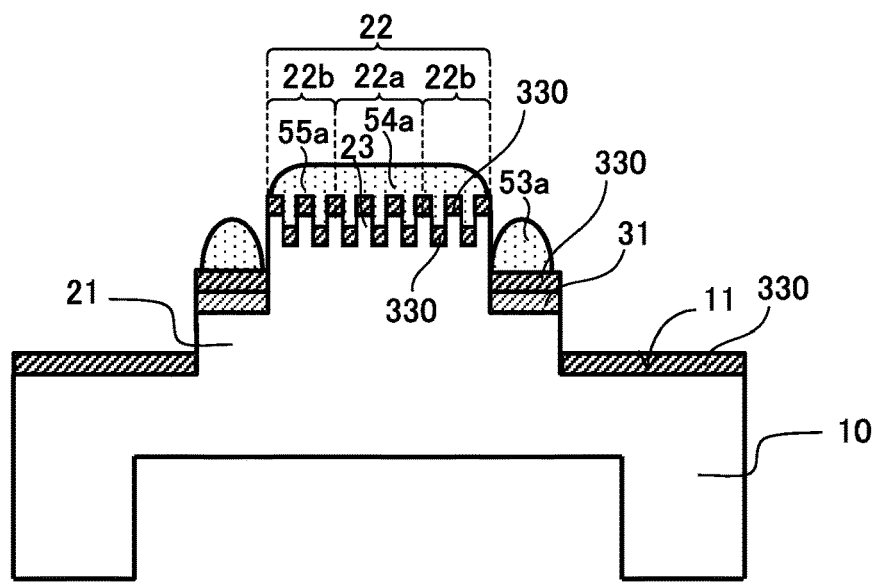

Next, a third resin 53a is dropped onto the high contrast layer 330 formed on the light shielding film 31, a fourth resin 54a is dropped onto a high contrast layer 330 formed on the upper surface of the convex part and the bottom surface of the concave part of the first concave and convex structure body 22a, and a fifth resin 55a is dropped onto the high contrast layer 330 formed on the upper surface of the convex part and the bottom surface of the concave part of the second concave and convex structure body 22b (FIG. 37H).

Figure 37I:
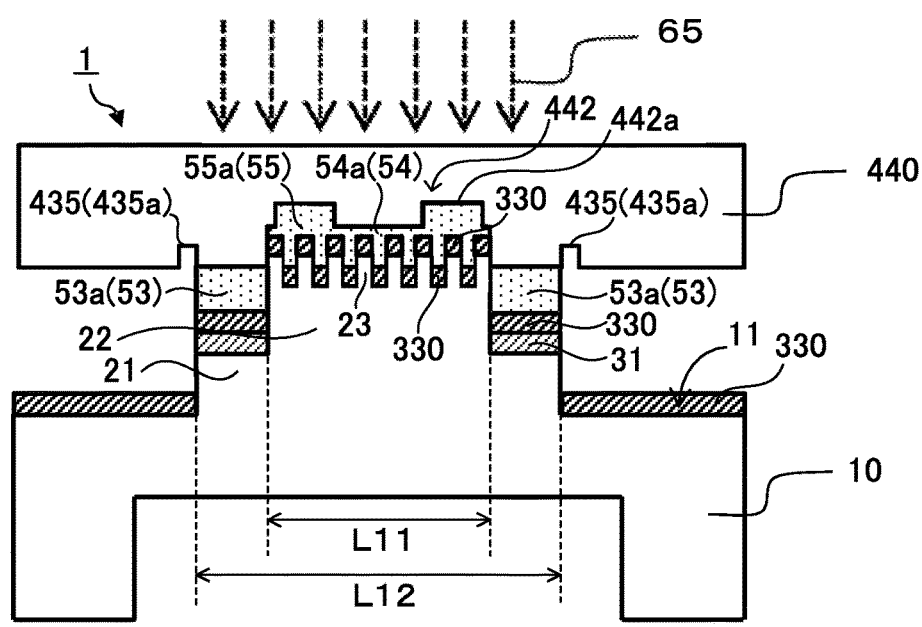

Next, the template 440 for thickness regulation of the third to fifth resins are pressed, and in this state, the third resin 53a, the fourth resin 54a, and the fifth resin 55a are cured (FIG. 37I). After that, the template 440 for thickness regulation of the third to fifth resins is released (FIG. 38J). Therefore, a third resin layer 53 is formed on the high contrast layer 330 formed on the light shielding film 31, a fourth resin layer 54 having a thickness smaller than that of the third resin layer 53 is formed on the high contrast layer 330 formed on the upper surface of the convex part and the bottom surface of the concave part of the first concave and convex structure body 22a, and a fifth resin layer 55 having a thickness larger than that of the fourth resin layer 54 is formed on the high contrast layer 330 formed on the upper surface of the convex part and the bottom surface of the concave part of the second concave and convex structure body 22b (S600 in FIG. 34, FIG. 38J).

Figure 40:
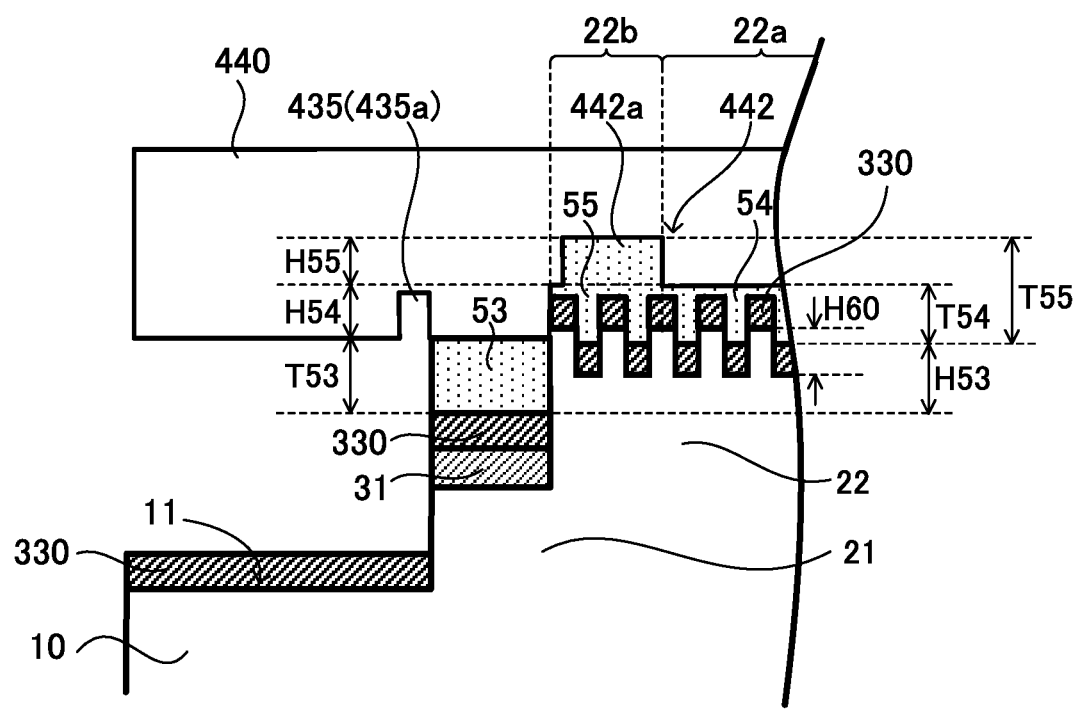
FIG. 40 is a diagram illustrating the function and effect of the template for specifying resin thickness according to the present invention.

Herein, in the present invention, as illustrated in FIG. 40 to be described later, in a case where the thickness of the third resin layer 53 is regarded as T53 and the thickness of the fourth resin layer 54 formed on the bottom surface of the concave part of the first concave and convex structure body 22a is regarded as T54, "a fourth resin layer having a thickness smaller than that of the third resin layer" denotes the fourth resin layer 54 satisfying T54<T53. In addition, as illustrated in FIG. 40 to be described later, in a case where the thickness of the fourth resin layer 54 formed on the bottom surface of the concave part of the first concave and convex structure body 22a is regarded as T54 and the thickness of the fifth resin layer 55 formed on the bottom surface of the concave part of the second concave and convex structure body 22b is regarded as T55, "a fifth resin layer having a thickness larger than that of the fourth resin layer" denotes the fifth resin layer 55 satisfying T54<T55.

When these resin layers are formed, as illustrated in FIG. 37I, by using the template 440 for thickness regulation of the third to fifth resins having a concave part 442 on the main surface side in contact with the resin and having the depression 442a formed on the bottom surface side of the concave part 442, the upper surface of the outer peripheral part of the concave part 442 of the template 440 for thickness regulation of the third to fifth resins is pressed against the third resin 53a, the bottom surface of the concave part 442 of the template 440 for thickness regulation of the third to fifth resins is pressed against the fourth resin 54a and the fifth resin 55a, and the bottom surface of the depression 442a is pressed against the fifth resin 55a. As a result, the thicknesses of the third resin layer 53, the fourth resin layer 54, and the fifth resin layer 55 can be defined as described above. In addition, the third resin layer 53, the fourth resin layer 54, and the fifth resin layer 55 can be formed as a resin layer having a uniform thickness.

The third resin 53a, the fourth resin 54a, and the fifth resin 55a are made of a material that is cured by heat or light and are preferably ultraviolet curable resins used in the field of nanoimprint lithography.

In a case where the third resin 53a, the fourth resin 54a, and the fifth resin 55a are ultraviolet curable resins, in the step of curing the third resin 53a, the fourth resin 54a, and the fifth resin 55a, as illustrated in FIG. 37I, a method of irradiating with ultraviolet light 65 can be used.

Incidentally, the third resin 53a, the fourth resin 54a, and the fifth resin 55a may be made of different materials as long as the upper sides of the third resin layer 53 and the fifth resin layer 55 and the fourth resin layer 54 can be removed by dry etching in the fourth resin layer removing step described later (S700 in FIG. 34, FIG. 38K) while allowing the lower sides of the third resin layer 53 and the fifth resin layer 55 to remain. However, from the viewpoint of ease of handling, it is preferable that these resins are made of the same material.

(Fourth Resin Layer Removal)

Figure 38K:
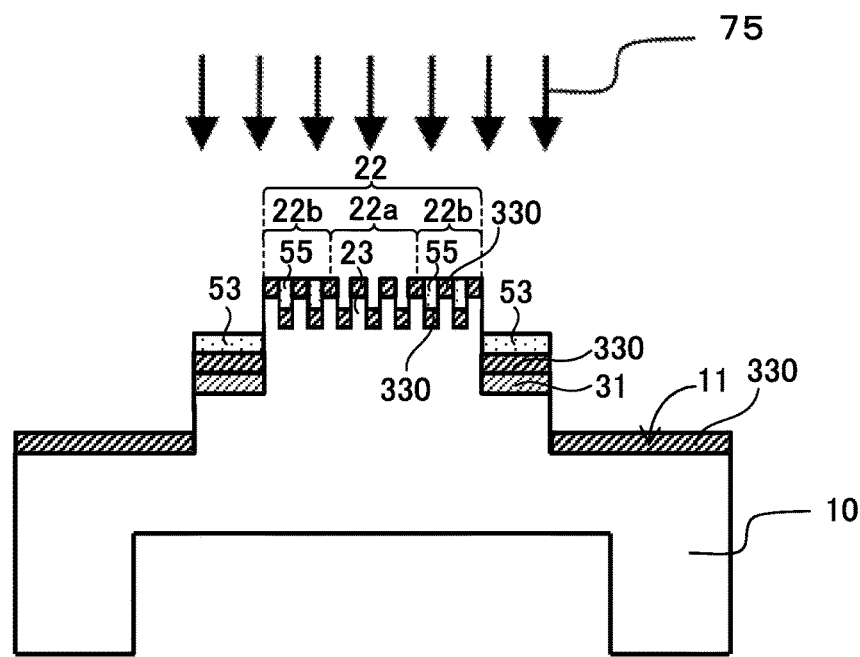

Next, by dry etching (etch-back) using the etching gas 75, the upper sides of the third resin layer 53 and the fifth resin layer 55 and the fourth resin layer 54 are removed while allowing the lower sides of the third resin layer 53 and the fifth resin layer 55 to remain (S700 in FIG. 34, FIG. 38K).

As described above, since the thickness T54 of the fourth resin layer 54 is smaller than the thickness T53 of the third resin layer 53 and the thickness T55 of the fifth resin layer 55, by the etch-back method, the fourth resin layer 54 can be removed while allowing the lower sides of the third resin layer 53 and the fifth resin layer 55 to remain.

As the etching gas 75, for example, oxygen gas can be used.

(High Contrast Film Formation)

Figure 38L:
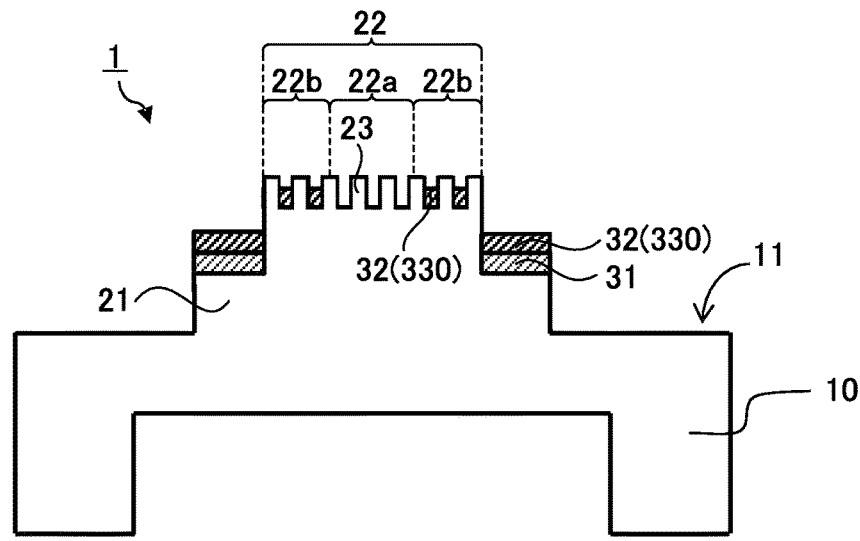

By using the lower sides of the remaining third resin layer 53 and the remaining fifth resin layer 55 as masks, the high contrast layer 330 is etched, so that while allowing the high contrast layer 330 formed on the light shielding film 31 and the bottom surface of the concave part of the second concave and convex structure body 22b to remain, the high contrast layer 330 formed on the main surface 11 of the base 10, the upper surface of the convex part and the bottom surface of the concave part of the first concave and convex structure body 22a and the upper surface of the convex part of the second concave and convex structure body 22b is removed, and the remaining third resin layer 53 and the remaining fifth resin layer 55 are removed (S800 in FIG. 34, FIG. 38L).

Therefore, it is possible to obtain the template 1 which has the first concave and convex structure body 22a constituting the transfer pattern 23 and the second concave and convex structure body 22b constituting the alignment mark on the upper surface of the second step structure 22 and in which the high contrast film 32 is formed on the light shielding film 31 and on the bottom surface of the concave part of the second concave and convex structure body 22b (FIG. 38L). Incidentally, the template 1 for imprinting having the high contrast film 32 illustrated in FIG. 38L is the same as the template 1 illustrated in FIG. 5.

(Template for Thickness Regulation of Resin)

FIGS. 39A and 39B are diagrams illustrating another example of the template for specifying resin thickness according to the present invention. Herein, FIG. 39A illustrates a schematic bottom diagram of the template 440 for thickness regulation of the third to fifth resins, and FIG. 39B illustrates a cross cross-sectional diagram taken along line A-A in FIG. 39A. Incidentally, the template 440 for thickness regulation of the third to fifth resins illustrated in FIGS. 39A and 39B is the same as the template 440 for thickness regulation of the third to fifth resins illustrated in FIG. 37I.

For example, the template 440 for thickness regulation of the third to fifth resins illustrated in FIGS. 39A and 39B has the concave parts 442 on the main surface side (the lower side in FIG. 39B) in contact with the resin and has the depression 442a formed on the bottom surface side of the concave part 442. The form of the template 440 for thickness regulation of the third to fifth resins is the form where the outer edge of the upper surface of the outer peripheral part of the concave part 442 reaches the outer edge of the template 440 for thickness regulation of the third to fifth resins.

More specifically, as illustrated in FIG. 37I, in a planar view, the concave part 442 of the template 440 for thickness regulation of the third to fifth resins has a size of enclosing the upper surface of the second step structure 22 of the template 1 in which the high contrast layer 330 is formed and being enclosed in a region surrounded by the outer edge of the upper surface of the first step structure 21 of the template 1 in which the high contrast layer 330 is formed.

FIG. 40 is a diagram illustrating the function and effect of the template for specifying resin thickness according to the present invention. FIG. 40 corresponds to an enlarged diagram of the main parts in FIG. 37I.

For example, as illustrated in FIG. 40, when defining the thicknesses of the third resin layer 53, the fourth resin layer 54, and the fifth resin layer 55 by pressing the template 440 for thickness regulation of the third to fifth resins, in a case where, the height from the upper surface of the high contrast layer 330 formed on the light shielding film 31 to the upper surface of the high contrast layer 330 formed on the bottom surface of the concave part of the first concave and convex structure body 22a is regarded as H53, the depth of a part other than the depression 442a in the concave part 442 is regarded as H54, the thickness of the third resin layer 53 to be formed is regarded as T53, and the thickness (the same as the thickness of the fourth resin layer 54 formed on the bottom surface of the concave part of the first concave and convex structure body 22a) of the fourth resin layer 54 to be formed is regarded as T54, by designing so that H54<H53, a relationship of T54<T53 is obtained. In addition, as illustrated in FIG. 40, in a case where the depth of the depression 442a formed on the bottom surface side of the concave part 442 is regarded as H55, design is made such that H55<H54, and the thickness of the fifth resin layer 55 to be formed (the thickness of the fourth resin layer 54 formed on the bottom surface of the concave part of the second concave and convex structure body 22b) is T55, T54<T55 is obtained.

Therefore, by using the template 440 for thickness regulation of the third to fifth resins in the step illustrated in FIG. 37I, the thickness T54 of the fourth resin layer 54 can be formed so as to be smaller than the thickness T53 of the third resin layer 53, and the thickness T55 of the fifth resin layer 55 can be formed so as to be larger than the thickness T54 of the fourth resin layer 54. In addition, by using the template 440 for thickness regulation of the third to fifth resins, the third resin layer 53, the fourth resin layer 54, and the fifth resin layer 55 can be formed as resin layers having a uniform thickness.

As a result, as illustrated in FIG. 38K, after the upper sides of the third resin layer 53 and the fifth resin layer 55 the fourth resin layer 54 are removed by dry etching while allowing the lower side of the third resin layer 53 and the fifth resin layer 55 to remain, as illustrated in FIG. 38L, by using the lower sides of the remaining third resin layer 53 and the remaining fifth resin layer 55 as masks, the high contrast layer 330 is etched, so that the lower side of the high contrast layer 330 formed on the light shielding film 31 and on the bottom surface of the concave part of the second concave and convex structure body 22b can be allowed to remain. In addition, the high contrast film 32 which is the high contrast layer 330 remaining on the light shielding film 31 and the high contrast film 32 which is the high contrast layer 330 remaining on the bottom surface of the concave part of the second concave and convex structure body 22b can be formed as a film without a defective part or a thin film part.

For example, the depth H54 of the part other than the depression 442a in the concave part 442 can be set to be in a range of 0.3 μm or more and 10 μm or less. In addition, as illustrated in FIG. 40, in a case where the depth of the depression 442a formed on the bottom surface side of the concave part 442 is regarded as H55 and the depth of the concave part of the first concave and convex structure body 22a and the second concave and convex structure body 22b is regarded as H60, a relationship of H55≥H60 is satisfied. Therefore, the high contrast film 32 (the high contrast layer 330) can be removed from the top of the first concave and convex structure body 22a without any residue. More specifically, for example, H55 is set to be within a range of H60×1.0 to H60×2.0.

Herein, it is preferable that the bottom surface of the concave part 442 of the template 440 for thickness regulation of the third to fifth resins has a size of enclosing the upper surface of the second step structure 22 of the template 1 in which the high contrast layer 330 illustrated in FIG. 37I is formed.

More specifically, in a case where the width of the bottom surface of the concave part 442 of the template 440 for thickness regulation of the third to fifth resins illustrated in FIG. 39B is regarded as L21 and the width of the upper surface of the second step structure 22 of the template 1 in which the high contrast layer 330 illustrated in FIG. 37I is formed is regarded as L11, it is preferable that a relationship of L21>L11 is satisfied.

This is because the step of pressing the template 440 for thickness regulation of the third to fifth resins and the step of releasing the template 440 for thickness regulation of the third to fifth resins from the template 1 in which the high contrast layer 330 is formed become easier.

For example, a bottom surface size of the concave part 442 can be set to be in a range of 10 mm×10 mm or more and 70 mm×70 mm or less.

In addition, it is preferable that the region surrounded by the outer edge of the upper surface of the outer peripheral part of the concave part 442 of the template 440 for thickness regulation of the third to fifth resins has the same shape and the same area as the region surrounded by the outer edge of the upper surface of the first step structure 21 of the template 1 in which the high contrast layer 330 illustrated in FIG. 37I is formed or has a size of enclosing the region surrounded by the outer edge of the upper surface of the first step structure 21 of the template 1 in which the high contrast layer 330 is formed.

More specifically, in a case where the width of the region surrounded by the outer edge of the upper surface of the outer peripheral part of the concave part 442 of the template 440 for thickness regulation of the third to fifth resins illustrated in FIG. 39B is regarded as L22 and the width of the region surrounded by the outer edge of the upper surface of the first step structure 21 of the template 1 in which the high contrast layer 330 illustrated in FIG. 37I is formed is regarded as L12, it is preferable that a relationship of L22≥L12 is satisfied.

This is because the third resin layer 53 can be formed as a resin layer having a uniform thickness without a defective part to the extent of reaching the outer edge of the upper surface of the first step structure 21 of the template 1 in which the high contrast layer 330 is formed.

In addition, the template 430 for thickness regulation of the first and second resins illustrated in FIG. 35C has marks for position matching 435 on the main surface side. For this reason, as illustrated in FIG. 35C, when pressing the template 430 for thickness regulation of the first and second resins, the relative positions with respect to the multistep template 700 with the light shielding material layer where the corresponding alignment marks (not illustrated) are formed can be aligned, and thus, the pressing can be performed with good positional accuracy.

Incidentally, the marks for position matching 435 illustrated in FIG. 35C are depressions 435*a* formed outside the concave part 432 on the main surface side of the template 430 for thickness regulation of the first and second resins. In the template 430 for thickness regulation of the first and second resins, the concave part 432 and the depressions 435*a* formed outside the concave part 432 are formed in separate steps. More specifically, after one of the concave part 432 and the depressions 435*a* is processed, positioning is performed by alignment drawing, and the other is processed. In addition, the depressions 435*a* formed outside the concave part 432 is depressions having a depth (for example, 20 nm to 300 nm) of a degree that the marks can be read.

Furthermore, the template 440 for thickness regulation of the third to fifth resins illustrated in FIG. 39 also has marks for position matching 435 on the main surface side. For this reason, as illustrated in FIG. 37I, when pressing the template 440 for thickness regulation of the third to fifth resins, the relative positions with respect to the template 1 where the corresponding alignment marks (not illustrated) are formed can be aligned, and thus, the pressing can be performed with good positional accuracy.

The marks for position matching 435 illustrated in FIG. 39 are depressions 435*a* formed outside the concave part 442 on the main surface side of the template 440 for thickness regulation of the third to fifth resins, and the depth H55 of the depression 442*a* formed on the bottom surface side of the concave part 442 and the depth H56 of the depression 435*a* of the mark for position matching 435 are the same. For this reason, the depression 442*a* formed on the bottom surface side of the concave part 442 and the depression 435*a* of the mark for position matching 435 can be formed in the same step.

It is preferable that the template for specifying resin thickness according to the present invention has the marks for position matching on the main surface side like the template 440 for thickness regulation of the third to fifth resins illustrated in FIG. 39, the mark for position matching is the depression formed outside the concave part on the main surface side, and the depth of the depression formed on the bottom surface side of the concave part and the depth of the depression formed outside the concave part are the same. This is because it is possible to form the depressions formed on the bottom surface side of the concave part and the depressions of the marks for position matching in the same step.

Although the production method of a template substrate, the production method of a template, and the template according to the present invention have been described above, the present invention is not limited to the above embodiments. The above-described embodiments are examples, and those having substantially the same configuration and exhibiting the same functions and effects as the technical idea disclosed in the claims of the invention can are included in the technical scope of the invention.

Incidentally, the present invention is not limited to the above-described embodiments. The above-described embodiments are merely examples, and those having substantially the same configuration and exhibiting the same functions and effects as the technical idea disclosed in the claims of the invention are included in the technical scope of the invention.

REFERENCE SIGNS LIST

1 TEMPLATE
2 TEMPLATE BLANK
10 BASE
11 MAIN SURFACE
12 BACK SURFACE
21 FIRST STEP STRUCTURE
22 SECOND STEP STRUCTURE
22*a* FIRST CONCAVE AND CONVEX STRUCTURE BODY
22*b* SECOND CONCAVE AND CONVEX STRUCTURE BODY
23 TRANSFER PATTERN
31 LIGHT SHIELDING FILM
32 HIGH CONTRAST FILM 32
40 DEPRESSION PART
50 TRANSFER SUBSTRATE
60 PHOTOCURABLE RESIN
61 TRANSFER REGION
62 NON-TRANSFER REGION
70 LIGHT SHIELDING PLATE
81, 82, 83 EXPOSURE LIGHT
90, 91, 92 IRRADIATION REGION
101 TEMPLATE
110 BASE
111 MAIN SURFACE
121 STEP STRUCTURE
122 TRANSFER PATTERN
131 LIGHT SHIELDING FILM
200 FIRST TEMPLATE BLANK
201 STEP STRUCTURE
210 FIRST ETCHING MASK
220 LIGHT SHIELDING MATERIAL LAYER
230 SECOND ETCHING MASK
4 TEMPLATE SUBSTRATE
51*a* FIRST RESIN
52*a* SECOND RESIN
53*a* THIRD RESIN
54*a* FOURTH RESIN
55*a* FIFTH RESIN
51 FIRST RESIN LAYER
52 SECOND RESIN LAYER
53 THIRD RESIN LAYER
54 FOURTH RESIN LAYER
55 FIFTH RESIN LAYER
65 ULTRAVIOLET LIGHT
75 ETCHING GAS
150 ONE STEP TEMPLATE SUBSTRATE
151 STEP STRUCTURE
160 ETCHING MASK
170 LIGHT SHIELDING MATERIAL LAYER
250 MULTISTEP TEMPLATE SUBSTRATE
300 MULTISTEP TEMPLATE SUBSTRATE WITH LIGHT SHIELDING MATERIAL LAYER
330 HIGH CONTRAST LAYER
400, 410, 420 TEMPLATE FOR THICKNESS REGULATION OF RESIN
401, 411, 421 BASE
402, 412, 422 CONCAVE PART
403, 413 CONVEX PART
404, 414 REGION
415 DEPRESSION PART
423 OUTER PERIPHERAL PART OF CONCAVE PART
430 TEMPLATE FOR THICKNESS REGULATION OF FIRST AND SECOND RESINS
432 CONCAVE PART OF TEMPLATE FOR THICKNESS REGULATION OF FIRST AND SECOND RESINS
440 TEMPLATE FOR THICKNESS REGULATION OF THIRD TO FIFTH RESINS

442 CONCAVE PART OF TEMPLATE FOR THICKNESS REGULATION OF THIRD TO FIFTH RESINS
442a DEPRESSION IN CONCAVE PART OF TEMPLATE FOR THICKNESS REGULATION OF THIRD TO FIFTH RESINS
435 MARK FOR POSITION MATCHING
500 ONE STEP TEMPLATE
501 STEP STRUCTURE
600 MULTISTEP TEMPLATE
700 MULTISTEP TEMPLATE WITH LIGHT SHIELDING MATERIAL LAYER

The invention claimed is:

1. A production method of a template substrate for imprinting, the template substrate including a first step structure on a main surface of a base, a second step structure on the first step structure, and a light shielding film on an upper surface of the first step structure, the production method comprising steps of:
a multistep template substrate with a light shielding material layer preparing step of preparing a multistep template substrate with a light shielding material layer including the first step structure, the second step structure, and a light shielding material layer on an upper surface of the first step structure and on an upper surface of the second step structure;
a resin layer forming step of forming a first resin layer on the light shielding material layer formed on the upper surface of the first step structure, and forming a second resin layer thinner than a thickness of the first resin layer, on the light shielding material layer formed on the upper surface of the second step structure;
a second resin layer removing step of removing the second resin layer while leaving the first resin layer by dry etching; and
a light shielding film forming step of etching the light shielding material layer using the first resin layer left as a mask to remove the light shielding material layer formed on the upper surface of the second step structure while leaving the light shielding material layer formed on the upper surface of the first step structure; in this order, wherein
the resin layer forming step includes:
a resin thickness specifying step of, using a template for specifying resin thickness including a concave part in a main surface side contacting a resin, pushing an upper surface of an outer peripheral part of the concave part in the template for specifying resin thickness against a first resin dropped onto the light shielding material layer formed on the upper surface of the first step structure, and pushing a bottom surface of the concave part in the template for specifying resin thickness against a second resin dropped onto the light shielding material layer formed on the upper surface of the second step structure; and
a depth of the concave part in the template for specifying resin thickness is smaller than a height from the upper surface of the first step structure to the upper surface of the second step structure.

2. The production method of a template substrate for imprinting according to claim 1, wherein
the resin layer forming step includes:
the resin thickness specifying step, and
a resin curing step of irradiating an ultraviolet ray for curing the first resin and the second resin in a state the template for specifying resin thickness is pushed against, to form the first resin layer and the second resin layer.

3. The production method of a template substrate for imprinting according to claim 1, wherein
the multistep template substrate with a light shielding material layer preparing step is provided with:
a multistep template substrate preparing step of preparing a multistep template substrate including the first step structure and the second step structure; and
a light shielding material layer forming step of forming a light shielding material layer on the upper surface of the first step structure and on the upper surface of the second step structure; in this order.

4. The production method of a template substrate for imprinting according to claim 3, wherein
the multistep template substrate preparing step is provided with:
a one step template substrate preparing step of preparing a one step template substrate including a one step structure on the main surface of the base;
an etching mask forming step of forming an etching mask in a region becoming a transfer pattern region at an upper surface of the step structure in the one step template substrate; and
a multistep forming step of forming a first step structure as a bottom step and a second step structure as an upper step by etching the step structure using the etching mask.

5. A production method of a template for imprinting, the template including a first step structure on a main surface of a base, a second step structure on the first step structure, a light shielding film on an upper surface of the first step structure, and a transfer pattern in a concave and convex structure at an upper surface of the second step structure, the production method comprising steps of:
a multistep template with a light shielding material layer preparing step of preparing a multistep template with a light shielding material layer including the first step structure, the second step structure, a transfer pattern in a concave and convex structure at the upper surface of the second step structure and a light shielding material layer on an upper surface of the first step structure and on an upper surface of the second step structure;
a first and second resin layer forming step of forming a first resin layer on the light shielding material layer formed on the upper surface of the first step structure, and forming a second resin layer thinner than a thickness of the first resin layer, on the light shielding material layer formed on the upper surface of the second step structure;
a second resin layer removing step of removing the second resin layer while leaving the first resin layer by dry etching; and
a light shielding film forming step of etching the light shielding material layer using the first resin layer left as a mask to remove the light shielding material layer formed on the upper surface of the second step structure while leaving the light shielding material layer formed on the upper surface of the first step structure; in this order, wherein
the first and second resin layer forming step includes:
a first and second resin thickness specifying step of, using a template for specifying first and second resin thickness including a concave part in a main surface side contacting a resin, pushing an upper surface of an outer peripheral part of the concave part in the template for specifying first and second resin thickness against a first resin dropped onto the light shielding material layer formed on the upper surface of the first step structure, and pushing a bottom surface of the concave part in the template for specifying first and second resin thickness against a second resin dropped onto the light shielding material layer formed on the upper surface of the second step structure; and a depth of the concave part in the template for specifying first and second resin thickness is smaller than a height from the upper surface of the first step structure to the upper surface of the second step structure.

6. The production method of a template for imprinting according to claim 5, wherein
the first and second resin layer forming step includes:
the first and second resin thickness specifying step; and
a first and second resin curing step of irradiating an ultraviolet ray for curing the first resin and the second resin in a state the template for specifying first and second resin thickness is pushed against, to form the first resin layer and the second resin layer.

7. The production method of a template for imprinting according to claim 5, wherein
the multistep template with a light shielding material layer preparing step is provided with:
a multistep template preparing step of preparing a multistep template including the first step structure, the second step structure, and the transfer pattern at an upper surface of the second step structure; and
a light shielding material layer forming step of forming a light shielding material layer on the upper surface of the first step structure and on the upper surface of the second step structure; in this order.

8. The production method of a template for imprinting according to claim 7, wherein
the multistep template preparing step is provided with:
a one step template preparing step of preparing a one step template including a one step structure on the main surface of the base and the transfer pattern at the upper surface of the step structure;
an etching mask forming step of forming an etching mask in a region at the upper surface of the step structure in the one step template where the transfer pattern is formed; and
a multistep forming step of forming a first step structure as a bottom step and a second step structure as an upper step by etching the step structure using the etching mask; in this order.

9. A production method of a template for imprinting, the template including a first step structure on a main surface of a base, a second step structure on the first step structure, a light shielding film on an upper surface of the first step structure, and a transfer pattern in a concave and convex structure on an upper surface of the second step structure, the production method comprising steps of:
a multistep template with a light shielding material layer preparing step of preparing a multistep template with a light shielding material layer including: the first step structure, the second step structure; a first concave and convex structure body configuring the transfer pattern and a second concave and convex structure body configuring an alignment mark, at an upper surface of the second step structure; and a light shielding material layer on the upper surface of the first step structure and on the upper surface of the second step structure;
a first and second resin layer forming step of forming a first resin layer on the light shielding material layer formed on the upper surface of the first step structure, and forming a second resin layer thinner than a thickness of the first resin layer, on the light shielding material layer formed on the upper surface of the second step structure;
a second resin layer removing step of removing the second resin layer while leaving the first resin layer by dry etching;
a light shielding film forming step of forming a light shielding layer on the upper surface of the first step structure by etching the light shielding material layer using the first resin layer left as a mask to remove the light shielding material layer formed on the upper surface of the second step structure while leaving the light shielding material layer formed on the upper surface of the first step structure;
a high contrast layer forming step of forming a high contrast layer on the light shielding material layer, on an upper surface of a convex part and on a bottom surface of a concave part in the first concave and convex structure body, as well as on an upper surface of a convex part and on a bottom surface of a concave part in the second concave and convex structure body;
a third to fifth resin layer forming step of forming a third resin layer on the high contrast layer formed on the light shielding film, forming a forth resin layer thinner than a thickness of the third resin layer on the high contrast layer formed on the upper surface of the convex part and the bottom surface of the concave part in the first concave and convex structure body, and forming a fifth resin layer thicker than a thickness of the forth resin layer on the high contrast layer formed on the upper surface of the convex part and on the bottom surface of the concave part in the second concave and convex structure;
a fourth resin layer removing step of removing the forth resin layer while leaving the third resin layer and the fifth resin layer by dry etching; and
a high contrast film forming step of etching the high contrast layer using the third resin layer and the fifth resin layer left as a mask to remove the high contrast layer formed on the upper surface of the convex part and the bottom surface of the concave part in the first concave and convex structure body as well as on the upper surface of the convex part in the second concave and convex structure body while leaving the high contrast layer formed on the light shielding film, and on the bottom surface of the concave part in the second concave and convex structure body;
in this order, wherein
the first and second resin layer forming step includes:
a first and second resin thickness specifying step of, using a template for specifying first and second resin thickness including a concave part in a main surface side contacting a resin, pushing an upper surface of an outer peripheral part of the concave part in the template for specifying first and second resin thickness against a first resin dropped onto the light shielding material layer formed on the upper surface of the first step structure, and pushing a bottom surface of the concave part in the template for specifying first and second resin thickness against a second resin dropped onto the light shielding material layer formed on the upper surface of the second step structure;
a depth of the concave part in the template for specifying first and second resin thickness is smaller than a height from the upper surface of the first step structure to the upper surface of the second step structure;

the third to fifth resin layer forming step includes:
a third to fifth resin thickness specifying step of, using a template for specifying third to fifth resin thickness including a concave part in a main surface side contacting a resin, and a depression formed at a bottom surface side of the concave part, pushing an upper surface of an outer peripheral part of the concave part in the template for specifying third to fifth resin thickness against a third resin dropped onto the high contrast layer formed on the light shielding film, pushing a bottom surface of the concave part in the template for specifying third to fifth resin thickness against a forth resin dropped onto the high contrast layer formed on the upper surface of the convex part and on the bottom surface of the concave part in the first concave and convex structure body as well as against a fifth resin dropped onto the high contrast layer formed on the upper surface of the convex part and the bottom surface of the concave part in the second concave and convex structure body, and pushing a bottom surface of the depression against the fifth resin; and
a depth of the concave part in the template for specifying third to fifth resin thickness excluding the depression part is smaller than a height from the upper surface of the high contrast layer formed on the light shielding film to the upper surface of the high contrast layer formed on the bottom surface of the concave part in the first concave and convex structure body.

10. The production method of a template for imprinting according to claim 9, wherein
the multistep template with light shielding material layer preparing step is provided with:
a multistep template preparing step of preparing a multistep template including the first step structure, the second step structure, and the transfer pattern at an upper surface of the second step structure; and
a light shielding material layer forming step of forming a light shielding material layer on the upper surface of the first step structure and on the upper surface of the second step structure; in this order; and
the multistep template preparing step is provided with:
a one step template substrate preparing step of preparing a one step template substrate including a one step structure on the main surface of the base;
an etching mask forming step of forming an etching mask in a region becoming the transfer pattern at an upper surface of the step structure in the one step template substrate;
a multistep forming step of forming a first step structure as a bottom step and a second step structure as an upper step by etching the step structure using the etching mask; and
a transfer pattern forming step of forming the transfer pattern at the upper surface of the second step structure; in this order.

* * * * *